US012760145B2

(12) United States Patent
Kato et al.

(10) Patent No.: US 12,760,145 B2
(45) Date of Patent: Oct. 13, 2026

(54) POLYMER COMPOUND, AND ELECTROLUMINESCENT DEVICE MATERIAL AND ELECTROLUMINESCENT DEVICE INCLUDING POLYMER COMPOUND

(71) Applicant: SAMSUNG ELECTRONICS CO., LTD., Suwon-si (KR)

(72) Inventors: Fumiaki Kato, Yokohama (JP); Ha Il Kwon, Suwon-si (KR); Soonmin Cha, Suwon-si (KR); Naotoshi Suganuma, Yokohama (JP); Yusaku Konishi, Yokohama (JP); Norihito Ishii, Yokohama (JP); Takahiro Fujiyama, Yokohama (JP); Masashi Tsuji, Yokohama (JP)

(73) Assignees: SAMSUNG ELECTRONIC CO., LTD., Gyeonggi-Do (KR); SAMSUNG DISPLAY CO., LTD., Gyeonggi-Do (KR)

( * ) Notice: Subject to any disclaimer, the term of this patent is extended or adjusted under 35 U.S.C. 154(b) by 326 days.

(21) Appl. No.: 18/486,624

(22) Filed: Oct. 13, 2023

(65) Prior Publication Data

US 2024/0158566 A1 May 16, 2024

(30) Foreign Application Priority Data

Oct. 14, 2022 (JP) ................................ 2022-165440
Oct. 12, 2023 (KR) ........................ 10-2023-0136211

(51) Int. Cl.
*H10K 85/10* (2023.01)
*C08G 61/12* (2006.01)
(Continued)

(52) U.S. Cl.
CPC ........... *C08G 61/12* (2013.01); *H10K 85/115* (2023.02); *H10K 85/151* (2023.02);
(Continued)

(58) Field of Classification Search
None
See application file for complete search history.

(56) References Cited

U.S. PATENT DOCUMENTS 5,728,801 A 3/1998 Wu et al.
8,330,142 B2 12/2012 Cho et al.
(Continued)

FOREIGN PATENT DOCUMENTS

JP 4439554 B2 1/2010
JP 2010199067 A 9/2010
(Continued)

OTHER PUBLICATIONS

European Search Report for European Patent Application No. 23203558.4 dated Mar. 18, 2024.

*Primary Examiner* — Long Pham
(74) *Attorney, Agent, or Firm* — CANTOR COLBURN LLP

(57) ABSTRACT

A polymer compound for use in an electroluminescent device may improve the durability (particularly the lumi-
(Continued)

100 nescence lifespan). The polymer compound includes Structural Unit (A) represented by Chemical Formula (1).

(1)

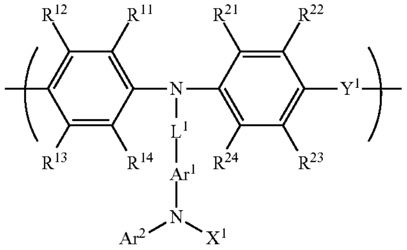

In Chemical Formula (1), the definition of each substituent is as described in the detailed description.

15 Claims, 2 Drawing Sheets

(51) Int. Cl.
*H10K 50/115* (2023.01)
*H10K 50/15* (2023.01)

(52) U.S. Cl.
CPC .................. *C08G 2261/124* (2013.01); *C08G 2261/1412* (2013.01); *C08G 2261/1414* (2013.01); *C08G 2261/1426* (2013.01); *C08G 2261/148* (2013.01); *C08G 2261/149* (2013.01); *C08G 2261/18* (2013.01); *C08G 2261/228* (2013.01); *C08G 2261/312* (2013.01); *C08G 2261/3142* (2013.01); *C08G 2261/3162* (2013.01); *C08G 2261/95* (2013.01); *H10K 50/115* (2023.02); *H10K 50/15* (2023.02)

(56) References Cited

U.S. PATENT DOCUMENTS

| | | | | |
|---|---|---|---|---|
| 8,580,393 | B2 | 11/2013 | Mizuki et al. | |
| 8,745,831 | B2 | 6/2014 | Watanabe et al. | |
| 8,951,646 | B2 | 2/2015 | Tanaka et al. | |
| 9,929,347 | B2 | 3/2018 | Sekine et al. | |
| 11,702,593 | B2 | 7/2023 | Min et al. | |
| 11,917,899 | B2 * | 2/2024 | Tsuji | C08G 61/12 |
| 12,133,453 | B2 * | 10/2024 | Li | C09K 11/06 |
| 2021/0288258 | A1 * | 9/2021 | Tsuji | C09K 11/06 |
| 2022/0123220 | A1 | 4/2022 | Kobayashi et al. | |
| 2024/0107870 | A1 * | 3/2024 | Li | C09D 165/00 |
| 2024/0247098 | A1 * | 7/2024 | Tsuji | C09D 165/00 |
| 2025/0311608 | A1 * | 10/2025 | Tsuji | C08G 61/12 |

FOREIGN PATENT DOCUMENTS

| | | | |
|---|---|---|---|
| JP | 2012055978 | A | 3/2012 |
| JP | 2013155294 | A | 8/2013 |
| JP | 5587172 | B2 | 8/2014 |
| JP | 5790819 | B2 | 8/2015 |
| JP | 5955660 | B2 | 6/2016 |
| JP | 5955946 | B2 | 6/2016 |
| JP | 2020128367 | A | 8/2020 |
| JP | 2021096947 | A | 6/2021 |
| JP | 2021138915 | A | 9/2021 |
| KR | 20210113556 | A | 9/2021 |
| WO | 2005100437 | A1 | 10/2005 |

* cited by examiner

POLYMER COMPOUND, AND ELECTROLUMINESCENT DEVICE MATERIAL AND ELECTROLUMINESCENT DEVICE INCLUDING POLYMER COMPOUND

CROSS-REFERENCE TO RELATED APPLICATION

This application claims priority under 35 U.S.C. § 119 to Japanese Patent Application No. 2022-165440 filed in the Japan Patent Office on Oct. 14, 2022, and Korean Patent Application No. 10-2023-0136211 filed in the Korean Intellectual Property Office on Oct. 12, 2023, the contents of which are herein incorporated by reference in their entirety.

BACKGROUND

1. Field

A polymer compound, and an electroluminescent device material and an electroluminescent device including the polymer compound are disclosed.

2. Description of the Related Art

Research and development for electroluminescent devices (EL devices) are actively in progress. In particular, EL devices are expected to be used in inexpensive, solid-light emitting, large area full color display devices or recording light source arrays. An EL device is a light emitting device, which includes a thin film with a thickness of several nanometers to several hundred nanometers between an anode and a cathode. In addition, the EL devices usually include a hole transport layer, a light emitting layer, an electron transport layer, or the like.

The light emitting layer of an EL device can include a fluorescent light emitting material and a phosphorescent light emitting material. The phosphorescent light emitting material is a material which is expected to have higher luminous efficiency comparable to the fluorescent light emitting material. In order to cover a wide color gamut, an RGB light source requires an emission spectrum with a narrow half value width. Although deep blue is particularly desired for a blue color, there are currently no devices with a long lifespan and satisfying color purity.

As a method of solving the problem, light emitting devices use "quantum dots" which are an inorganic light emitting material as the light emitting material (as disclosed in Patent Document 1, Japanese Patent Laid-Open Publication No. 2010-199067). Quantum dots (QD) are semiconductor materials with crystal structures of several nanometers in size and are made up of hundreds to thousands of atoms. Because quantum dots are very small in size, the surface area per unit volume is large. For this reason, most of the atoms are present on the surface of the nanocrystals, and exhibit quantum confinement effects. Due to the quantum confinement effect, adjustments to the quantum dot, such as changes to quantum dot size, can alter the emission wavelength and improve color purity and photoluminescence (PL) luminous efficiency. A basic quantum dot electroluminescent device (QD LED) is a three-layered device including a hole transport layer (HTL) and an electron transport layer (ETL) at both sides with a quantum dot light emitting layer.

In order to adjust the characteristics of such quantum dot electroluminescent devices, techniques for improving the hole transport properties and hole injection properties of hole transport materials have been proposed. For example, Japanese Patent Laid-Open Publication No. 2021-138915 (Patent Document 2) proposes arylamine-fluorene alternating copolymer (polymer compound) with a hydrocarbon group in the side chain as a hole transport material.

According to the arylamine-fluorene alternating copolymer disclosed in Patent Document 2, the hole injection property of the hole transport material is improved, durability (especially luminescence lifespan) is improved, and sufficient luminous efficiency is achieved.

However, there remains a need for technology that can further improve durability (especially luminescence lifespan) compared to electroluminescent devices (particularly quantum dot electroluminescent devices) using the hole transport material disclosed in Patent Document 2.

SUMMARY

The disclosure relates to a technology to improve the durability of an electroluminescent device with the application of a polymer compound. In an embodiment, a polymer compound includes a Structural Unit (A) represented by Chemical Formula (1):

Chemical Formula (1)

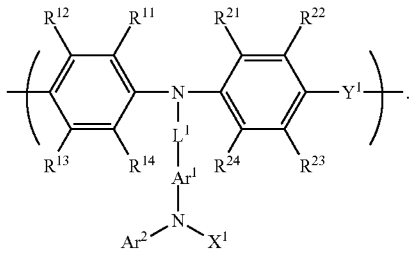

(1)

In Chemical Formula (1), $R^{11}$ to $R^{14}$ and $R^{21}$ to $R^{24}$ are each independently a hydrogen atom, a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, wherein $R^{11}$ and $R^{21}$ may be linked to each other to form a ring, $L^1$ is a substituted or unsubstituted aromatic hydrocarbon group having 6 to 25 ring-member atoms or a substituted or unsubstituted aromatic heterocyclic group having 5 to 25 ring-member atoms, $Ar^1$ is a substituted or unsubstituted aromatic hydrocarbon group having 6 to 25 ring-member atoms, $Ar^2$ is a substituted or unsubstituted aromatic hydrocarbon group having 6 to 25 ring-member atoms, or a substituted or unsubstituted aromatic heterocyclic group having 5 to 25 ring-member atoms, or may be linked to $Ar^1$ to form a ring, $X^1$ is a substituted or unsubstituted aromatic hydrocarbon group having 6 to 25 ring-member atoms, $Y^1$ is a substituted or unsubstituted aromatic hydrocarbon group having 6 to 25 ring-member atoms, and at least one of $X^1$ and $Y^1$ is an aromatic hydrocarbon group having 6 to 25 ring-member atoms substituted with an alkyl group having 1 to 14 carbon atoms substituted with a carboxyl group or an alkyl group having 1 to 14 carbon atoms substituted with a group having a carboxyl group.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
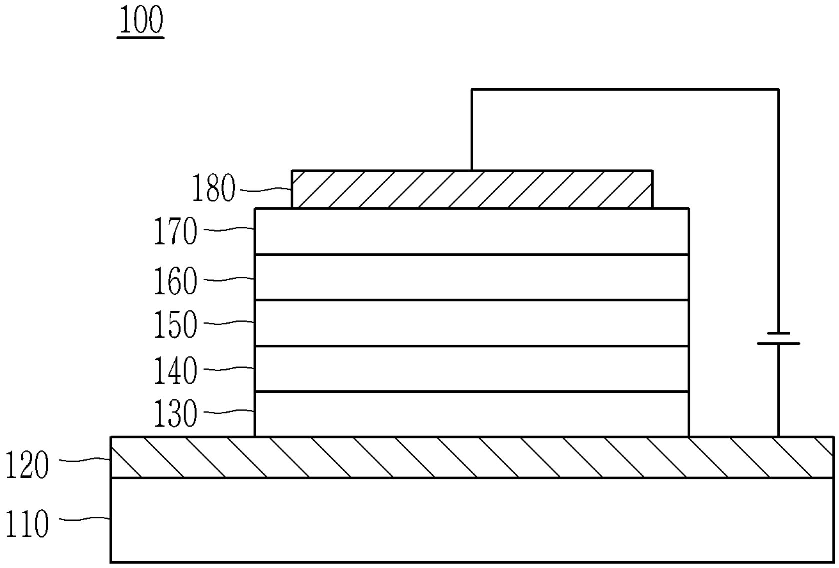
FIG. 1 is a schematic diagram illustrating an exemplary embodiment of an electroluminescent device.

The disclosure relates to a technology to improve the durability of an electroluminescent device with the application of a polymer compound.

A first embodiment provides a polymer compound including a Structural Unit (A) represented by Chemical Formula (1):

Chemical Formula (1)

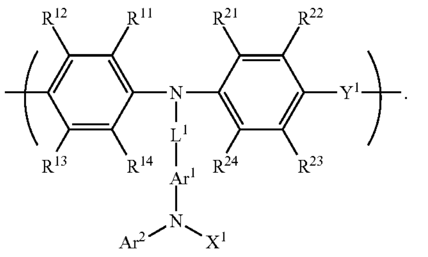

(1)

In Chemical Formula (1), $R^{11}$ to $R^{14}$ and $R^{21}$ to $R^{24}$ are each independently a hydrogen atom, a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, wherein $R^{11}$ and $R^{21}$ may be linked to each other to form a ring, $L^1$ is a substituted or unsubstituted aromatic hydrocarbon group having 6 to 25 ring-member atoms, or a substituted or unsubstituted aromatic heterocyclic group having 5 to 25 ring-member atoms, $Ar^1$ is a substituted or unsubstituted aromatic hydrocarbon group having 6 to 25 ring-member atoms, $Ar^2$ is a substituted or unsubstituted aromatic hydrocarbon group having 6 to 25 ring-member atoms or a substituted or unsubstituted aromatic heterocyclic group having 5 to 25 ring-member atoms or may be linked to $Ar^1$ to form a ring, $X^1$ is a substituted or unsubstituted aromatic hydrocarbon group having 6 to 25 ring-member atoms, $Y^1$ is a substituted or unsubstituted aromatic hydrocarbon group having 6 to 25 ring-member atoms, and at least one of $X^1$ and $Y^1$ is an aromatic hydrocarbon group having 6 to 25 ring-member atoms substituted with an alkyl group having 1 to 14 carbon atoms substituted with a carboxyl group or an alkyl group having 1 to 14 carbon atoms substituted with a group having a carboxyl group.

In this specification, Structural Unit (A) represented by Chemical Formula (1) is also referred to as "Structural Unit (A)" or "Structural Unit (A) according to an embodiment."

In addition, the structural unit having the following structure among the "Structural Units (A) represented by Chemical Formula (1)" is also referred to as "Structural Unit X" or "Structural Unit X according to an embodiment."

Structural Unit X

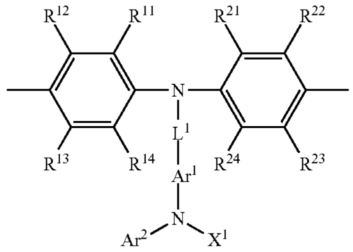

Likewise, the structural unit "—$Y^1$—" in "Structural Unit (A) represented by Chemical Formula (1)" is also referred to as "structural unit Y" or "structural unit Y according to an embodiment."

In addition, the polymer compound having Structural Unit (A) represented by Chemical Formula (1) is also referred to as "polymer compound" or "polymer compound according to an embodiment."

A second embodiment provides an electroluminescent device material including the polymer compound according to an embodiment.

A third embodiment provides an electroluminescent device including a first electrode, a second electrode, and one or more layers of organic film disposed between the first electrode and the second electrode, wherein at least one layer of the organic film includes the polymer compound according to an embodiment. As used herein, the electroluminescent device is referred to as "LED."

The quantum dot electroluminescent device is also referred to as "QLEDs."

An organic electroluminescent device is also referred to as "OLED."

As materials constituting the light emitting layer or carrier transport layer of an electroluminescent device, various low-molecular materials and polymer materials are used. Among these, polymer materials have the advantage of decreasing manufacturing costs because there is no need to fabricate devices through a vacuum process like low molecular weight materials, but it is difficult to obtain sufficient durability (luminescence lifespan). Accordingly, the development of polymer materials with improved durability (luminescence lifespan) has been desired.

By applying a polymer compound having Structural Unit (A) represented by Chemical Formula (1) to an electroluminescent device, luminescence lifespan can be improved in comparison to devices where a known material (for example, the polymer material disclosed in Patent Document 2) is used. In addition, by applying the polymer compound having Structural Unit (A) represented by Chemical Formula (1) to an electroluminescent device, the external quantum efficiency (EQE) may be improved and high luminous efficiency may be achieved.

Although not intended to be bound by a specific theory, a mechanism of exerting the above-mentioned effects by the configuration is assumed as follows. According to the energy diagram of a typical electroluminescent device, the energy band of the hole transport layer is shifted to match the Fermi level of the light emitting layer (in the case of QLED, the light emitting layer including quantum dots). When this happens, an energy gap is created between an energy band of a hole transport layer and a vacuum level (vacuum level at an interface between a hole transport layer and a light emitting layer), which causes holes to be trapped and generates a load on the interface between the hole transport layer and the light emitting layer. As a result, luminescence lifespan shortens. Since the polymer compound having Structural Unit (A) represented by Chemical Formula (1) includes an alkyl group with 1 to 14 carbon atoms substituted with a carboxyl group (—COOH) or an alkyl group with 1 to 14 carbon atoms substituted with a group having a carboxyl group, it has a large dipole moment. Therefore, when the polymer compound is included in the hole transport layer, polarization occurs between the hole transport layer and the light emitting layer, and the vacuum level changes (vacuum level shift). Accordingly, since the energy gap between the vacuum level and the hole transport layer becomes smaller, holes are not trapped, and as a result, holes become easier to move and are efficiently injected into quantum dots (hole injection properties increase). Therefore, durability (luminescence lifespan) can be improved.

Additionally, in Structural Unit (A) represented by Chemical Formula (1), the nitrogen atom cleaves a conjugate region of the main chain. Accordingly, the triplet energy level of the polymer compound can be increased, hole mobility (bulk mobility) along the main chain is high, and high current efficiency can be achieved. Therefore, excellent luminous efficiency can be achieved by using a polymer compound (main chain) having Structural Unit (A). In addition, since the main chain of Structural Unit (A) represented by Chemical Formula (1) is cleaved by nitrogen atoms, the polymer compound according to an embodiment exhibits properties similar to low molecular compounds with an energy level close to that of quantum dots even when polymerized. Accordingly, by using the polymer compound according to an embodiment, an increase in driving voltage is suppressed, and a low driving voltage becomes possible.

Therefore, an electroluminescent device (particularly a quantum dot electroluminescent device) using polymer compound having Structural Unit (A) represented by Chemical Formula (1) can exhibit high durability (luminescence lifespan) and sufficient luminous efficiency can be achieved under low driving voltage.

In addition, since the polymer compound according to an embodiment has excellent film forming properties and solvent solubility, it is possible to form a film using a wet (coating) method. Therefore, by using the polymer compound according to an embodiment, it becomes possible to enlarge the surface area of the electroluminescent device and achieve high productivity. The above effect may be effectively exhibited when the polymer compound is applied to an EL device, particularly a hole transport layer or a hole injection layer of a QLED.

However, the described mechanism is theoretical, and the present disclosure is not limited thereby.

Hereinafter, embodiments are described. The present disclosure may, however, be embodied in many different forms and should not be construed as limited to the embodiments set forth herein. In addition, each drawing is exaggerated for better understanding and ease of description, and the dimensional ratio of each constituent element in each drawing may differ from reality. In addition, when the embodiment of the present disclosure has been described with reference to the drawings, the same reference numerals are given to the same elements in the description of the drawings, and redundant descriptions are omitted.

It will be understood that when an element is referred to as being "on" another element, it can be directly on the other element or intervening elements may be present therebetween. In contrast, when an element is referred to as being "directly on" another element, there are no intervening elements present. The terminology used herein is for the purpose of describing particular embodiments only and is not intended to be limiting.

As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded Thus, the regions illustrated in the figures are schematic in nature and their shapes are not intended to illustrate the precise shape of a region and are not intended to limit the scope of the present claims.

In this specification, unless otherwise specified, operation and physical properties are measured under the conditions of room temperature (about 20° C. to about 25° C.)/relative humidity of about 40% to about 50% RH.

In this specification, "x and y are each independently" means that x and y may be the same or different.

In this specification, "group derived from compound z" or "compound z-derived group" refers to a group where hydrogen atom that is directly bonded to the ring-member atom from the cyclic structure, when "compound z" is a cyclic compound, is removed as much as the valence to represent free valence.

In this specification, the number of ring-member atoms refers to the number of atoms constituting the corresponding ring itself of the compound (e.g., monocyclic compound, condensed ring compound, cross-linked compound, carbocyclic compound, and heterocyclic compound) having a structure in which atoms are bonded in a ring (e.g., monocycle, condensed ring, and ring group). Atoms that do not form a ring (e.g., a hydrogen atom that terminates the bond of the atoms forming a ring) or atoms included in a substituent when the ring is replaced by a substituent are not included in the number of ring-member atoms. The number of ring-member atoms described below is assumed to be the same unless otherwise specified.

For example, a benzene ring has 6 ring-member atoms, a naphthalene ring has 10 ring-member atoms, a pyridine ring has 6 ring-member atoms, and a furan ring has 5 ring-member atoms.

When the benzene ring is substituted with a substituent, for example, an alkyl group, the number of carbon atoms of the alkyl group is not included in the number of ring-member atoms of the benzene ring. Accordingly, the number of ring-member atoms of the benzene ring substituted by the alkyl group is 6. In addition, when the naphthalene ring is substituted with an alkyl group as a substituent, for example, the number of atoms of the alkyl group is not included in the number of ring-member atoms of the naphthalene ring. Accordingly, the number of ring-member atoms of the naphthalene ring substituted by the alkyl group is 10.

For example, the number of hydrogen atoms bonded to the pyridine ring or the atoms constituting the substituent is not included in the number of ring-member atoms of the pyridine ring. Accordingly, the number of ring-member atoms of the pyridine ring to which the hydrogen atom or substituent is bonded is 6.

As used herein, unless otherwise specified, "substituted" refers to substitution with an (C1 to C20) alkyl group, a (C3 to C20) cycloalkyl group, a (C1 to C20) hydroxyalkyl group, an (C2 to C20) alkoxyalkyl group, an (C1 to C20) alkoxy group, a (C4 to C20) cycloalkoxy group, an (C2 to C20) alkenyl group, an (C2 to C20) alkynyl group, an (C0 to C20) amino group, an (C6 to C20) aryl group, an (C6 to C20) aryloxy group, an (C1 to C20) alkylthio group, a (C3 to C20) cycloalkylthio group, an (C6 to C20) arylthio group, an (C2 to C20) alkoxycarbonyl group, an (C7 to C20) aryloxycarbonyl group, a hydroxy group (—OH), a carboxyl group (—COOH), a thiol group (—SH), a cyano group (—CN), a halogen atom (fluorine atom, chlorine atom, bromine atom, iodine atom), or a combination thereof. On the other hand, when a group is substituted, the form of substitution in which the substituent is included in the definition before substitution is excluded. For example, when a substituent is an alkyl group, this alkyl group as a substituent is not substituted with an alkyl group.

Herein, the alkyl group as the substituent may be either a linear or branched alkyl group, for example a linear alkyl group having 1 to 20 carbon atoms or a branched alkyl group having 3 to 20 carbon atoms. Specifically, the alkyl group may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, a nonadecyl group, an icosyl group, and the like.

As the substituent, the cycloalkyl group may include for example, a cyclopropyl group, a cyclobutyl group, a cyclopentyl group, and a cyclohexyl group.

The hydroxyalkyl group may be, for example, an alkyl group that is substituted with 1 to 3 (desirably 1 or 2, and particularly desirably 1) hydroxy groups (for example, hydroxymethyl group, hydroxyethyl group).

The alkoxyalkyl group may be, for example, an alkyl group that is substituted with 1 to 3 (desirably 1 or 2 and particularly desirably 1) alkoxy groups.

The alkoxy group as the substituent may be either a linear or branched alkoxy group, but desirably a linear alkoxy group having 1 to 20 carbon atoms or a branched chain alkoxy group having 3 to 20 carbon atoms. For example, the alkoxy group may be, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The cycloalkoxy group as a substituent may be, for example, a cyclopropyl oxy group, a cyclobutyl oxy group, a cyclopentyl oxy group, a cyclohexyl oxy group, and the like.

The alkenyl group as a substituent may include, for example, a vinyl group, an allyl group, a 1-propenyl group, an isopropenyl group, a 1-butenyl group, a 2-butenyl group, a 3-butenyl group, a 1-pentenyl group, a 2-pentenyl group, a 3-pentenyl group, a 1-hexenyl group, a 2-hexenyl group, a 3-hexenyl group, a 1-heptenyl group, a 2-heptenyl group, a 5-heptenyl group, a 1-octenyl group, a 3-octenyl group, a 5-octenyl group, and the like.

The alkynyl group as a substituent may include, for example, an acetylenyl group, a 1-propynyl group, a 2-propynyl group, a 1-butynyl group, a 2-butynyl group, a 3-butynyl group, a 1-pentynyl group, a 2-pentynyl group, a 3-pentynyl group, 1-hexynyl group, a 2-hexynyl group, a 3-hexynyl group, a 1-heptynyl group, a 2-heptynyl group, a 5-heptynyl group, a 1-octynyl group, a 3-octynyl group, a 5-octynyl group, and the like.

The aryl group as the substituent may be desirably an aryl group having 6 to 30 carbon atoms. The aryl group may include, for example, a phenyl group, a naphthyl group, a biphenyl group, a fluorenyl group, an anthryl group, a pyrenyl group, an azulenyl group, an acenaphthylenyl group, a terphenyl group, and a phenanthryl group.

The aryloxy group as the substituent may include, for example, a phenoxy group, and a naphthyloxy group.

The alkylthio group as the substituent may include, for example, a methylthio group, an ethylthio group, a propylthio group, a pentylthio group, a hexylthio group, an octylthio group, a dodecylthio group, and the like.

The cycloalkylthio group as the substituent may include, for example, a cyclopentylthio group and a cyclohexylthio group.

The arylthio group as the substituent may include, for example, a phenylthio group, a naphthylthio group, and the like.

The alkoxycarbonyl group as the substituent may include, for example, a methoxy carbonyl group, an ethoxy carbonyl group, a butoxy carbonyl group, an octyloxy carbonyl group, a dodecyloxy carbonyl group, and the like.

The aryloxycarbonyl group as the substituent may include, for example, a phenyloxy carbonyl group, a naphthyloxycarbonyl group, and the like.

Polymer Compound

Structural Unit (A)

The polymer compound according to an embodiment has Structural Unit (A) represented by Chemical Formula (1). The polymer compound including Structural Unit (A) has excellent hole injection properties into quantum dots and can improve the durability (luminescence lifespan) of the electroluminescent device. In addition, high current efficiency and low driving voltage can be achieved. The polymer compound according to an embodiment may include only one type of Structural Unit (A), or may include two or more types of Structural Units (A). On the other hand, the plurality of Structural Units (A) may exist in a block form, a random form, an alternating form, or a periodic form.

Chemical Formula (1)

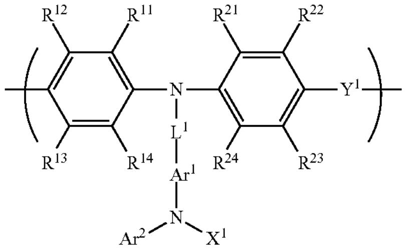

(1)

In Chemical Formula (1), Structural Unit X (structural unit on the left side of Chemical Formula (1); that is, a structural unit consisting of a nitrogen atom between two phenylene groups) constitutes the polymer compound according to an embodiment. Likewise, in Chemical Formula (1), the structural unit Y (the structural unit on the right side of Chemical Formula (1); that is, the structural unit represented by "$Y^1$") constitutes a polymer compound according to an embodiment. In other words, the polymer compound according to an embodiment may be a copolymer including Structural Unit X and Structural Unit Y.

In Chemical Formula (1), $X^1$ is a substituted or unsubstituted aromatic hydrocarbon group having 6 to 25 ring-member atoms, $Y^1$ is a substituted or unsubstituted aromatic hydrocarbon group having 6 to 25 ring-member atoms, wherein at least one of $X^1$ and $Y^1$ is an aromatic hydrocarbon group having 6 to 25 ring-member atoms substituted with an alkyl group having 1 to 14 carbon atoms substituted with a carboxyl group or an alkyl group having 1 to 14 carbon atoms substituted with a group having a carboxyl group.

In this way, in Structural Unit (A) according to an embodiment, $X^1$ and/or $Y^1$ have an alkyl group having 1 to 14 carbon atoms substituted with a carboxyl group or an alkyl group having 1 to 14 carbon atoms substituted with a group having a carboxyl group (in this specification, the alkyl group having 1 to 14 carbon atoms substituted with a carboxyl group or the alkyl group having 1 to 14 carbon atoms substituted with a group having a carboxyl group may be referred to as "alkyl group substituted with a carboxyl group" or as "Substituent (a)."). Therefore, the polymer compound according to an embodiment has a large dipole moment, and a hole injection property of the hole transport layer including it is improved. Therefore, when used in an electroluminescent device, the durability (luminescence lifespan) of the device can be improved. On the other hand, when Substituent (a) is included in both of $X^1$ and $Y^1$, Substituent (a) may be the same or different.

The alkyl group having 1 to 14 carbon atoms included in the alkyl group (Substituent (a)) substituted with a carboxyl group according to an embodiment may be a linear or branched alkyl group, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, and the like.

Herein, the alkyl group included in the alkyl group substituted with a carboxyl group may have a carbon number of 1 to 13, desirably 3 to 12, more desirably 5 to 12, and particularly desirably 7 to 12, from the viewpoint of improving durability, excellent solvent solubility, and improved film forming properties when forming a film by a wet (coating) method. In addition, by making the alkyl group constituting Substituent (a) a relatively long-chain alkyl group, a glass transition temperature ($T_g$) of the polymer compound is within an appropriate range, which is desirable in terms of manufacturing an electroluminescent device.

Additionally, the alkyl group included in Substituent (a) (alkyl group constituting Substituent (a)) is desirably linear from the viewpoint of improving durability.

In addition, in the alkyl group, the substitution position of the carboxyl group is not particularly limited, but is desirably at the terminal end. That is, the alkyl group substituted with a carboxyl group (Substituent (a)) according to an embodiment desirably has a structure represented by Chemical Formula (i):

Chemical Formula (i)

$$***—C_tH_{2t}—(Z^1)_u—COOH \quad (i)$$

In Chemical Formula (i), t represents an integer from 1 to 14, u is 0 or 1, $Z^1$ represents an organic group other than an alkylene group, and *** is bonded to an aromatic hydrocarbon group having 6 to 25 ring-member atoms constituting $X^1$ or $Y^1$.

In terms of improving durability (especially luminescence life-span), t is desirably an integer of 1 to 13, more desirably 3 to 12, particularly desirably 5 to 12, and the most desirably 7 to 12.

Additionally, from the viewpoint of further improving durability (especially luminescence lifespan), it is desirable that u is 0 (i.e., does not have $Z^1$). On the other hand, from the viewpoint of improving external quantum efficiency (EQE) and luminous efficiency, it is desirable that u is 1 (i.e., has $Z^1$).

When u is 1, the organic group (divalent organic group) as $Z^1$ is not particularly limited as long as it is a group including carbon atoms other than an alkylene group, but for example, a substituted or unsubstituted alkenylene group having 2 to 14 carbon atoms, a substituted or unsubstituted alkynylene group having 2 to 14 carbon atoms, a substituted or unsubstituted cycloalkylene group having 3 to 16 carbon atoms, and a substituted or unsubstituted arylene group with 6 to 20 carbon atoms.

Examples of the alkenylene group having 2 to 14 carbon atoms may include a vinylene group, a 1-propenylene group, a 2-butenylene group, a 1,3-butadienylene group, a 2-pentenylene group, an isopropenylene group, and the like.

Examples of the alkynylene group having 2 to 14 carbon atoms may include an ethynylene group, a 1-propynylene group, a 1-butynylene group, a 1-pentynylene group, a 1-hexynylene group, a 2-butynylene group, a 2-pentynylene group, and the like.

Examples of the cycloalkylene group having 3 to 16 carbon atoms may include a cyclopropylene group, a cyclobutylene group, a cyclopentylene group, a cyclohexylene group, a cycloheptylene group, and the like.

Examples of the arylene group having 6 to 20 carbon atoms may include an o-phenylene group, a m-phenylene group, a p-phenylene group, a naphthylenediyl group, an anthracenediyl group, a naphthacenediyl group, a pyrenediyl group, a biphenyldiyl group, and the like.

Among them, the organic group as $Z^1$ may be desirably a substituted or unsubstituted alkenylene group having 2 to 14 carbon atoms, more desirably a substituted or unsubstituted alkenylene group having 2 to 8 carbon atoms, a substituted or unsubstituted alkenylene group having 2 to 6 carbon atoms, or substituted or unsubstituted vinylene groups.

As will be explained in detail below, the polymer compound according to an embodiment can be formed into a film by a coating method, but at this time, from the viewpoint of improving film forming properties and durability (especially luminescence lifespan) by forming a uniform film, the alkenylene group, alkynylene group, cycloalkylene group, and arylene group constituting $Z^1$ may be unsubstituted. In addition, in another embodiment, the alkenylene group or the like constituting $Z^1$ may be substituted, and in that case, the same substituent as the substituent described above for "substituted" may be applied. At this time, the substituent for the alkenylene group as $Z^1$ may be desirably selected from an alkoxy group, an amino group, a hydroxy group (—OH), a thiol group (—SH), and a cyano group (—CN), and more desirably a cyano group.

In Chemical Formula (1), $X^1$ represents a substituted or unsubstituted aromatic hydrocarbon group having 6 to 25 ring-member atoms. Herein, "the substituted or unsubstituted aromatic hydrocarbon group having 6 to 25 ring-member atoms" means any one of an aromatic hydrocarbon group having 6 to 25 ring-member atoms substituted with Substituent (a); an aromatic hydrocarbon group having 6 to 25 ring-member atoms substituted with a substituent other than Substituent (a); or an unsubstituted aromatic hydrocarbon group having 6 to 25 ring-member atoms. Meanwhile, in this specification, "a substituent other than Substituent (a)" refers to substituents other than the alkyl group substituted with a carboxyl group (—COOH) among the substituents described for "substituted" above.

Herein, the aromatic hydrocarbon group having 6 to 25 ring-member atoms may specifically include a monovalent group derived from aromatic hydrocarbons such as benzene, naphthalene, anthracene, pyrene, pentalene, indene, azulene, heptalene, acenaphthene, phenalene, phenanthrene, biphenyl, terphenyl, quaterphenyl, fluorene, and 9,9'-spirobi[fluorene].

When $X^1$ is an aromatic hydrocarbon group substituted with an alkyl group (Substituent (a)) substituted with a carboxyl group, this aromatic hydrocarbon group may be desirably a monovalent group derived from a compound selected from benzene, biphenyl, terphenyl, and fluorene (a group selected from a phenyl group, a biphenyl group, a terphenyl group, and a fluorenyl group).

In addition, in Chemical Formula (1), when $X^1$ is an aromatic hydrocarbon group substituted with Substituent (a), $X^1$ may be one of the groups represented by Chemical Formulas (3-1) to (3-12):

Chemical Formulas (3-1) to (3-12)

(3-1)

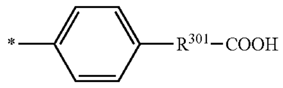

(3-2)

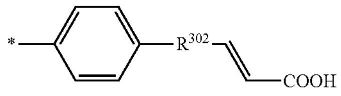

(3-3)

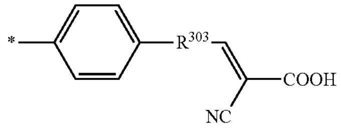

(3-4)

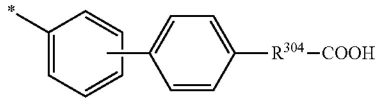

(3-5)

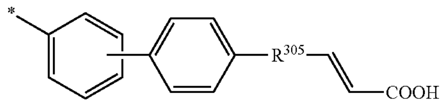

(3-6)

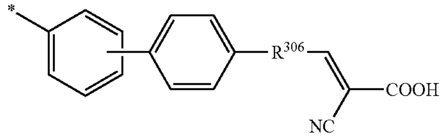

(3-7)

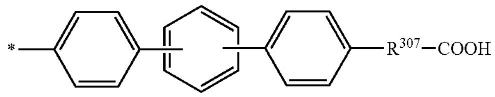

(3-8)

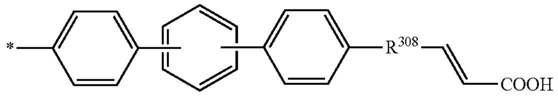

(3-9)

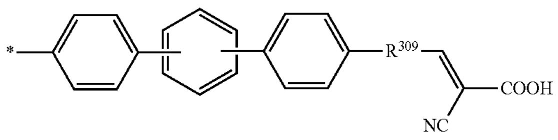

-continued (3-10)

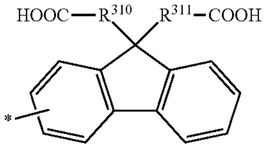

(3-11)

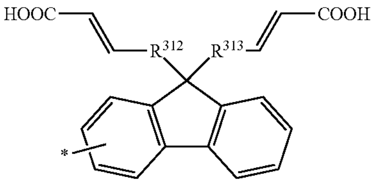

(3-12)

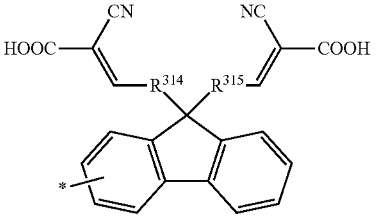

In Chemical Formulas (3-1) to (3-12), $R^{301}$ to $R^{315}$ are each independently a substituted or unsubstituted alkylene group having 1 to 14 carbon atoms, and * is bonded to a nitrogen atom (the nitrogen atom bonded to $Ar^1$).

In addition, in Chemical Formulas (3-10) to (3-12), $R^{310}$ and $R^{311}$, $R^{312}$, and $R^{313}$, $R^{314}$, and $R^{315}$ may be the same or different, respectively. Desirably, $R^{310}$ and $R^{311}$, $R^{312}$ and $R^{313}$, $R^{314}$, and $R^{315}$ may be the same.

The alkylene group having 1 to 14 carbon atoms as $R^{301}$ to $R^{315}$ is not particularly limited, but is a linear or branched alkylene group, for example, a methylene group, an ethylene group, a trimethylene group, a propylene group, a 1,1-dimethylmethylene group, an n-butylene group, an isobutylene group, a sec-butylene group, a tert-butylene group, an n-pentylene group, an isopentylene group, a tert-pentylene group, a neopentylene group, a 1,2-dimethylpropylene group, an n-hexylene group, an isohexylene group, a 1,3-dimethylbutylene group, a 1-isopropylpropylene group, a 1,2-dimethylbutylene group, an n-heptylene group, a 1,4-dimethylpentylene group, a 3-ethylpentylene group, a 2-methyl-1-isopropylpropylene group, a 1-ethyl-3-methylbutylene group, an n-octylene group, a 2-ethylhexylene group, a 3-methyl-1-isopropylbutylene group, a 2-methyl-1-isopropylbutylene group, a 1-tert-butyl-2-methylpropylene group, an n-nonylene group, a 3,5,5-trimethylhexylene group, an n-decylene group, an isodecylene group, an n-undecylene group, a 1-methyldecylene group, an n-dodecylene group, an n-tridecylene group, an n-tetradecylene group, and the like.

Herein, from the viewpoint of improving durability, the alkylene group as $R^{301}$ to $R^{315}$ may have desirably 3 to 13 carbon atoms, more desirably 5 to 12 carbon atoms, and particularly desirably 7 to 10 carbon atoms.

In addition, the alkylene groups as $R^{301}$ to $R^{315}$ are desirably linear from the viewpoint of improving durability.

In Chemical Formula (1), when $X^1$ is an aromatic hydrocarbon group substituted with Substituent (a), $X^1$ may be desirably any one of the groups represented by Chemical Formulas (3-10) to (3-12). When $X^1$ has these structures, durability (especially luminous lifespan), external quantum efficiency (EQE), and luminous efficiency are further improved. Among them, it is desirable that $X^1$ is a group represented by Chemical Formula (3-10).

On the other hand, when $X^1$ is an aromatic hydrocarbon group that is not substituted with an alkyl group substituted with a carboxyl group (Substituent (a)), this aromatic hydrocarbon group may be desirably a monovalent group derived from a compound selected from benzene, biphenyl, terphenyl, and fluorene which are substituted or unsubstituted with a substituent other than Substituent (a). $X^1$ may be more desirably a monovalent group derived from a compound selected from benzene, biphenyl, and fluorene which are substituted or unsubstituted with a substituent other than Substituent (a). $X^1$ may be particularly desirably a monovalent group derived from benzene or fluorene which are substituted or unsubstituted with a substituent other than Substituent (a) (a phenyl group or fluorenyl group substituted or unsubstituted with a substituent other than Substituent (a)).

Additionally, from the viewpoint of improving durability, in Chemical Formula (1), when $X^1$ is an aromatic hydrocarbon group not substituted with Substituent (a), It is desirable that it is any one of the groups represented by Chemical Formulas (4-1) to (4-4).

Chemical Formulas (4-1) to (4-4)

(4-1)

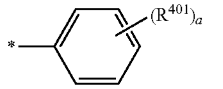

(4-2)

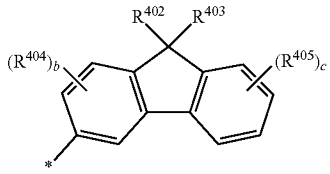

(4-3)

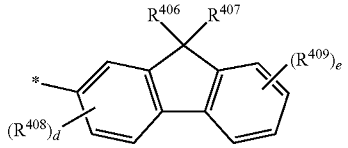

(4-4)

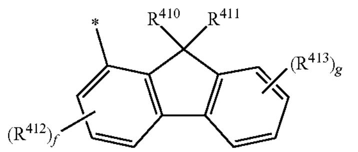

In Chemical Formulas (4-1) to (4-4), $R^{401}$ to $R^{413}$ are each independently an alkyl group having 1 to 14 carbon atoms substituted or unsubstituted with a substituent other than a carboxyl group (—COOH), a is 0, 1, 2, 3, 4 or 5, b, d, and f are each independently 0, 1, 2, or 3, c, e, and g are each independently 0, 1, 2, 3, or 4, and when any of a, b, c, d, e, f, and g is 2 or more, each $R^{401}$, each $R^{404}$, each $R^{405}$, each $R^{408}$, each $R^{409}$, each $R^{412}$, or each $R^{413}$ may be the same or different, and * is bonded to a nitrogen atom (the nitrogen atom bonded to $Ar^1$).

In addition, in Chemical Formulas (4-2) to (4-4), $R^{402}$ and $R^{403}$, $R^{406}$ and $R^{407}$, $R^{410}$ and $R^{411}$ may be the same or different, respectively. Desirably, $R^{402}$ and $R^{403}$, $R^{406}$ and $R^{407}$, $R^{410}$, and $R^{411}$ may be the same as each other.

In Chemical Formulas (4-1) to (4-4), a, b, c, d, e, f, or g being 0 means that the corresponding $R^{401}$, $R^{404}$, $R^{405}$, $R^{408}$, $R^{409}$, $R^{412}$, or $R^{413}$ are not present. That is, the ring-member atom to which the substituent $R^{401}$, $R^{404}$, $R^{405}$, $R^{408}$, $R^{409}$, $R^{412}$, or $R^{413}$ may be bonded is unsubstituted, which indicates that a hydrogen atom is bonded to the ring-member atom.

The ad may be desirably 0, 1, or 2, more desirably 0 or 1, and particularly desirably 1. In addition, when a is 1, the substitution position of $R^{401}$ is desirably the para position (p position or 4th position) with respect to the bond (*) to the nitrogen atom (the nitrogen atom bonded to $Ar^1$). The b, c, d, e, f, and g may each independently desirably be 0, 1, or 2, more desirably 0 or 1, and particularly desirably 0.

The alkyl group having 1 to 14 carbon atoms as $R^{401}$ to $R^{413}$ is not particularly limited, but is a linear or branched alkyl group, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, and the like.

Herein, from the viewpoint of improving durability, the alkyl group as $R^{401}$ to $R^{413}$ desirably has 1 to 12 carbon atoms, and more desirably 1 to 8 carbon atoms. In particular, it is desirable that $R^{401}$ to $R^{413}$ are each independently an alkyl group having a carbon number in the above range.

Additionally, the alkyl groups as $R^{401}$ to $R^{413}$ are desirably linear from the viewpoint of improving durability.

In Chemical Formula (1), when $X^1$ is an aromatic hydrocarbon group that is not substituted with Substituent (a), from the viewpoint of improving durability (especially luminescence lifespan), it is desirable that $X^1$ is any one of the groups represented by the above formulas (4-1) to (4-3). It is more desirable that $X^1$ is a group represented by Chemical Formula (4-1) or (4-3).

In Chemical Formula (1), $Y^1$ represents a substituted or unsubstituted aromatic hydrocarbon group having 6 to 25 ring-member atoms. Herein, "the substituted or unsubstituted aromatic hydrocarbon group having 6 to 25 ring-member atoms" means any one of an aromatic hydrocarbon group having 6 to 25 ring-member atoms substituted with Substituent (a); aromatic hydrocarbon group having 6 to 25 ring-member atoms substituted with a substituent other than Substituent (a); or an unsubstituted aromatic hydrocarbon group having 6 to 25 ring-member atoms.

Herein, the aromatic hydrocarbon group having 6 to 25 ring-member atoms may specifically include a divalent group derived from aromatic hydrocarbons such as benzene, naphthalene, anthracene, pyrene, pentalene, indene, azulene, heptalene, acenaphthene, phenalene, phenanthrene, biphenyl, terphenyl, quaterphenyl, fluorene, and 9,9'-spirobi[fluorene].

When $Y^1$ is an aromatic hydrocarbon group substituted with an alkyl group substituted with a carboxyl group (Substituent (a)), this aromatic hydrocarbon group may be desirably a divalent group (phenylene group or fluorenylene group) derived from benzene or fluorene.

Additionally, in Chemical Formula (1), when $Y^1$ is an aromatic hydrocarbon group substituted with Substituent (a), $Y^1$ may be desirably any one of the groups represented by Chemical Formulas (5-1) to (5-9):

Chemical Formulas (5-1) to (5-9)

(5-1)

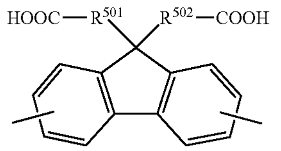

(5-2)

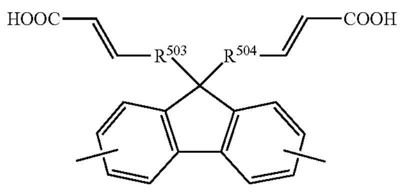

(5-3)

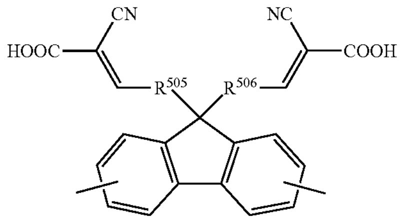

(5-4)

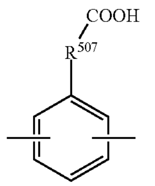

(5-5)

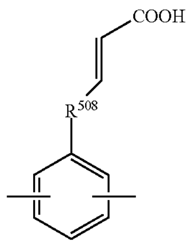

(5-6)

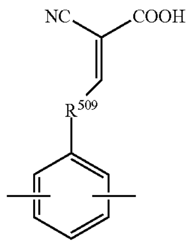

-continued (5-7)

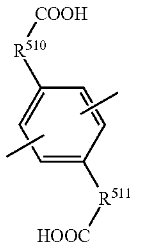

(5-8)

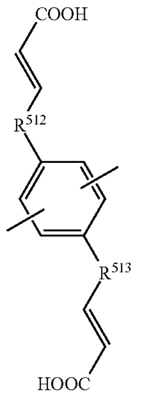

(5-9)

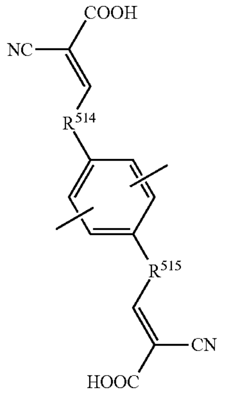

In Chemical Formulas (5-1) to (5-9), $R^{501}$ to $R^{515}$ are each independently a substituted or unsubstituted alkylene group having 1 to 14 carbon atoms.

In addition, in Chemical Formulas (5-1) to (5-3) and (5-7) to (5-9), $R^{501}$ and $R^{502}$, $R^{503}$ and $R^{504}$, $R^{505}$ and $R^{506}$, $R^{510}$ and $R^{511}$, $R^{512}$ and $R^{513}$, $R^{514}$ and $R^{515}$ may be the same or different, respectively. Desirably, $R^{501}$ and $R^{502}$, $R^{503}$ and $R^{504}$, $R^{505}$ and $R^{506}$, $R^{510}$ and $R^{511}$, $R^{512}$ and $R^{513}$, $R^{514}$ and $R^{515}$ may be the same.

The alkylene group having 1 to 14 carbon atoms as $R^{501}$ to $R^{515}$ is not particularly limited, but is a linear or branched alkylene group, for example, a methylene group, an ethylene group, a trimethylene group, a propylene group, a 1,1-dimethylmethylene group, an n-butylene group, an isobutylene group, a sec-butylene group, a tert-butylene group, an n-pentylene group, an isopentylene group, a tert-pentylene group, a neopentylene group, a 1,2-dimethylpropylene group, an n-hexylene group, an isohexylene group, a 1,3-dimethylbutylene group, a 1-isopropylpropylene group, a 1,2-dimethylbutylene group, an n-heptylene group, a 1,4-dimethylpentylene group, a 3-ethylpentylene group, a 2-methyl-1-isopropylpropylene group, a 1-ethyl-3-methylbutylene group, an n-octylene group, a 2-ethylhexylene group, a 3-methyl-1-isopropylbutylene group, a 2-methyl-1-isopropylbutylene group, a 1-tert-butyl-2-methylpropylene group, an n-nonylene group, a 3,5,5-trimethylhexylene group, an n-decylene group, an isodecylene group, an n-undecylene group, a 1-methyldecylene group, an n-dodecylene group, an n-tridecylene group, an n-tetradecylene group, and the like.

Herein, from the viewpoint of improving durability, the alkylene group as $R^{501}$ to $R^{515}$ may have desirably 1 to 13 carbon atoms, more desirably 3 to 12 carbon atoms, particularly desirably 5 to 12 carbon atoms, and particularly desirably 7 to 12 carbon atoms.

In addition, the alkylene groups as $R^{501}$ to $R^{515}$ are desirably linear from the viewpoint of improving durability.

In Chemical Formula (1), when $Y^1$ is an aromatic hydrocarbon group substituted with Substituent (a), $Y^1$ is desirably any one of the groups represented by Chemical Formulas (5-1) to (5-3). From the viewpoint of further improving durability (especially luminescence lifespan), it is desirable that $Y^1$ is a group represented by Chemical Formula (5-1). On the other hand, from the viewpoint of improving external quantum efficiency (EQE) and luminous efficiency, $Y^1$ is desirably a group represented by Chemical Formulas (5-2) or (5-3).

On the other hand, when $Y^1$ is an aromatic hydrocarbon group that is not substituted with an alkyl group substituted with a carboxyl group (Substituent (a)), this aromatic hydrocarbon group may be desirably a divalent group derived from a compound selected from benzene, biphenyl, terphenyl, and fluorene which are substituted or unsubstituted with a substituent other than Substituent (a). $Y^1$ is more desirably a divalent group derived from biphenyl or fluorene, substituted or unsubstituted with a substituent other than Substituent (a). It is especially desirable that $Y^1$ is a divalent group derived from fluorene that is unsubstituted or substituted with a substituent other than Substituent (a) (a fluorenylene group that is unsubstituted or substituted with a substituent other than Substituent (a)).

Additionally, from the viewpoint of improving durability, in Chemical Formula (1), when $Y^1$ is an aromatic hydrocarbon group not substituted with Substituent (a), it is desirable that $Y^1$ is a group represented by Chemical Formula (6-1).

Chemical Formula (6-1)

(6-1)

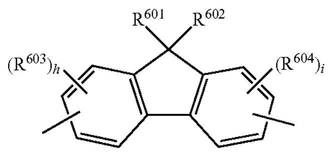

In Chemical Formula (6-1), $R^{601}$ to $R^{604}$ are each independently an alkyl group having 1 to 14 carbon atoms substituted or unsubstituted with a substituent other than a carboxyl group (—COOH), h and i are each independently 0, 1, 2, or 3, and when either h or i is 2 or more, each $R^{603}$ or each $R^{604}$ may be the same or different.

Additionally, in Chemical Formula (6-1), $R^{601}$ and $R^{602}$ may be the same or different. Desirably, $R^{601}$ and $R^{602}$ may be the same as each other.

In Chemical Formula (6-1), h or i being 0 means that the corresponding $R^{603}$ or $R^{604}$ does not exist. That is, the ring-member atom to which the substituent $R^{603}$ or $R^{604}$ may be bonded is unsubstituted, which indicates that a hydrogen atom is bonded to the ring-member atom.

The h and i may each independently desirably be 0, 1, or 2, more desirably 0 or 1, and particularly desirably 0.

The alkyl group having 1 to 14 carbon atoms as $R^{601}$ to $R^{604}$ is not particularly limited, but is a linear or branched alkyl group, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, and the like.

Herein, from the viewpoint of improving durability, the alkyl group as $R^{601}$ to $R^{604}$ may have desirably 1 to 12 carbon atoms, more desirably 1 to 10 carbon atoms, and particularly desirably 2 to 6 carbon atoms. In particular, it is desirable that $R^{601}$ and $R^{602}$ are each independently an alkyl group having a carbon number in the above range.

Additionally, the alkyl groups as $R^{601}$ to $R^{604}$ may be desirably linear from the viewpoint of improving durability.

In Chemical Formula (1), the alkyl group substituted with a carboxyl group (Substituent (a)) may be included only in $X^1$, only in $Y^1$, or in both $X^1$ and $Y^1$. From the viewpoint of improving durability (especially luminescence lifespan), Substituent (a) is desirably included only in $X^1$, or is included only in $Y^1$, and is more desirably included only in $X^1$. For example, in Chemical Formula (1), $X^1$ can be an aromatic hydrocarbon group having 6 to 25 ring-member atoms substituted with an alkyl group having 1 to 14 carbon atoms substituted with a carboxyl group or an alkyl group having 1 to 14 carbon atoms substituted with a group having a carboxyl group (Substituent (a)), or, $Y^1$ can be an aromatic hydrocarbon group having 6 to 25 ring-member atoms which is substituted or unsubstituted with a substituent other than an alkyl group having 1 to 14 carbon atoms substituted with a carboxyl group or an alkyl group having 1 to 14 carbon atoms substituted with a group having a carboxyl group (Substituent (a)).

In another embodiment, when an alkyl group substituted with a carboxyl group (Substituent (a)) is present in the side chain of a polymer compound, it can also improve durability. That is, in a quantum dot electroluminescent device having a hole transport layer including the polymer compound and a light emitting layer including quantum dots, Substituent (a) of the side chain of the polymer compound in the hole transport layer and the quantum dots included in the light emitting layer are closer together, and the hydrocarbon group of the side chain of the polymer compound interacts closely with the quantum dots. Accordingly, holes are efficiently injected into the quantum dots (hole injection properties are further improved), and durability (luminescence lifespan) can be further improved.

In some embodiments, it is desirable that $R^{11}$ to $R^{14}$, $R^{21}$ to $R^{24}$, $L^1$, $Ar^1$, and $Ar^2$ in Chemical Formula (1) do not include an alkyl group substituted with a carboxyl group (Substituent (a)).

In Chemical Formula (1), $L^1$ is a substituted or unsubstituted aromatic hydrocarbon group having 6 to 25 ring-member atoms; or a substituted or unsubstituted aromatic heterocyclic group having 5 to 25 ring-member atoms.

Herein, the aromatic hydrocarbon group may be specifically a divalent group derived from aromatic hydrocarbons such as benzene (phenylene group), naphthalene, anthracene, pyrene, pentalene, indene, azulene, heptalene, acenaphthene, phenalene, phenanthrene, biphenyl, terphenyl, quaterphenyl, fluorene, and 9,9'-spirobi[fluorene]. Additionally, the aromatic heterocyclic group may be specifically a divalent group derived from a heterocyclic aromatic compound such as acridine, phenazine, benzoquinoline, benzoisoquinoline, phenanthridine, phenanthroline, anthraquinone, fluorenone, dibenzofuran, dibenzothiophene, carbazole, imidazophenanthridine, benzimidazophenanthridine, azadibenzofuran, azacarbazole, azadibenzothiophene, diazadibenzofuran, diazacarbazole, diazadibenzothiophene, xanthone, thioxanthone, pyridine, quinoline, and anthraquinoline.

Among these, $L^1$ may be desirably a divalent group derived from a substituted or unsubstituted compound selected from benzene, biphenyl, terphenyl, quaterphenyl and fluorene, and it is more desirable that it is a substituted or unsubstituted divalent group derived from benzene or biphenyl (substituted or unsubstituted phenylene group or biphenylene group).

In addition, in Chemical Formula (1), $L^1$ may be desirably one of the groups represented Chemical Formulas (7-1) to (7-24):

Chemical Formulas (7-1) to (7-24)

(7-1)

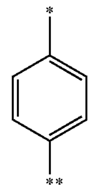

(7-2)

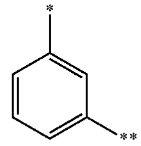

(7-3)

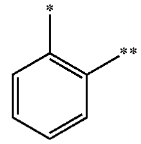

(7-4)

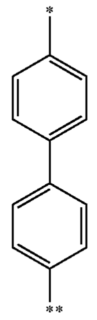

-continued
(7-5)
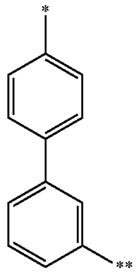
(7-6)
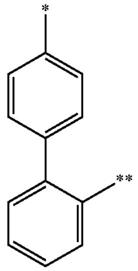
(7-7)
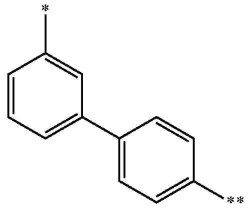
(7-8)
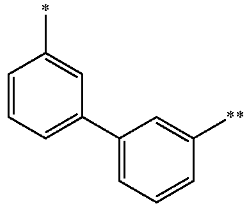
(7-9)
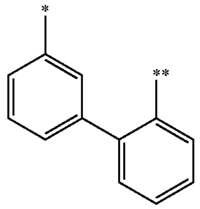
(7-10)
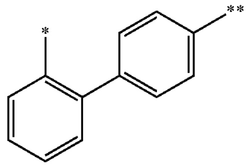
(7-11)
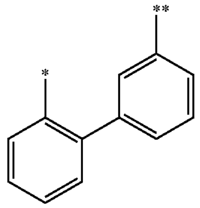
-continued
(7-12)
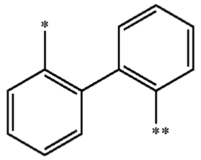
(7-13)
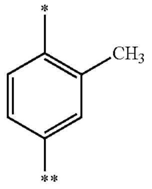
(7-14)
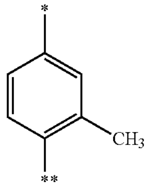
(7-15)
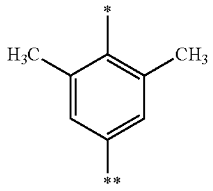
(7-16)
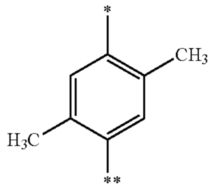
(7-17)
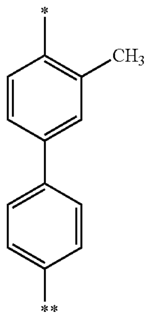
(7-18)
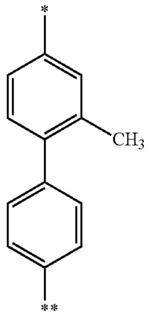

-continued (7-19)

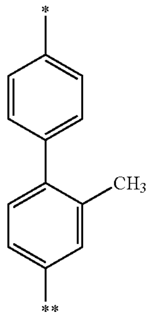

(7-20)

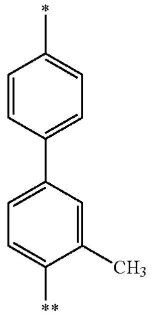

(7-21)

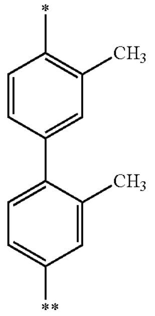

(7-22)

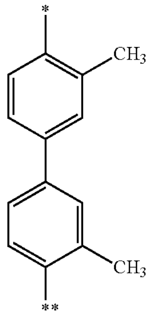

(7-23)

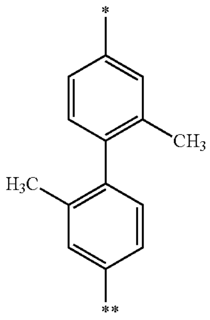

-continued (7-24)

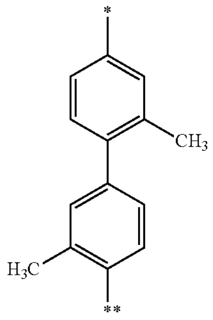

In Chemical Formulas (7-1) to (7-24), * is bonded to a nitrogen atom, and ** is bonded to $Ar^1$.

In addition, $L^1$ may be any one of the groups represented by Chemical Formulas (7-1) to (7-3) and Chemical Formulas (7-13) to (7-16) (i.e., a substituted or unsubstituted phenylene group). $L^1$ may be desirably any one of the groups represented by Chemical Formula (7-1) and Chemical Formulas (7-13) to (7-16) (i.e., a substituted or unsubstituted p-phenylene group). It is especially desirable that $L^1$ is a group represented by Chemical Formula (7-1) (i.e., an unsubstituted p-phenylene group). With such $L^1$, higher hole injection properties (resulting in high durability) and good film forming properties can be achieved.

In Chemical Formula (1), $Ar^1$ represents a substituted or unsubstituted aromatic hydrocarbon group having 6 to 25 ring-member atoms. At this time, $Ar^1$ may form a ring with $Ar^2$. On the other hand, when $Ar^1$ forms a ring with $Ar^2$, $Ar^1$ is a trivalent group. When $Ar^1$ does not form a ring with $Ar^2$, $Ar^1$ is a divalent group.

Herein, the aromatic hydrocarbon group as $Ar^1$ is not particularly limited. When $Ar^1$ does not form a ring with $Ar^2$, specific examples of $Ar^1$ include the same divalent groups derived from aromatic hydrocarbons having 6 to 25 ring-member atoms described for $L^1$ above. In addition, when $Ar^1$ forms a ring with $Ar^2$, the divalent group derived from an aromatic hydrocarbon having 6 to 25 ring-member atoms described for $L^1$ above can be converted into a trivalent group.

Among these, $Ar^1$ is desirably a substituted or unsubstituted divalent or trivalent group derived from a compound selected from benzene, biphenyl and fluorene, more desirably a substituted or unsubstituted divalent group or trivalent group derived from benzene or biphenyl, and particularly desirably a divalent (e.g., o, m, p-phenylene group) or trivalent group (e.g., 1,3,4-phenylylene group) derived from substituted or unsubstituted benzene. Additionally, $Ar^1$ is more desirably a substituted or unsubstituted p-phenylene group or a 1,3,4-phenylylene group, and most desirably a substituted or unsubstituted 1,3,4-phenylylene group. That is, it is desirable that $Ar^1$ forms a ring with $Ar^2$.

With such $Ar^1$, higher hole injection properties (resulting in high durability) and good film forming properties can be achieved. Additionally, durability and luminous efficiency can be improved with a good balance.

Meanwhile, the substituent that may exist when any one hydrogen atom of $Ar^1$ is substituted is not particularly limited, and the same substituent as the substituent described for "substituted" above can be applied. In an embodiment, $Ar^1$ is unsubstituted.

In Chemical Formula (1), $Ar^2$ is a substituted or unsubstituted aromatic hydrocarbon group having 6 to 25 ring-member atoms; or a substituted or unsubstituted aromatic heterocyclic group having 5 to 25 ring-member atoms. At this time, $Ar^2$ may form a ring with $Ar^1$. On the other hand, when $Ar^2$ forms a ring with $Ar^1$, $Ar^2$ is a divalent group. When $Ar^2$ does not form a ring with $Ar^1$, $Ar^2$ is a monovalent group.

Herein, the aromatic hydrocarbon group and aromatic heterocyclic group as $Ar^2$ are not particularly limited. When $Ar^2$ does not form a ring with $Ar^1$, a specific example of $Ar^2$ can be exemplified by converting a divalent group derived from an aromatic hydrocarbon with 6 to 25 ring-member atoms described for $L^1$ into a monovalent group. Similarly, in the above case, the aromatic heterocyclic group as $Ar^2$ can be exemplified by converting a divalent group derived from a heterocyclic aromatic compound with 5 to 25 ring-member atoms described for $L^1$ into a monovalent group. In addition, when $Ar^2$ forms a ring with $Ar^1$, the same divalent group derived from an aromatic hydrocarbon having 6 to 25 ring-member atoms described for $L^1$ can be used. Similarly, in the above case, the aromatic heterocyclic group as $Ar^2$ may be exemplified as the same divalent group derived from a heterocyclic aromatic compound having 5 to 25 ring-member atoms described for $L^1$.

Among these, $Ar^2$ is desirably a substituted or unsubstituted monovalent or divalent group derived from a compound selected from benzene, biphenyl, and fluorene, more desirably a substituted or unsubstituted monovalent group or divalent group derived from benzene or biphenyl, particularly desirably a monovalent or divalent group derived from substituted or unsubstituted benzene (for example, o, m, p-phenylene group), and most desirably a substituted or unsubstituted o-phenylene group. That is, $Ar^2$ desirably forms a ring with $Ar^1$.

With such $Ar^2$, higher hole injection properties (resulting in high durability) and good film forming properties can be achieved. Additionally, durability and luminous efficiency can be improved with a good balance.

Meanwhile, the substituent that may exist when any one hydrogen atom of $Ar^2$ is substituted is not particularly limited, and the same substituent as the substituent described for "substituted" above can be applied. In an embodiment, $Ar^2$ is unsubstituted.

As described above, $Ar^1$ and $Ar^2$ are desirably bonded to each other to form a ring.

In this way, when $Ar^1$ and $Ar^2$ form a ring, higher hole injection properties can be obtained, durability (especially luminescence lifespan) can be improved, and good film forming properties can be achieved.

When $Ar^1$ and $Ar^2$ form a ring, the ring structure formed by $Ar^1$ and $Ar^2$ is not particularly limited, but it is desirable that $Ar^1$ and $Ar^2$ combine with each other to form a carbazole ring. Furthermore, in an embodiment, $Ar^1—N(Ar^2)(X^1)$ in Chemical Formula (1) has a structure selected from the following groups.

Chemical Formulas (8-1) and (8-2)

(8-1)

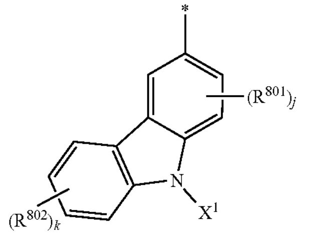

-continued (8-2)

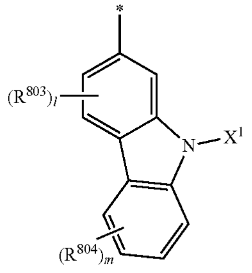

In Chemical Formulas (8-1) and (8-2), $R^{801}$ to $R^{804}$ are each independently a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, j and l are each independently 0, 1, 2, or 3, k and m are each independently 0, 1, 2, 3, or 4, and when any one of j, k, l, and m is 2 or more, each $R^{801}$, each $R^{802}$, each $R^{803}$, or each $R^{804}$ may be the same or different, $X^1$ is the same as defined in Chemical Formula (1), and * is bonded to $L^1$.

The alkyl group as $R^{801}$ to $R^{804}$ may be either a linear or branched alkyl group, for example a linear alkyl group having 1 to 20 carbon atoms or a branched alkyl group having 3 to 20 carbon atoms. For example, the alkyl group may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, a nonadecyl group, an icosyl group, and the like.

The cycloalkyl group as $R^{801}$ to $R^{804}$ may be desirably a cycloalkyl group having 3 to 16 carbon atoms. Specifically, it may include a cyclopropyl group, a cyclobutyl group, a cyclopentyl group, and a cyclohexyl group.

The alkoxy group as $R^{801}$ to $R^{804}$ may be either a linear or branched alkoxy group, but desirably a linear alkoxy group having 1 to 20 carbon atoms or a branched chain alkoxy group having 3 to 20 carbon atoms. For example, the alkoxy group may be, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The cycloalkoxy group as $R^{801}$ to $R^{804}$ may be desirably a cycloalkoxy group having 3 to 16 carbon atoms. For example, it may include a cyclopropoxy group, a cyclobutoxy group, a cyclopentoxy group, a cyclohexoxy group, and the like.

The aryl group as $R^{801}$ to $R^{804}$ may be desirably an aryl group having 6 to 30 carbon atoms. For example, it may include a phenyl group, a naphthyl group, a biphenyl group, a fluorenyl group, an anthryl group, a pyrenyl group, an azulenyl group, an acenaphthylenyl group, a terphenyl group, a phenanthryl group, and the like.

Examples of the halogen atom for $R^{801}$ to $R^{804}$ may include a fluorine atom, a chlorine atom, a bromine atom, and an iodine atom.

In addition, in Chemical Formulas (8-1) and (8-2), j, k, l, or m being 0 means that $R^{801}$, $R^{802}$, $R^{803}$, or $R^{804}$ corresponding to them does not exist. That is, the ring-member atom to which the substituent $R^{801}$, $R^{802}$, $R^{803}$, or $R^{804}$ may be bonded is unsubstituted, which indicates that a hydrogen atom is bonded to the ring-member atom.

The j, k, l, and m may each independently desirably be 0, 1, or 2, more desirably 0 or 1, and particularly desirably 0.

In addition, from the viewpoint of improving durability and film forming properties, in Chemical Formula (1), it is desirable that $Ar^1$ forms a ring with $Ar^2$, and $-L^1-Ar^1-N(Ar^2)(X^1)$ may be any one of the groups represented by Chemical Formulas (9-1) to (9-3):

Chemical Formulas (9-1) to (9-3)

(9-1)

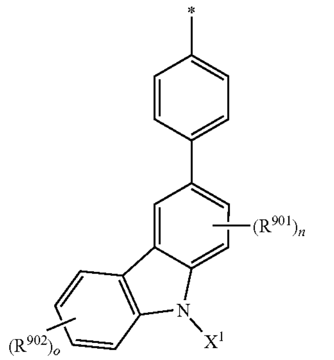

(9-2)

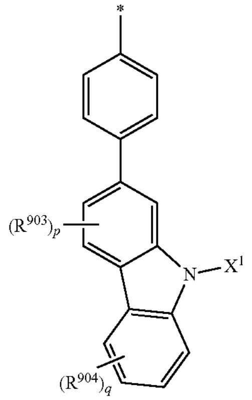

-continued (9-3)

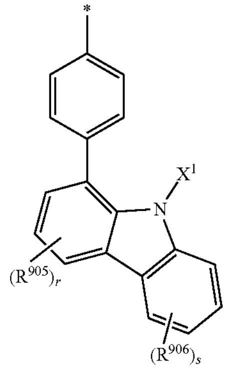

In Chemical Formulas (9-1) to (9-3), $R^{901}$ to $R^{906}$ are each independently a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, n, p, and r are each independently 0, 1, 2, or 3, o, q, and s are each independently 0, 1, 2, 3, or 4, when any one of n, o, p, q, r, and s is 2 or more, each $R^{901}$, each $R^{902}$, each $R^{903}$, each $R^{904}$, each $R^{905}$, or each $R^{906}$ may be the same or different, $X^1$ is the same as defined in Chemical Formula (1), and

* is bonded to the nitrogen atom.

Each substituent as $R^{901}$ to $R^{906}$ may be the same as the example given for $R^{801}$ to $R^{804}$ in Chemical Formulas (8-1) and (8-2).

In Chemical Formulas (9-1) to (9-3), n, o, p, q, r, or s being 0 means that $R^{901}$, $R^{902}$, $R^{903}$, $R^{904}$, $R^{905}$, or $R^{906}$ corresponding to them does not exist. That is, the ring-member atom to which the substituent $R^{901}$, $R^{902}$, $R^{903}$, $R^{904}$, $R^{905}$, or $R^{906}$ may be bonded is unsubstituted, which indicates that a hydrogen atom is bonded to the ring-member atom.

The n, o, p, q, r, and s may each independently desirably be 0, 1, or 2, more desirably 0 or 1, and particularly desirably 0.

In Chemical Formula (1), $R^{11}$ to $R^{14}$ and $R^{21}$ to $R^{24}$ are each independently a hydrogen atom, a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, wherein $R^{11}$ and $R^{21}$ may be bonded to each other to form a ring.

Herein, $R^{11}$ to $R^{14}$ and $R^{21}$ to $R^{24}$ may be the same or different, respectively.

The alkyl group as $R^{11}$ to $R^{14}$ and $R^{21}$ to $R^{24}$ may be either a linear or branched alkyl group, for example a linear alkyl group having 1 to 20 carbon atoms or a branched alkyl group having 3 to 20 carbon atoms. For example, the alkyl group may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, a nonadecyl group, an icosyl group, and the like.

The cycloalkyl group as $R^{11}$ to $R^{14}$ and $R^{21}$ to $R^{24}$ may be desirably a cycloalkyl group having 3 to 16 carbon atoms. Specifically, it may include a cyclopropyl group, a cyclobutyl group, a cyclopentyl group, and a cyclohexyl group.

The alkoxy group as $R^{11}$ to $R^{14}$ and $R^{21}$ to $R^{24}$ may be either a linear or branched alkoxy group, but desirably a linear alkoxy group having 1 to 20 carbon atoms or a branched chain alkoxy group having 3 to 20 carbon atoms. For example, the alkoxy group may be, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The cycloalkoxy group as $R^{11}$ to $R^{14}$ and $R^{21}$ to $R^{24}$ may be desirably a cycloalkoxy group having 3 to 16 carbon atoms. For example, it may include a cyclopropyloxy group, a cyclobutoxy group, a cyclopentoxy group, a cyclohexoxy group, and the like.

The aryl group as $R^{11}$ to $R^{14}$ and $R^{21}$ to $R^{24}$ may be desirably an aryl group having 6 to 30 carbon atoms. The aryl group may include, for example, a phenyl group, a naphthyl group, a biphenyl group, a fluorenyl group, an anthryl group, a pyrenyl group, an azulenyl group, an acenaphthylenyl group, a terphenyl group, and a phenanthryl group.

Examples of the halogen atom for $R^{11}$ to $R^{14}$ and $R^{21}$ to $R^{24}$ may include a fluorine atom, a chlorine atom, a bromine atom, and an iodine atom.

In addition, $R^{11}$ and $R^{21}$ may be bonded to each other to form a ring. At this time, the ring structure formed by $R^{11}$ and $R^{21}$ is not particularly limited, but it is desirable that $R^{11}$ and $R^{21}$ may be bonded to each other to form a carbazole ring. That is, as an embodiment, in Chemical Formula (1), Structural Unit X has the following structure (Structural Unit X-1).

Structural Unit X-1

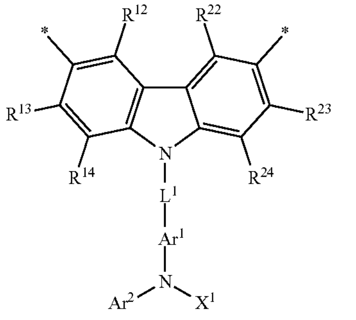

In Structural Unit X-1, $R^{12}$ to $R^{14}$ and $R^{22}$ to $R^{24}$, $L^1$, $Ar^1$, $Ar^2$, and $X^1$ are each the same as defined in Chemical Formula (1), * is bonded to an adjacent atom forming the main backbone of the polymer compound (i.e., bonded to $Y^1$ or an adjacent structural unit).

Among these, from the viewpoint of obtaining higher durability (especially luminescence lifespan) or excellent film forming properties, $R^{11}$ and $R^{21}$ are each independently a hydrogen atom or a linear or branched alkyl group having 1 to 5 carbon atoms, or are bonded to each other to form a ring; and it is desirable that $R^{12}$ to $R^{14}$ and $R^{22}$ to $R^{24}$ are each independently a hydrogen atom or a linear or branched alkyl group having 1 to 5 carbon atoms. In addition, $R^{11}$ and $R^{21}$ are each independently a hydrogen atom or a linear or branched alkyl group having 1 to 3 carbon atoms, or are bonded to each other to form a ring; and it is desirable that $R^{12}$ to $R^{14}$ and $R^{22}$ to $R^{24}$ are each independently a hydrogen atom or a linear or branched alkyl group having 1 to 3 carbon atoms. Additionally, $R^{11}$ and $R^{21}$ are both hydrogen atoms or are bonded to each other to form a ring; and it is particularly desirable that $R^{12}$ to $R^{14}$ and $R^{22}$ to $R^{24}$ are all hydrogen atoms. Moreover, it is most desirable that $R^{11}$ to $R^{14}$ and $R^{21}$ to $R^{24}$ are all hydrogen atoms (unsubstituted).

From the above, Structural Unit (A) according to an embodiment is desirably selected from the following groups (Structural Units (A-1a) to (A-1d).

Structural Unit (A-1)

(A-1a)

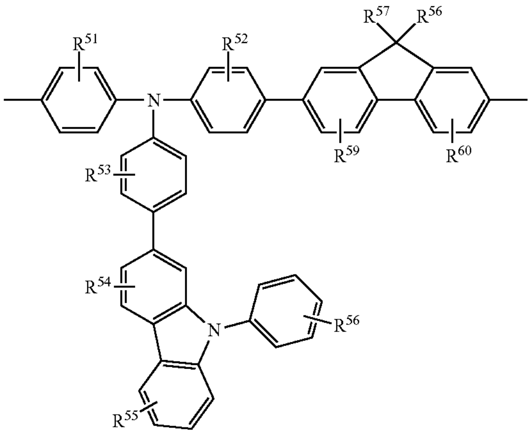

(A-1b)

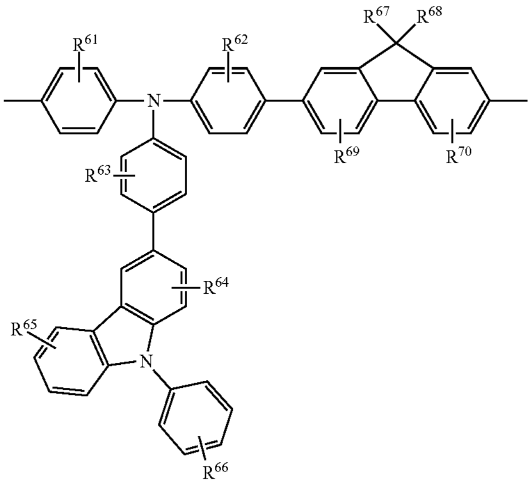

-continued (A-1c)

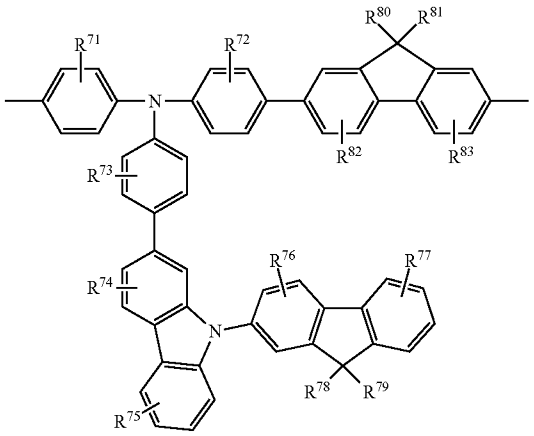

(A-1d)

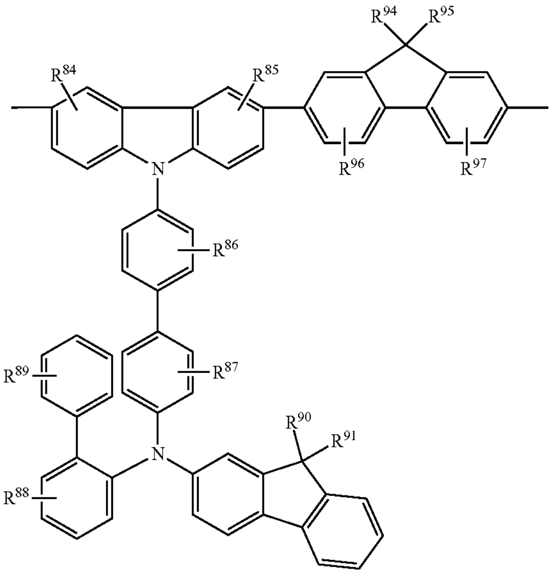

In Structural Unit (A-1), $R^{57}$, $R^{58}$, $R^{67}$, $R^{68}$, $R^{78}$, $R^{79}$, $R^{94}$, and $R^{95}$ each independently represent an alkyl group having 1 to 14 carbon atoms substituted with a carboxyl group or an alkyl group having 1 to 14 carbon atoms substituted with a group having a carboxyl group (Substituent (a)), and $R^{51}$ to $R^{56}$, $R^{59}$ to $R^{66}$, $R^{69}$ to $R^{77}$, $R^{80}$ to $R^{93}$, $R^{96}$, and $R^{97}$ each independently represent a hydrogen atom or an alkyl group having 1 to 14 carbon atoms.

Structural Unit (B)

The polymer compound according to an embodiment further includes Structural Unit (B) represented by Chemical Formula (2) in addition to Structural Unit (A) represented by Chemical Formula (1):

Chemical Formula (2)

(2)

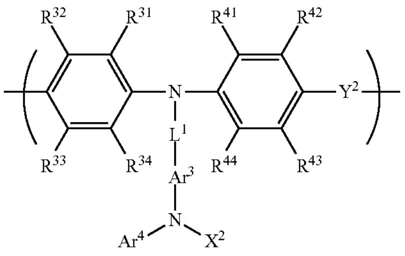

In Chemical Formula (2), $R^{31}$ to $R^{34}$ and $R^{41}$ to $R^{44}$ are each independently a hydrogen atom, a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, wherein $R^{31}$ and $R^{41}$ may be linked to each other to form a ring, $L^2$ is a substituted or unsubstituted aromatic hydrocarbon group having 6 to 25 ring-member atoms, or a substituted or unsubstituted aromatic heterocyclic group having 5 to 25 ring-member atoms, $Ar^3$ is a substituted or unsubstituted aromatic hydrocarbon group having 6 to 25 ring-member atoms, $Ar^4$ is a substituted or unsubstituted aromatic hydrocarbon group having 6 to 25 ring-member atoms, or a substituted or unsubstituted aromatic heterocyclic group having 5 to 25 ring-member atoms, or may be linked to $Ar^3$ to form a ring, $X^2$ is an aromatic hydrocarbon group having 6 to 25 ring-member atoms which may be substituted with an alkyl group having 1 to 14 carbon atoms, $Y^2$ is an aromatic hydrocarbon group having 6 to 25 ring-member atoms which may be substituted with an alkyl group having 1 to 14 carbon atoms, and $R^{31}$ to $R^{34}$, $R^{41}$ to $R^{44}$, $L^2$, $Ar^3$, and $Ar^4$ do not have an alkyl group having 1 to 14 carbon atoms substituted with a carboxyl group and an alkyl group having 1 to 14 carbon atoms substituted with a group having a carboxyl group.

In this specification, Structural Unit (B) expressed by Chemical Formula (2) is also sometimes referred to as the "Structural Unit (B)" or "Structural Unit (B) according to an embodiment."

In addition, the structural unit having the following structure among the "Structural Unit (B) represented by Chemical Formula (2)" is also referred to as "Structural Unit X'" or "Structural Unit X' according to an embodiment."

Structural Unit X'

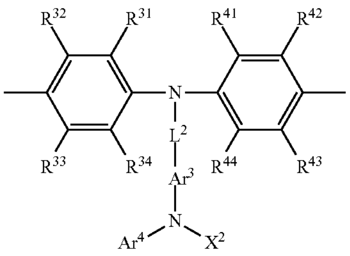

Similarly, the structural unit "—$Y^2$—" in the "Structural Unit (B) represented by Chemical Formula (2)" is also referred to as "Structural Unit Y'" or "Structural Unit Y' according to an embodiment."

In addition to Structural Unit (A) represented by Chemical Formula (1), the polymer compound according to an embodiment further includes Structural Unit (B) represented by Chemical Formula (2), which has excellent hole injection properties into quantum dots and can further improve the durability (luminescence lifespan) of the electroluminescent device. Additionally, high current efficiency and low driving voltage can be achieved. When the polymer compound according to an embodiment further includes Structural Unit (B), only one type of Structural Unit (B) may be included, or two or more types may be included. On the other hand, the plurality of Structural Units (B) may exist in a block form, a random form, an alternating form, or a periodic form.

Chemical Formula (2)

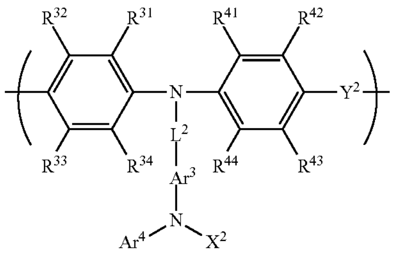

(2)

As described above, in an embodiment, the polymer compound includes Structural Unit (B) represented by Chemical Formula (2). That is, Structural Unit X' in Chemical Formula (2) (structural unit on the left side of Chemical Formula (2); that is, the structural unit consisting of a nitrogen atom between two phenylene groups) constitutes a polymer compound according to an embodiment. Likewise, Structural Unit Y' in Chemical Formula (2) (the structural unit on the right side of Chemical Formula (2); that is, the structural unit represented by "$Y^2$") constitutes a polymer compound according to an embodiment. That is, the polymer compound according to an embodiment may be a copolymer that further includes Structural Unit X' and Structural Unit Y' in addition to Structural Unit X and Structural Unit Y.

In Chemical Formula (2), $X^2$ and $Y^2$ do not have an alkyl group having 1 to 14 carbon atoms substituted with a carboxyl group and an alkyl group having 1 to 14 carbon atoms substituted with a group having a carboxyl group (Substituent (a)), and thus are different from $X^1$ and $Y^1$. In addition, in Chemical Formula (2), the definitions of $L^2$, $Ar^3$, $Ar^4$, $R^{31}$ to $R^{34}$ and $R^{41}$ to $R^{44}$ are the same as the definitions of $L^1$, $Ar^1$, $Ar^2$, $R^{11}$ to $R^{14}$ and $R^{21}$ to $R^{24}$ in Chemical Formula (1) except that each does not have Substituent (a) (or is not Substituent (a)). Accordingly, for $L^2$, $Ar^3$, $Ar^4$, $R^{31}$ to $R^{34}$, and $R^{41}$ to $R^{44}$, the term "substituted" refers to a form substituted with a substituent other than Substituent (a), unless otherwise specified.

In Chemical Formula (2), $X^2$ represents an aromatic hydrocarbon group having 6 to 25 ring-member atoms which may be substituted with an alkyl group having 1 to 14 carbon atoms.

Herein, the aromatic hydrocarbon group having 6 to 25 ring-member atoms may specifically include a monovalent group derived from aromatic hydrocarbons such as benzene, naphthalene, anthracene, pyrene, pentalene, indene, azulene, heptalene, acenaphthene, phenalene, phenanthrene, biphenyl, terphenyl, quaterphenyl, fluorene, and 9,9'-spirobi[fluorene].

Among them, the aromatic hydrocarbon group as $X^2$ is desirably a monovalent group derived from a compound selected from benzene, biphenyl, terphenyl, and fluorene, more desirably a monovalent group derived from a compound selected from benzene, biphenyl and fluorene, particularly desirably a monovalent group (phenyl group or fluorenyl group) derived from benzene or fluorene.

Moreover, from the viewpoint of improving durability, in Chemical Formula (2), it is desirable that $X^2$ is any one of the groups represented by Chemical Formulas (4'-1) to (4'-4).

Chemical Formulas (4'-1) to (4'-4)

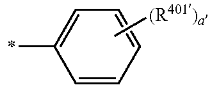

(4'-1)

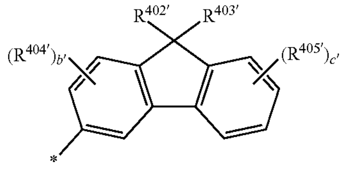

(4'-2)

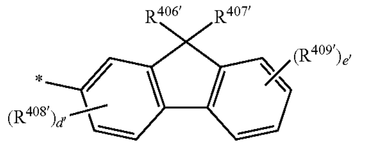

(4'-3)

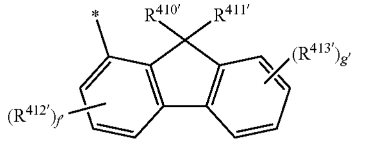

(4'-4)

In Chemical Formulas (4'-1) to (4'-4), $R^{401'}$ to $R^{413'}$ are each independently an alkyl group having 1 to 14 carbon atoms substituted or unsubstituted with a substituent other than a carboxyl group (—COOH), a' is 0, 1, 2, 3, 4, or 5, b', d', and f' are each independently 0, 1, 2 or 3, c', e', and g' are each independently 0, 1, 2, 3, or 4, and when any of a', b', c', d', e', f', and g' is 2 or more, each $R^{401'}$, each $R^{404'}$, each $R^{405'}$, each $R^{408'}$, each $R^{409'}$, each $R^{412'}$, or each $R^{413'}$ may be the same or different, and * is bonded to a nitrogen atom (the nitrogen atom bonded to $Ar^2$).

In addition, in Chemical Formulas (4'-1) to (4'-4), $R^{402'}$ and $R^{403'}$, $R^{406'}$ and $R^{407'}$, $R^{410'}$ and $R^{411'}$ may be the same or different, respectively. Desirably, $R^{402'}$ and $R^{403'}$, $R^{406'}$ and $R^{407'}$, $R^{410'}$ and $R^{411'}$ may be the same as each other.

In Chemical Formulas (4-1) to (4-4), a', b', c', d', e', f', or g' being 0 means that $R^{401'}$, $R^{404'}$, $R^{405'}$, $R^{408'}$, $R^{409'}$, $R^{412'}$, or $R^{413'}$ corresponding to them does not exist. That is, the ring-member atom to which the substituent $R^{401'}$, $R^{404'}$, $R^{405'}$, $R^{408'}$, $R^{409'}$, $R^{412'}$ or $R^{413'}$ may be bonded is unsubstituted, which indicates that a hydrogen atom is bonded to the ring-member atom.

The a' may be desirably 0, 1, or 2, more desirably 0 or 1, and particularly desirably 1. In addition, when a' is 1, the substitution position of $R^{401'}$ is desirably the para position (p position or 4th position) with respect to the bond (*) to the nitrogen atom (the nitrogen atom bonded to $Ar^2$). The b', c', d', e', f' and g' may each independently desirably be 0, 1, or 2, more desirably 0 or 1, and particularly desirably 0.

The alkyl group having 1 to 14 carbon atoms as $R^{401'}$ to $R^{413'}$ is not particularly limited, but is a linear or branched alkyl group, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, and the like.

Herein, the alkyl group as $R^{401'}$ to $R^{413'}$ may have desirably 1 to 12 carbon atoms from the viewpoint of improving durability. In particular, it is desirable that $R^{401'}$ to $R^{413'}$ are each independently an alkyl group having a carbon number in the above range.

Additionally, the alkyl groups as $R^{401'}$ to $R^{413'}$ may be desirably linear from the viewpoint of improving durability.

In Chemical Formula (2), from the viewpoint of improving durability (especially luminescence lifespan), it is desirable that $X^2$ is any one of the groups represented by Chemical Formulas (4'-1) to (4'-3), and it is more desirable that $X^2$ is represented by Chemical Formula (4'-1) or (4'-3).

In Chemical Formula (2), $Y^2$ is an aromatic hydrocarbon group having 6 to 25 ring-member atoms which may be substituted with an alkyl group having 1 to 14 carbon atoms.

Herein, the aromatic hydrocarbon group having 6 to 25 ring-member atoms may specifically include a divalent group derived from aromatic hydrocarbons such as benzene, naphthalene, anthracene, pyrene, pentalene, indene, azulene, heptalene, acenaphthene, phenalene, phenanthrene, biphenyl, terphenyl, quaterphenyl, fluorene, and 9,9'-spirobi[fluorene].

Among them, the aromatic hydrocarbon group as $Y^2$ is desirably a divalent group derived from a compound selected from benzene, biphenyl, terphenyl, and fluorene, more desirably a divalent group derived from biphenyl or fluorene, and particularly desirably a divalent group (fluorenylene group) derived from fluorene.

Furthermore, from the viewpoint of improving durability, in Chemical Formula (2), $Y^2$ is desirably a group represented by Chemical Formula (6'-1).

Chemical Formula (6'-1)

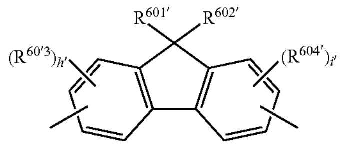

(6'-1)

In Chemical Formula (6'-1), $R^{601'}$ to $R^{604'}$ are each independently an alkyl group having 1 to 14 carbon atoms substituted or unsubstituted with a substituent other than a carboxyl group (—COOH), h' and i' are each independently 0, 1, 2, or 3, and when any of h' and i' is 2 or more, each $R^{603'}$ or each $R^{604'}$ may be the same or different.

In addition, in Chemical Formula (6'-1), $R^{601'}$ and $R^{602'}$ may be the same or different. Desirably, $R^{601'}$ and $R^{602'}$ may be the same as each other.

In Chemical Formula (6'-1), h' or i' being 0 means that $R^{603'}$ or $R^{604'}$ corresponding to them does not exist. That is, the ring-member atom to which the substituent $R^{603'}$ or $R^{604'}$ may be bonded is unsubstituted, which indicates that a hydrogen atom is bonded to the ring-member atom.

The h' and i' may each independently desirably be 0, 1, or 2, more desirably 0 or 1, and particularly desirably 0.

The alkyl group having 1 to 14 carbon atoms as $R^{601'}$ to $R^{604'}$ is not particularly limited, but is a linear or branched alkyl group, for example, a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, and the like.

Herein, from the viewpoint of improving durability, the alkyl group as $R^{601'}$ to $R^{604'}$ may have desirably 1 to 12 carbon atoms, more desirably 1 to 10 carbon atoms, and particularly desirably 2 to 6 carbon atoms. In particular, it is desirable that $R^{601'}$ and $R^{602'}$ are each independently an alkyl group having a carbon number in the above range.

Additionally, the alkyl groups as $R^{601'}$ to $R^{604'}$ may be desirably linear from the viewpoint of improving durability.

In addition, in Chemical Formula (2), the definitions of $L^2$, $Ar^3$, $Ar^4$, $R^{31}$ to $R^{34}$ and $R^{41}$ to $R^{44}$ are the same as the definitions of $L^1$, $Ar^1$, $Ar^2$, $R^{11}$ to $R^{14}$ and $R^{21}$ to $R^{24}$ in Chemical Formula (1). Additionally, the desirable embodiments are the same for each. Hereinafter, it will be described in detail.

In Chemical Formula (2), $L^2$ is a substituted or unsubstituted aromatic hydrocarbon group having 6 to 25 ring-member atoms; or a substituted or unsubstituted aromatic heterocyclic group having 5 to 25 ring-member atoms.

Herein, the aromatic hydrocarbon group may be specifically a divalent group derived from aromatic hydrocarbons such as benzene (phenylene group), naphthalene, anthracene, pyrene, pentalene, indene, azulene, heptalene, acenaphthene, phenalene, phenanthrene, biphenyl, terphenyl, quaterphenyl, fluorene, and 9,9'-spirobi[fluorene]. Additionally, the aromatic heterocyclic group may include a divalent group derived from a heterocyclic aromatic compound such as acridine, phenazine, benzoquinoline, benzoisoquinoline, phenanthridine, phenanthroline, anthraquinone, fluorenone, dibenzofuran, dibenzothiophene, carbazole, imidazophenanthridine, benzimidazophenanthridine, azadibenzofuran, azacarbazole, azadibenzothiophene, diazadibenzofuran, diazacarbazole, diazadibenzothiophene, xanthone, oxanthrone, pyridine, quinoline, and anthraquinoline.

Among these, $L^2$ is desirably a substituted or unsubstituted divalent group derived from a compound selected from benzene, biphenyl, terphenyl, quaterphenyl, and fluorene. $L^2$ is more desirably a substituted or unsubstituted divalent group derived from benzene or biphenyl (a substituted or unsubstituted phenylene group or biphenylene group).

Additionally, in Chemical Formula (2), $L^2$ is desirably one of the groups represented by Chemical Formulas (7'-1) to (7'-24):

Chemical Formulas (7'-1) to (7'-24)

(7'-1)

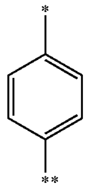

(7'-2)

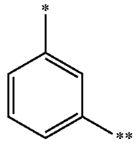

(7'-3)

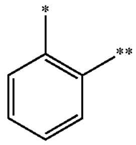

(7'-4)

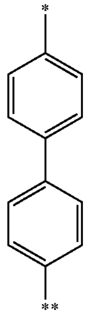

(7'-5)

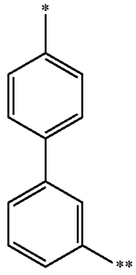

-continued (7'-6)

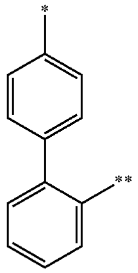

(7'-7)

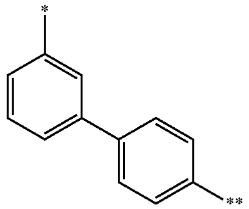

(7'-8)

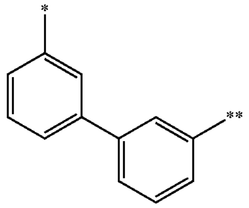

(7'-9)

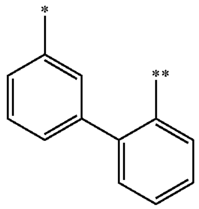

(7'-10)

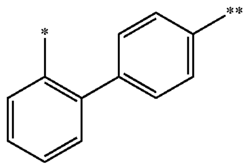

(7'-11)

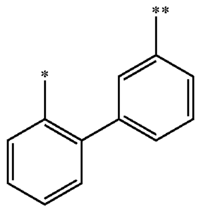

(7'-12)

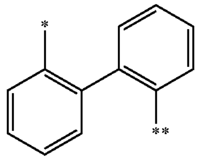

-continued
(7'-13)
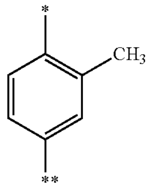
(7'-14)
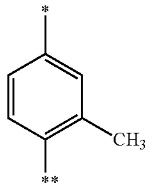
(7'-15)
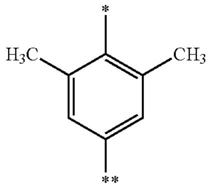
(7'-16)
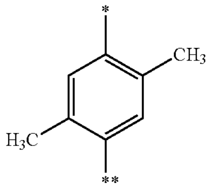
(7'-17)
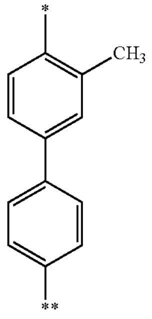
(7'-18)
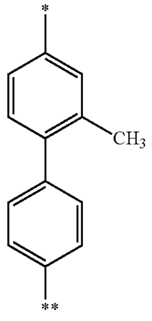
-continued
(7'-19)
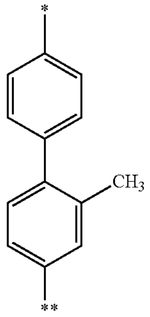
(7'-20)
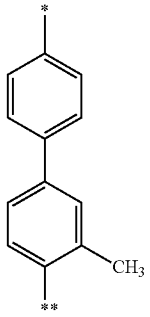
(7'-21)
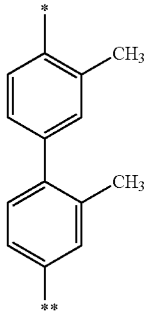
(7'-22)
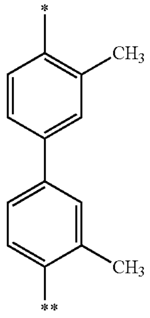
(7'-23)
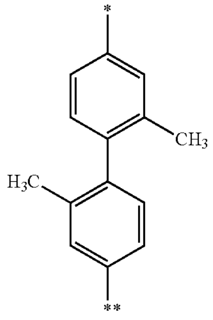

-continued (7'-24)

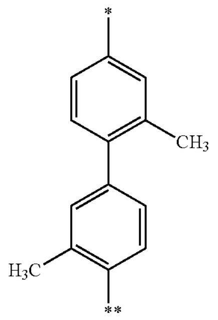

In Chemical Formulas (7'-1) to (7'-24), * is bonded to a nitrogen atom, and ** is bonded to $Ar^3$.

In addition, $L^2$ may be desirably any one of the groups represented by Chemical Formulas (7'-1) to (7'-3) and Chemical Formulas (7'-13) to (7'-16) (i.e., substituted or unsubstituted phenylene group), more desirably any one of the groups represented by Chemical Formula (7'-1) and Chemical Formulas (7'-13) to (7'-16) (i.e., a substituted or unsubstituted p-phenylene group), and particularly desirably a group represented by formula (7'-1) (that is, an unsubstituted p-phenylene group). With such $L^1$, higher hole injection properties (resulting in high durability) and good film forming properties can be achieved.

In Chemical Formula (2), $Ar^3$ represents a substituted or unsubstituted aromatic hydrocarbon group having 6 to 25 ring-member atoms. At this time, $Ar^3$ may form a ring with $Ar^4$. On the other hand, when $Ar^3$ forms a ring with $Ar^4$, $Ar^3$ is a trivalent group. When $Ar^3$ does not form a ring with $Ar^4$, $Ar^3$ is a divalent group.

Herein, the aromatic hydrocarbon group as $Ar^3$ is not particularly limited. When $Ar^3$ does not form a ring with $Ar^4$, specific examples of $Ar^3$ include the same divalent groups derived from aromatic hydrocarbons having 6 to 25 ring-member atoms described for $L^2$ above. In addition, when $Ar^3$ forms a ring with $Ar^4$, the divalent group derived from an aromatic hydrocarbon having 6 to 25 ring-member atoms described for $L^2$ above can be converted into a trivalent group.

Among these, $Ar^3$ is desirably a substituted or unsubstituted divalent or trivalent group derived from a compound selected from benzene, biphenyl, and fluorene. $Ar^3$ is more desirably a substituted or unsubstituted divalent or trivalent group derived from benzene or biphenyl. $Ar^3$ is particularly desirably a divalent group (e.g., o, m, p-phenylene group) or trivalent group (e.g., 1,3,4-phenylylene group) derived from substituted or unsubstituted benzene. Additionally, $Ar^3$ is more desirably a substituted or unsubstituted p-phenylene group or 1,3,4-phenylylene group, and most desirably a substituted or unsubstituted 1,3,4-phenylylene group. That is, it is desirable that $Ar^3$ forms a ring with $Ar^4$.

With such $Ar^3$, higher hole injection properties (resulting in high durability) and good film forming properties can be achieved. Additionally, durability and luminous efficiency can be improved with a good balance.

Meanwhile, the substituent that may exist when any one hydrogen atom of $Ar^3$ is substituted is not particularly limited, and the same substituent as the substituent described for "substituted" above can be applied. In an embodiment, $Ar^3$ is unsubstituted.

In Chemical Formula (2), $Ar^4$ is a substituted or unsubstituted aromatic hydrocarbon group having 6 to 25 ring-member atoms; or a substituted or unsubstituted aromatic heterocyclic group having 5 to 25 ring-member atoms. At this time, $Ar^4$ may form a ring with $Ar^3$. On the other hand, when $Ar^4$ forms a ring with $Ar^3$, $Ar^4$ is a divalent group. When $Ar^4$ does not form a ring with $Ar^3$, $Ar^4$ is a monovalent group.

Herein, the aromatic hydrocarbon group and aromatic heterocyclic group as $Ar^4$ are not particularly limited. When $Ar^4$ does not form a ring with $Ar^3$, a specific example of $Ar^4$ can be exemplified by converting a divalent group derived from an aromatic hydrocarbon with 6 to 25 ring-member atoms described for $L^2$ into a monovalent group. Similarly, in the above case, the aromatic heterocyclic group as $Ar^4$ can be exemplified by converting a divalent group derived from a heterocyclic aromatic compound having 5 to 25 ring-member atoms described for $L^2$ into a monovalent group. In addition, when $Ar^4$ forms a ring with $Ar^3$, the same divalent group derived from an aromatic hydrocarbon having 6 to 25 ring-member atoms described for $L^2$ can be used. Similarly, in the above case, the aromatic heterocyclic group as $Ar^4$ may be exemplified as the same divalent group derived from a heterocyclic aromatic compound having 5 to 25 ring-member atoms described for $L^2$.

Among these, $Ar^4$ is desirably a substituted or unsubstituted monovalent or divalent group derived from a compound selected from benzene, biphenyl, and fluorene, more desirably a substituted or unsubstituted monovalent group or divalent group derived from benzene or biphenyl, particularly desirably a monovalent or divalent group derived from substituted or unsubstituted benzene (for example, o, m, p-phenylene group), and most desirably a substituted or unsubstituted o-phenylene group. That is, $Ar^4$ desirably forms a ring with $Ar^3$.

With such $Ar^4$, higher hole injection properties (resulting in high durability) and good film forming properties can be achieved. Additionally, durability and luminous efficiency can be improved with a good balance.

Meanwhile, the substituent that may exist when any one hydrogen atom of $Ar^4$ is substituted is not particularly limited, and the same substituent as the substituent described for "substituted" above can be applied. In an embodiment, $Ar^4$ is unsubstituted.

As described above, $Ar^3$ and $Ar^4$ are desirably bonded to each other to form a ring.

In this way, when $Ar^3$ and $Ar^4$ form a ring, higher hole injection properties can be obtained, durability (especially luminescence lifespan) can be improved, and good film forming properties can be achieved.

When $Ar^3$ and $Ar^4$ form a ring, the ring structure formed by $Ar^3$ and $Ar^4$ is not particularly limited, but it is desirable that $Ar^3$ and $Ar^4$ combine with each other to form a carbazole ring. Furthermore, in an embodiment, $—Ar^3—N(Ar^4)(X^2)$ in Chemical Formula (2) has a structure selected from the following groups.

Chemical Formulas (8'-1) and (8'-2)

(8'-1)

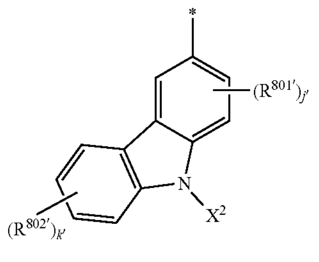

-continued (8'-2)

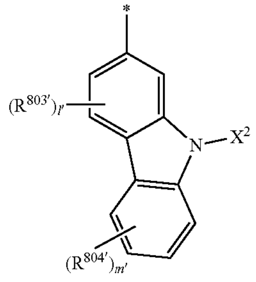

In Chemical Formulas (8'-1) and (8'-2), $R^{801'}$ to $R^{804'}$ are each independently a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, j' and l' are each independently 0, 1, 2, or 3, k' and m' are each independently 0, 1, 2, 3, or 4, and when any one of j', k', l', and m' is 2 or more, each $R^{801'}$, each $R^{802'}$, each $R^{803'}$ or each $R^{804'}$ may be the same or different, $X^2$ is the same as defined in Chemical Formula (2), and * is bonded to $L^2$.

The alkyl group as $R^{801'}$ to $R^{804'}$ may be either a linear or branched alkyl group, for example a linear alkyl group having 1 to 20 carbon atoms or a branched alkyl group having 3 to 20 carbon atoms. For example, the alkyl group may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, a nonadecyl group, an icosyl group, and the like.

The cycloalkyl group as $R^{801'}$ to $R^{804'}$ may be desirably a cycloalkyl group having 3 to 16 carbon atoms. Specifically, it may include a cyclopropyl group, a cyclobutyl group, a cyclopentyl group, and a cyclohexyl group.

The alkoxy group as $R^{801'}$ to $R^{804'}$ may be either a linear or branched alkoxy group, but desirably a linear alkoxy group having 1 to 20 carbon atoms or a branched chain alkoxy group having 3 to 20 carbon atoms. For example, the alkoxy group may be, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The cycloalkoxy group as $R^{801'}$ to $R^{804'}$ may be desirably a cycloalkoxy group having 3 to 16 carbon atoms. For example, it may include a cyclopropoxy group, a cyclobutoxy group, a cyclopentoxy group, a cyclohexoxy group, and the like.

The aryl group as $R^{801'}$ to $R^{804'}$ may be desirably an aryl group having 6 to 30 carbon atoms. The aryl group may include, for example, a phenyl group, a naphthyl group, a biphenyl group, a fluorenyl group, an anthryl group, a pyrenyl group, an azulenyl group, an acenaphthylenyl group, a terphenyl group, and a phenanthryl group.

Examples of the halogen atom for $R^{801'}$ to $R^{804'}$ may include a fluorine atom, a chlorine atom, a bromine atom, and an iodine atom.

In Chemical Formulas (8'-1) to (8'-2), j', k', l', or m' being 0 means that $R^{801'}$, $R^{802'}$, $R^{803'}$, or $R^{804'}$ corresponding to them does not exist. That is, the ring-member atom to which the substituent $R^{801'}$, $R^{802'}$, $R^{803'}$, or $R^{804'}$ may be bonded is unsubstituted, which indicates that a hydrogen atom is bonded to the ring-member atom.

The j', k', l', and m' may each independently desirably be 0, 1, or 2, more desirably 0 or 1, and particularly desirably 0.

In addition, from the viewpoint of improving durability and film forming properties, in Chemical Formula (2), it is desirable that $Ar^3$ forms a ring with $Ar^4$, and $-L^2-Ar^3—N(Ar^4)(X^2)$ may be any one of the groups represented by Chemical Formulas (9'-1) to (9'-3):

Chemical Formulas (9'-1) to (9'-3)

(9'-1)

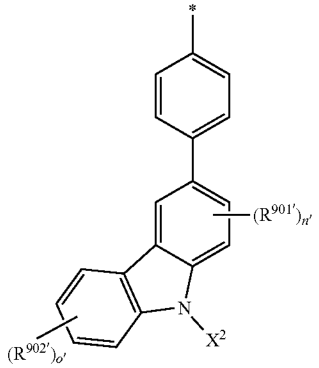

(9'-2)

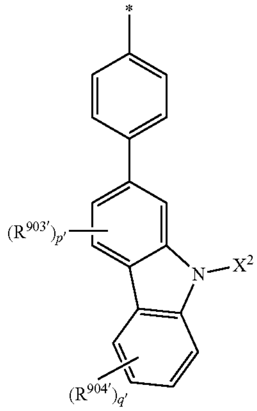

-continued (9'-3)

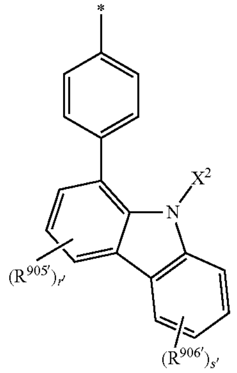

In Chemical Formulas (9'-1) to (9'-3), $R^{901'}$ to $R^{906'}$ are each independently a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, n', p', and r' are each independently 0, 1, 2, or 3, o', q', and s' are each independently 0, 1, 2, 3, or 4, when any one of n', o', p', q', r', and s' is 2 or more, each $R^{901'}$, each $R^{902'}$, each $R^{903'}$, each $R^{904'}$, each $R^{905'}$, or each $R^{906'}$ may be the same or different, $X^2$ is the same as defined in Chemical Formula (2), and

* is bonded to the nitrogen atom.

Each substituent as $R^{901'}$ to $R^{906'}$ may be the same as the example given for $R^{801'}$ to $R^{804'}$ in Chemical Formulas (8-1) and (8-2).

In Chemical Formulas (9'-1) to (9'-3), n', o', p', q', r', or s' being 0 means that $R^{901'}$, $R^{902'}$, $R^{903'}$, $R^{904'}$, $R^{905'}$ or $R^{906'}$ corresponding to them does not exist. That is, the ring-member atom to which the substituent $R^{901'}$, $R^{902'}$, $R^{903'}$, $R^{904'}$, $R^{905'}$, or $R^{906'}$ may be bonded is unsubstituted, which indicates that a hydrogen atom is bonded to the ring-member atom.

The n', o', p', q', r', and s' may each independently desirably be 0, 1, or 2, more desirably 0 or 1, and particularly desirably 0.

In Chemical Formula (2), $R^{31}$ to $R^{34}$ and $R^{41}$ to $R^{44}$ are each independently a hydrogen atom, a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or halogen atom, wherein $R^{31}$ and $R^{41}$ may be bonded to each other to form a ring.

Herein, $R^{31}$ to $R^{34}$ and $R^{41}$ to $R^{44}$ may be the same or different, respectively.

The alkyl group as $R^{31}$ to $R^{34}$ and $R^{41}$ to $R^{44}$ may be either a linear or branched alkyl group, for example a linear alkyl group having 1 to 20 carbon atoms or a branched alkyl group having 3 to 20 carbon atoms. For example, the alkyl group may be a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropylbutyl group, a 1-tert-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, a nonadecyl group, an icosyl group, and the like.

The cycloalkyl group as $R^{31}$ to $R^{34}$ and $R^{41}$ to $R^{44}$ may be desirably a cycloalkyl group having 3 to 16 carbon atoms. Specifically, it may include a cyclopropyl group, a cyclobutyl group, a cyclopentyl group, and a cyclohexyl group.

The alkoxy group as $R^{31}$ to $R^{34}$ and $R^{41}$ to $R^{44}$ may be either a linear or branched alkoxy group, but desirably a linear alkoxy group having 1 to 20 carbon atoms or a branched chain alkoxy group having 3 to 20 carbon atoms. For example, the alkoxy group may be, for example, a methoxy group, an ethoxy group, a propoxy group, an isopropoxy group, a butoxy group, a pentyloxy group, a hexyloxy group, a heptyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a 2-ethylhexyloxy group, a 3-ethylpentyloxy group, and the like.

The cycloalkoxy group as $R^{31}$ to $R^{34}$ and $R^{41}$ to $R^{44}$ may be desirably a cycloalkoxy group having 3 to 16 carbon atoms. For example, it may include a cyclopropyloxy group, a cyclobutoxy group, a cyclopentoxy group, a cyclohexoxy group, and the like.

The aryl group as $R^{31}$ to $R^{34}$ and $R^{41}$ to $R^{44}$ may be desirably an aryl group having 6 to 30 carbon atoms. The aryl group may include, for example, a phenyl group, a naphthyl group, a biphenyl group, a fluorenyl group, an anthryl group, a pyrenyl group, an azulenyl group, an acenaphthylenyl group, a terphenyl group, and a phenanthryl group.

Examples of the halogen atom for $R^{31}$ to $R^{34}$ and $R^{41}$ to $R^{44}$ may include a fluorine atom, a chlorine atom, a bromine atom, and an iodine atom.

In addition, $R^{31}$ and $R^{41}$ may be bonded to each other to form a ring. At this time, the ring structure formed by $R^{31}$ and $R^{41}$ is not particularly limited, but it is desirable that $R^{31}$ and $R^{41}$ may be bonded to each other to form a carbazole ring. That is, as an embodiment, in Chemical Formula (2), Structural Unit X' has the following structure.

Structural Unit X'-1

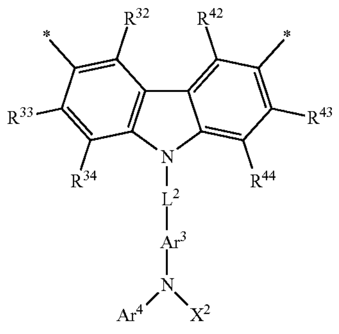

In Structural Unit X'-1, $R^{32}$ to $R^{34}$ and $R^{42}$ to $R^{44}$, $L^2$, $Ar^3$, $Ar^4$, and $X^2$ are each the same as defined in Chemical Formula (2), * is bonded to an adjacent atom forming the main backbone of the polymer compound (i.e., bonded to $Y^2$ or an adjacent structural unit).

Among these, from the viewpoint of obtaining higher durability (especially luminescence lifespan) or excellent film forming properties, $R^{31}$ and $R^{41}$ are each independently a hydrogen atom or a linear or branched alkyl group having 1 to 5 carbon atoms, or are bonded to each other to form a ring; and it is desirable that $R^{32}$ to $R^{34}$ and $R^{42}$ to $R^{44}$ are each independently a hydrogen atom or a linear or branched alkyl group having 1 to 5 carbon atoms. In addition, $R^{31}$ and $R^{41}$ are each independently a hydrogen atom or a linear or branched alkyl group having 1 to 3 carbon atoms, or are bonded to each other to form a ring; and it is desirable that $R^{32}$ to $R^{34}$ and $R^{42}$ to $R^{44}$ are each independently a hydrogen atom or a linear or branched alkyl group having 1 to 3 carbon atoms. Additionally, $R^{31}$ and $R^{41}$ are both hydrogen atoms or are bonded to each other to form a ring; and it is particularly desirable that $R^{32}$ to $R^{34}$ and $R^{42}$ to $R^{44}$ are all hydrogen atoms. Moreover, it is most desirable that $R^{31}$ to $R^{34}$ and $R^{41}$ to $R^{44}$ are all hydrogen atoms (unsubstituted).

It is desirable that Structural Unit (B) represented by Chemical Formula (2) described above has the same structure and substituents other than the moiety (i.e., $X^1$, $Y^1$) including Substituent (a) as Structural Unit (A) represented by Chemical Formula (1). That is, $R^{11}$ to $R^{14}$, $R^{21}$ to $R^{24}$, $L^1$, $Ar^1$, and $Ar^2$ in Chemical Formula (1) are desirably the same as $R^{31}$ to $R^{34}$, $R^{41}$ to $R^{44}$, $L^2$, $Ar^3$, and $Ar^4$ in Chemical Formula (2). In a more desirable embodiment, when $X^1$ includes Substituent (a), $R^{11}$ to $R^{14}$, $R^{21}$ to $R^{24}$, $L^1$, $Ar^1$, $Ar^2$, and $Y^1$ in Chemical Formula (1) are each the same as $R^{31}$ to $R^{34}$, $R^{41}$ to $R^{44}$, $L^2$, $Ar^3$, $Ar^4$, and $Y^2$ in Chemical Formula (2). Moreover, in another desirable embodiment, when $Y^1$ includes Substituent (a), $R^{11}$ to $R^{14}$, $R^{21}$ to $R^{24}$, $L^1$, $Ar^1$, $Ar^2$, and $X^1$ in Chemical Formula (1) are each the same as $R^{31}$ to $R^{34}$, $R^{41}$ to $R^{44}$, $L^2$, $Ar^3$, $Ar^4$, and $X^2$ in in Chemical Formula (2).

From the above, Structural Unit (B) according to an embodiment is desirably selected from the following groups.

Structural Unit (B-1)

(B-1a)

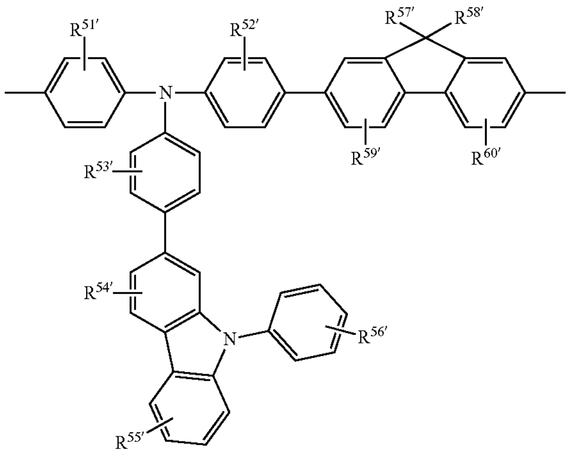

-continued (B-1b)

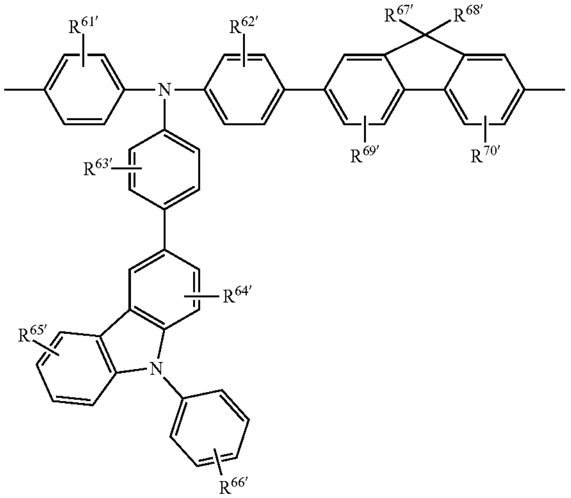

(B-1c)

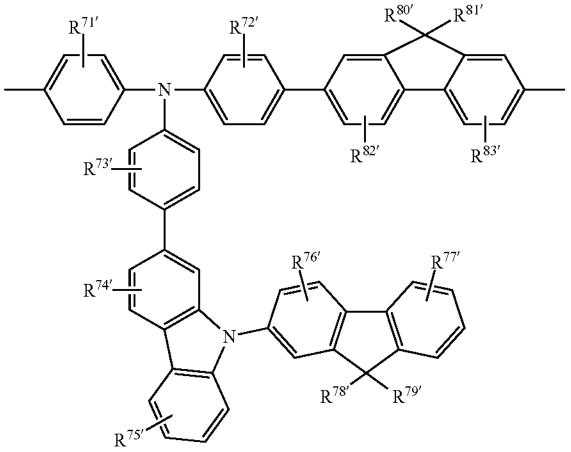

(B-1d)

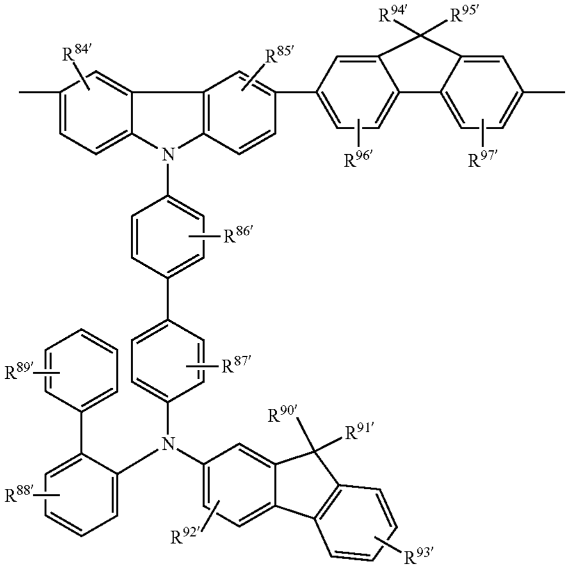

In Structural Unit (B-1), $R^{57'}$, $R^{58'}$, $R^{67'}$, $R^{68'}$, $R^{78'}$, $R^{79'}$, $R^{94'}$, and $R^{95'}$ each independently represent an alkyl group having 1 to 14 carbon atoms, $R^{51'}$ to $R^{56'}$, $R^{59'}$ to $R^{66'}$, $R^{69'}$ to $R^{77'}$, $R^{80'}$ to $R^{93'}$, $R^{96'}$ and $R^{97}$ each independently represent a hydrogen atom or an alkyl group having 1 to 14 carbon atoms.

Other Structural Units

The polymer compound according to an embodiment may further include structural units other than Structural Unit (A) and Structural Unit (B). In the case where other structural units are included, the other structural units are not particularly limited as long as they do not impede the effect of the polymer compound (particularly high hole injection properties). Other structural units include, for example, structural units derived from compounds such as azulene, naphthalene, anthracene, phenanthrene, and pyrene. Meanwhile, hereinafter, such other structural units are also referred to as "Structural Unit (C)."

Composition of Polymer Compound

The composition of Structural Unit (A) to Structural Unit (C) in the polymer compound according to an embodiment is not particularly limited. Considering the durability (luminescence lifespan) and excellent film forming properties of the layers (e.g., hole injection layer, hole transport layer) formed using the resulting polymer compound, Structural Unit (A) is desirably greater than or equal to about 5 mole percent (mol %) and less than about 100 mol %, more desirably greater than or equal to about 10 mol % and less than or equal to about 80 mol %, particularly desirably greater than or equal to about 10 mol % and less than or equal to about 70 mol %, and most desirably greater than or equal to about 30 mol % and less than or equal to about 70 mol % based on total structural units constituting the polymer compound. That is, in a desirable embodiment, Structural Unit (A) is included in a ratio of greater than or equal to about 30 mol % and less than or equal to about 70 mol % based on the total structural units. On the other hand, when a polymer compound includes two or more types of Structural Units (A), a content of Structural Units (A) means a total amount of Structural Units (A).

That is, in a desirable embodiment, Structural Unit (A) is included in a ratio of less than about 100 mol % based on the total structural units. At this time, it is desirable that Structural Unit (B) is further included. Considering the durability (luminescence lifespan) and excellent film forming properties of the layers (e.g., hole injection layer, hole transport layer) formed using the obtained polymer compound, a content of Structural Unit (B) may be greater than about 0 mol % and less than or equal to about 95 mol %, more desirably greater than or equal to about 20 mol % and less than or equal to about 90 mol %, particularly desirably greater than or equal to about 30 mol % and less than or equal to about 90 mol %, most desirably greater than or equal to about 30 mol % and less than or equal to about 70 mol % based on total structural units constituting the polymer compound. That is, in a desirable embodiment, Structural Unit (B) is included in a ratio of greater than or equal to about 30 mol % and less than or equal to about 70 mol % based on total structural units. On the other hand, when a polymer compound includes two or more types of Structural Units (B), a content of Structural Units (B) means a total amount of Structural Units (B).

In addition, as described above, the polymer compound according to an embodiment may further include other structural units (Structural Unit (C)). In this case, the composition of the other structural units (Structural Unit (C)) is not particularly limited. Considering the ease of film formation by the resulting polymer compound and the effect of further improving the film strength, Structural Unit (C) is desirably greater than about 0 mol % and less than or equal to about 10 mol % based on total structural units constituting the polymer compound. On the other hand, when a polymer compound includes two or more types of Structural Units (C), a content of the structural units (C) means a total amount of Structural Units (C).

As an example, Structural Unit (C) may include a structural unit having a crosslinking group. Herein, "crosslinking group" refers to a group that creates a new bond by reacting (crosslinking) with groups of the same or different structural units present nearby by heating or irradiation with active energy rays. By including a structural unit having a crosslinking group, a crosslinking reaction may occur by heating or irradiation of active energy rays, and a more durable film may be formed by insolubilization in the solvent used in subsequent processes. As a result, the productivity and durability of the electroluminescent device may be further improved.

The crosslinking group is not particularly limited as long as it is a group that can induce a crosslinking reaction by heat or active energy rays, but examples may include a bicyclo [4.2.0]octa-1,3,5-trienyl group, a vinyl group, a hexenyl group, a styryl group, a (3-methyl-3-oxetanyl)methoxy group, etc.

In addition, considering the durability (luminescence lifespan) and excellent film forming properties of the layers (e.g., hole injection layer, hole transport layer) formed using the obtained polymer compound, when a total mole ratio of Structural Unit (A) and Structural Unit (B) is 100 mol %, a mole ratio of Structural Unit (A) may be desirably greater than or equal to about 10 mol % and less than or equal to about 80 mol %, more desirably greater than or equal to about 10 mol % and less than or equal to about 70 mol %, and particularly desirably greater than or equal to about 30 mol % and less than or equal to about 70 mol %. Similarly, a mole ratio of Structural Unit (B) may be desirably greater than or equal to about 20 mol % and less than or equal to about 90 mol %, more desirably greater than or equal to about 30 mol % and less than or equal to about 90 mol %, and particularly desirably greater than or equal to about 30 mol % and less than or equal to about 70 mol % (a total mole ratio of Structural Unit (A) and Structural Unit (B) is 100 mol %).

A weight average molecular weight (Mw) of the polymer compound according to the present disclosure is not particularly limited as long as the desired effect of the present disclosure is obtained. The weight average molecular weight (Mw) may be, for example, about greater than or equal to about 5,000 grams per mole (g/mol) and less than or equal to about 1,000,000 g/mol, desirably greater than or equal to about 8,000 g/mol and less than or equal to about 1,000,000 g/mol, more desirably greater than or equal to about 10,000 g/mol and less than or equal to about 800,000 g/mol, and particularly desirably greater than or equal to about 30,000 g/mol and less than or equal to about 500,000 g/mol. With such a weight average molecular weight, it is possible to appropriately adjust the viscosity of the coating liquid for forming a layer (for example, a hole injection layer, a hole transport layer) formed using the polymer compound to form a layer having a uniform film thickness.

Moreover, a number average molecular weight (Mn) of the polymer compound is not particularly limited, as long as the desired effect of the present disclosure is acquired. The number average molecular weight (Mn) may be, for example, greater than or equal to about 4,000 g/mol and less than or equal to about 300,000 g/mol, desirably greater than or equal to about 6,000 g/mol and less than or equal to about 250,000 g/mol, more desirably greater than or equal to about 10,000 g/mol and less than or equal to about 200,000 g/mol, and particularly desirably greater than or equal to about 20,000 g/mol and less than or equal to about 180,000 g/mol. With such a number average molecular weight, it is possible to appropriately adjust the viscosity of the coating liquid for forming a layer (for example, a hole injection layer, a hole transport layer) using the polymer compound to form a layer having a uniform film thickness. In addition, a polydispersity (weight average molecular weight/number average molecular weight) of the polymer compound of the present embodiment may be, for example, greater than or equal to about 1.1 and less than or equal to about 5.0, for example greater than or equal to about 1.3 and less than or equal to about 4.0, desirably greater than or equal to about 1.5 and less than or equal to about 3.5.

Herein, the measurement of the number average molecular weight (Mn) and the weight average molecular weight (Mw) is not particularly limited and may be applied by using a known method or by appropriately changing the known methods. In the present specification, the number average molecular weight (Mn) and the weight average molecular weight (Mw) use values measured by the following method. The polydispersity (Mw/Mn) of the polymer is calculated by dividing the weight average molecular weight (Mw) by the number average molecular weight (Mn) measured by the following method.

Measurement of Number Average Molecular Weight (Mn) and Weight Average Molecular Weight (Mw)

The number average molecular weight (Mn) and the weight average molecular weight (Mw) of the polymer material are measured under the following conditions by SEC (Size Exclusion Chromatography) using polystyrene as a standard material.

SEC Measurement Condition

Analysis equipment (SEC): Shimadzu Corporation, Prominence (registered trademark)

Column: Polymer Laboratories, PLgel MIXED-B

Column temperature: 40° C.

Flow rate: 1.0 mL/min

Injection amount of sample solution: 20 microliters (μL, concentration of polymer: about 0.05 mass percent)

Eluent: tetrahydrofuran (THF)

Detector (UV-VIS detector): Shimadzu Corporation, SPD-10AV

Standard sample: polystyrene.

The terminal end of the main chain of the polymer compound according to the present embodiment is not particularly limited and is appropriately defined depending on the type of raw material used, but is usually a hydrogen atom.

The polymer compound of the present embodiment may be synthesized by using a known organic synthesis method. The specific synthesis method of the polymer compound of the present embodiment may be easily understood by a person of an ordinary skill in the art referring to the examples to be described later.

Specifically, the polymer compound according to an embodiment may be prepared by a copolymerization reaction using at least one monomer (I-x) represented by Chemical Formula (I-X) and at least one monomer (I-y) represented by Chemical Formula (I-Y). Additionally, at this time, if necessary, monomers constituting Structural Unit (B) according to an embodiment may be further added. Specifically, it may be prepared by a copolymerization reaction using at least one monomer (II-x) represented by Chemical Formula (II-X) and at least one monomer (II-y) represented by Chemical Formula (II-Y) (i.e., monomers constituting Structural Unit (B) according to an embodiment) in addition to at least one monomer (I-x) represented by Chemical Formula (I-X) and at least one monomer (I-y) represented by Chemical Formula (I-Y) (i.e., monomers constituting Structural Unit (A) according to an embodiment). Herein, in the polymer compound, when $Y^1$ in Structural Unit (A) and $Y^2$ in Structural Unit (B) have the same structure, the polymer compound according to an embodiment may also be prepared by copolymerization using at least one monomer (I-x) represented by Chemical Formula (I-X), at least one monomer (I-y) represented by Chemical Formula (I-Y) and at least one monomer (II-x) represented by Chemical Formula (II-X). Additionally, at this time, if necessary, other monomers corresponding to the other structural units (Structural Unit (C)) may be further added.

Chemical Formula (I-X)

(I-X)

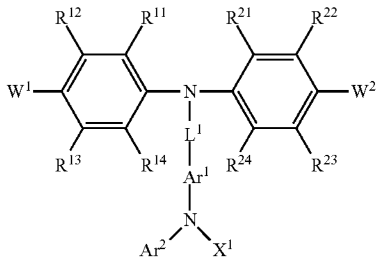

Chemical Formula (I-Y)

(I-Y)

$$W^3—Y^1—W^4$$

Chemical Formula (II-X)

(II-X)

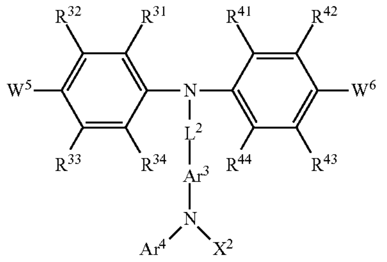

Chemical Formula (II-Y)

(II-Y)

$$W^7—Y^2—W^8$$

Alternatively, the polymer compound according to an embodiment may be prepared by a polymerization reaction using one or more monomers represented by Chemical Formula (1'). Also, at this time, if necessary, a monomer corresponding to Structural Unit (B) according to an embodiment may be further added. Specifically, when the polymer compound according to an embodiment includes Structural Unit (A) and Structural Unit (B), it may be prepared by copolymerization using at least one monomer represented by Chemical Formula (1') and at least one monomer represented by Chemical Formula (2'). Additionally, at this time, if necessary, other monomers corresponding to the other structural units (Structural Unit (C)) may be further added.

Chemical Formula (1')

(1')

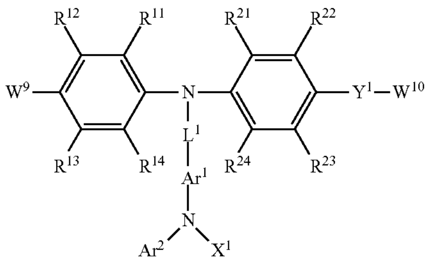

Chemical Formula (2')

(2')

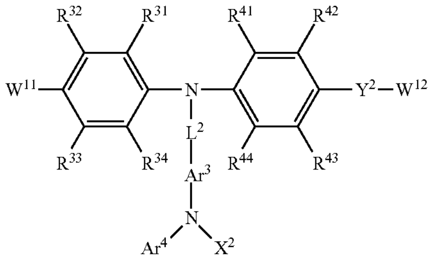

The monomers used for the polymerization of the polymer compound according to the present disclosure may be synthesized by appropriately combining a known synthesis reaction, and their structures may be confirmed by known methods (for example, NMR, LC-MS, etc.).

In Chemical Formulas (I-X), (I-Y), (II-X), (II-Y), (1'), and (2'), $R^{11}$ to $R^{14}$, $R^{21}$ to $R^{24}$, $R^{31}$ to $R^{34}$, $R^{41}$ to $R^{44}$, $L^1$, $L^2$, $Ar^1$, $Ar^2$, $Ar^3$, $Ar^4$, $X^1$, $X^2$, $Y^1$, and $Y^2$ are the same as defined in Chemical Formula (1) or (2) and $W^1$ to $W^{12}$ are each independently a halogen atom (fluorine atom, chlorine atom, bromine atom, iodine atom, especially bromine atom) or a group having the following structure represented by Chemical Formula D. Meanwhile, in the following structure, $R^A$ to $R^D$ each independently represent an alkyl group having 1 to 3 carbon atoms. Desirably, $R^A$ to $R^D$ may be a methyl group.

Chemical Formula D

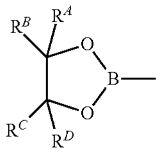

On the other hand, $W^1$ and $W^2$ in Chemical Formula (I-X), $W^3$ and $W^4$ in Chemical Formula (I-Y), $W^5$ and $W^6$ in Chemical Formula (II-X), $W^7$ and $W^8$ in Chemical Formulas (II-Y), $W^9$ and $W^{10}$ in Chemical Formula (1'), and $W^{11}$ and $W^{12}$ in Chemical Formula (2') may be the same or different, respectively. However, in order to suppress polymerization between the monomers (I-x), it is desirable that $W^1$ and $W^2$ in Chemical Formula (I-X) are atoms or groups that do not react with each other. Similarly, in order to suppress polymerization between the monomers (I-y), $W^3$ and $W^4$ in Chemical Formula (I-Y) are atoms or groups that do not react with each other. In addition, similarly in order to suppress polymerization between the monomers (II-x) or monomers (II-y), it is desirable that $W^5$ and $W^6$ in Chemical Formula (II-X) and $W^7$ and $W^8$ in Chemical Formula (II-Y) are atoms or groups that do not react with each other. In addition, similarly in order to suppress polymerization between the monomers represented by Chemical Formula (1') or the monomers represented by Chemical Formula (2'), it is desirable that $W^9$ and $W^{10}$ in Chemical Formula (1') and $W^{11}$ and $W^{12}$ in Chemical Formula (2') are each atoms or groups that do not react with each other. $W^1$ and $W^2$ in Chemical Formula (I-X), $W^3$ and $W^4$ in Chemical Formula (I-Y), $W^5$ and $W^6$ in Chemical Formula (II-X), and $W^7$ and $W^8$ in Chemical Formula (II-Y) may be the same, respectively. In addition, it is desirable that $W^9$ and $W^{10}$ in Chemical Formula (1') are different. Likewise, it is desirable that $W^{11}$ and $W^{12}$ in Chemical Formula (2') are different.

The polymer compound according to an embodiment has Structural Unit (A). Accordingly, the polymer compound has a large dipole moment and, as a result, has high hole injection properties. Therefore, when the polymer compound according to an embodiment is used as a hole injection material or a hole transport material (particularly a hole transport material), high durability (luminescence lifespan) may be achieved. Additionally, the polymer compound according to an embodiment has a high triplet energy level and a low driving voltage. Therefore, when the polymer compound according to an embodiment is used as a hole injection material or a hole transport material (particularly a hole transport material), high hole mobility may be achieved with a low driving voltage. Therefore, the electroluminescent device using the polymer compound according to an embodiment has excellent durability (luminescence lifespan) and luminous efficiency.

Electroluminescent Device Material

The polymer compound according to an embodiment may be used as an electroluminescent device material. According to the polymer compound according to an embodiment, an electroluminescent device material having excellent durability (luminescence lifespan) and high hole mobility is provided. In addition, according to the polymer compound according to an embodiment, an electroluminescent device material having a high triplet energy level (current efficiency) and a low driving voltage is also provided. Accordingly, in a second embodiment, an electroluminescent device material including the polymer compound according to an embodiment is provided. Alternatively, a use of the polymer compound as an electroluminescent device material is provided.

Additionally, the polymer compound according to an embodiment has a HOMO level exceeding about 5.20 electron volts (eV). Accordingly, the polymer compound according to an embodiment can also be suitably used in quantum dot electroluminescent devices (especially hole transport layer).

A glass transition temperature ($T_g$) of the polymer compound according to an embodiment is not particularly limited, but is desirably greater than or equal to about 75° C., more desirably greater than or equal to about 90° C., and particularly desirably greater than or equal to about 100° C. On the other hand, the upper limit is not particularly limited, but less than or equal to about 200° C. is desirable, less than or equal to about 180° C. is more desirable, and less than or equal to about 150° C. is particularly desirable.

If the glass transition temperature ($T_g$) of the polymer is within the above-described range, it is suitable for device manufacturing and a device with improved characteristics can be obtained. The glass transition temperature ($T_g$) of the polymer may be measured using a differential scanning calorimeter (DSC) (manufactured by Seiko Instruments, brand name: DSC6000). Meanwhile, details of the measurement method are described in the examples.

Electroluminescent Device

As described above, the polymer compound according to an embodiment may be used for an electroluminescent device. In other words, an electroluminescent device includes a pair of electrodes and one or more organic films between the electrodes and including the polymer compound or electroluminescent device material according to an embodiment. Such an electroluminescent device can exhibit excellent luminous efficiency with a low driving voltage. Accordingly, according to a third embodiment, an electroluminescent device includes a first electrode and a second electrode, and one or more organic films between the first electrode and the second electrode, wherein at least one layer of the organic film includes the polymer compound according to an embodiment. The purpose (or effect) of the present disclosure may also be achieved by the electroluminescent device according to the present embodiment. In an embodiment, the electroluminescent device further includes a light emitting layer between the electrodes and including a light emitting material capable of emitting light from triplet excitons. On the other hand, the electroluminescent device of the present embodiment may be an example of the electroluminescent device according to the present disclosure.

In addition, the present embodiment provides a method of manufacturing an electroluminescent device that includes a pair of electrodes and at least one organic film disposed between the electrodes and including the polymer compound according to an embodiment and at least one of the layers is formed by a coating method. Furthermore, by this method, the present embodiment provides an electroluminescent device in which at least one layer of the organic film is formed by a coating method.

The polymer compound according to an embodiment and the electroluminescent device material (EL device material) according to the present embodiment (hereinafter collectively, also referred to as "polymer compound/EL device material") have improved solubility in an organic solvent. For this reason, the polymer compound/EL device material according to the present embodiment may be used for manufacturing devices (especially thin films) by a coating method (wet process). For this reason, the present embodiment provides a liquid composition including the polymer compound according to an embodiment and a solvent or a dispersion medium. Such a liquid composition is an example of the liquid composition according to the present disclosure.

In addition, as described above, the electroluminescent device material according to the embodiment may be used for the manufacture of devices (particularly thin films) by a coating method (wet process). In view of the above, the present embodiment provides a thin film including the polymer compound according to an embodiment. Such a thin film is an example of the thin film according to the present disclosure.

Further, the EL device material according to the present embodiment has improved hole injection properties and hole mobility. For this reason, it may be also desirably used in formation of any one organic film of a hole injection material, a hole transport material, or a light emitting material (host). Among them, from the viewpoint of hole transportability, it may be used as a hole injection material or a hole transport material, and particularly a hole transport material.

In other words, the present embodiment provides a composition including the polymer compound and at least one material selected from a hole transport material, an electron transport material, and a light emitting material. Herein, the light emitting material included in the composition is not particularly limited, but may include an organometallic complex (light emitting organometallic complex compound) or a semiconductor nanoparticle (semiconductor inorganic nanoparticle).

Electroluminescent Device

Hereinafter, referring to FIG. 1, an electroluminescent device according to the present embodiment is described in detail. FIG. 1 is a schematic view showing an electroluminescent device according to the present embodiment. In addition, in this specification, an "electroluminescent device" may be abbreviated as "EL device."

As shown in FIG. 1, the EL device 100 according to the present embodiment includes a substrate 110, a first electrode 120 disposed on the substrate 110, a hole injection layer 130 disposed on the first electrode 120, a hole transport layer 140 disposed on the hole injection layer 130, a light emitting layer 150 disposed on the hole transport layer 140, an electron transport layer 160 disposed on the light emitting layer 150, an electron injection layer 170 disposed on the electron transport layer 160, and a second electrode 180 disposed on the electron injection layer 170.

Herein, the polymer compound according to the present embodiment is included in, for example, any one organic film (organic layer) disposed between the first electrode 120 and the second electrode 180. Specifically, the polymer compound may be included in the hole injection layer 130 as a hole injection material, in the hole transport layer 140 as a hole transport material, or in the light emitting layer 150 as a light emitting material (host). The polymer compound may be included in the hole injection layer 130 as a hole injection material or included in the hole transport layer 140 as a hole transport material. In an embodiment, the layer including the polymer compound may be a hole transport layer, a hole injection layer, or a light emitting layer. In an embodiment, the layer including the polymer compound may be a hole transport layer or a hole injection layer. In an embodiment, the layer including the polymer compound may be a hole transport layer.

In addition, the layer including the polymer compound according to the present embodiment/EL device material may be formed by a coating method (solution coating method). Specifically, the layer may be formed by a solution coating method such as a spin coating method, a casting method, a micro gravure coating method, a gravure coating method, a bar coating method, a roll coating method, a wire bar coating method, a dip coating method, a spray coating method, a screen-printing method, a flexographic printing method, an offset printing method, an inkjet printing method, and the like.

As the solvent used in the solution coating method, any solvent may be used as long as it is capable of dissolving the polymer compound/EL device material, and the solvent may be appropriately selected according to types of the polymer compound. For example, the solvent may be toluene, xylene, ethylbenzene, diethyl benzene, mesitylene, propylbenzene, cyclohexylbenzene, dimethoxy benzene, anisole, ethoxytoluene, phenoxytoluene, isopropylbiphenyl, dimethylanisole, phenyl acetate, phenyl propionate, methyl benzoate, ethyl benzoate, cyclohexane, and the like. An amount of the solvent used is not particularly limited, but considering the ease of coating, a concentration of the polymer compound may desirably be greater than or equal to about 0.1 mass % and less than or equal to about 10 mass %, or greater than or equal to about 0.5 mass % and less than or equal to about 5 mass %.

In addition, the film-formation method of layers other than the layer including the polymer compound/EL device material/is not specifically limited. The layers other than the layer including the polymer compound/EL device material according to the present embodiment may be formed by, for example, a vacuum deposition method or may be formed by a solution coating method.

The substrate 110 may be a substrate used in a general EL device. For example, the substrate 110 may be a semiconductor substrate such as a glass substrate, a silicon substrate, and the like, or a transparent plastic substrate.

On the substrate 110, a first electrode 120 is formed. The first electrode 120 is specifically an anode, and is formed by a material having a large work function among a metal, an alloy, or a conductive compound. For example, the first electrode 120 may be formed as a transmissive electrode by indium tin oxide ($In_2O_3$—$SnO_2$:ITO), indium zinc oxide ($In_2O_3$—ZnO), tin oxide ($SnO_2$), zinc oxide (ZnO) or the like due to improved transparency and conductivity. The first electrode 120 may be formed as a reflective electrode by laminating magnesium (Mg), aluminum (Al), or the like on the transparent conductive layer. After forming the first electrode 120 on the substrate 110, washing and UV-ozone treatment may be performed as necessary.

On the first electrode 120, a hole injection layer 130 is formed.

The hole injection layer 130 is a layer that facilitates injection of holes from the first electrode 120, and may be formed to have a thickness (dry film thickness; the same below) of specifically greater than or equal to about 10 nm and less than or equal to about 1000 nm, or greater than or equal to about 20 nm and less than or equal to about 50 nm.

The hole injection layer 130 may be formed of a known hole injection material. The known hole injection material of the hole injection layer 130 may include, for example, triphenylamine-containing poly(ether ketone) (TPAPEK), 4-isopropyl-4'-methyldiphenyl iodonium tetrakis(pentafluorophenyl)borate (PPBI), N,N'-diphenyl-N,N'-bis-[4-(phenyl-m-tolyl-amino)-phenyl]-biphenyl-4,4'-diamine (DNTPD), copper phthalocyanine, 4,4',4"-tris(3-methylphenylphenylamino)triphenylamine (m-MTDATA), N,N'-di(1-naphthyl)-N,N'-diphenylbenzidine (NPB), 4,4',4"-tris(diphenylamino)triphenylamine (TDATA), 4,4',4"-tris(N,N-2-naphthylphenylamino)triphenylamine (2-TNATA), polyaniline/dodecylbenzenesulfonic acid, poly(3,4-ethylenedioxythiophene)/poly(4-styrenesulfonate) (PEDOT/PSS), and polyaniline/10-camphorsulfonic acid, and the like.

On the hole injection layer 130, a hole transport layer 140 is formed. The hole transport layer 140 is a layer having a function of transporting holes, and may be formed with a thickness of, for example, greater than or equal to about 10 nm and less than or equal to about 150 nm, and more specifically greater than or equal to about 20 nm and less than or equal to about 50 nm. The hole transport layer 140 may be formed by a solution coating method using the polymer compound according to the present embodiment. According to this method, it is possible to extend the durability (light emission lifespan) of the EL device 100. In addition, current efficiency of the EL device 100 may be improved and a driving voltage may be decreased. In addition, since the hole transport layer may be formed by the solution coating method, a large area may be formed efficiently.

However, when one organic film of the EL device 100 includes the polymer compound according to an embodiment, the hole transport layer 140 may be formed of a known hole transport material. The known hole transport material may include, for example, 1,1-bis[(di-4-tolylamino) phenyl] cyclohexane (TAPC), a carbazole derivative such as N-phenylcarbazole, polyvinylcarbazole, and the like, N,N'-bis(3-methylphenyl)-N, N'-diphenyl-[1,1-biphenyl]-4,4'-diamine (TPD), 4,4',4"-tris(N-carbazolyl) triphenylamine (TCTA), and N,N'-di(1-naphthyl)-N,N'-diphenylbenzidine (NPB).

On the hole transport layer 140, a light emitting layer 150 is formed. The light emitting layer 150 is a layer that emits light by fluorescence, phosphorescence, and the like, and is formed using a vacuum deposition method, a spin coating method, an inkjet printing method, or the like. The light emitting layer 150 may be formed with a thickness of, for example, about 10 nm to about 60 nm, and more specifically about 20 nm to about 50 nm. The light emitting material of the light emitting layer 150 may include a known light emitting material. However, the light emitting material included in the light emitting layer 150 is desirably a light emitting material capable of emitting light (i.e., phosphorescence emission) from triplet excitons. In such a case, the driving lifespan of the EL device 100 may be further improved.

The light emitting layer 150 is not particularly limited and may have a known configuration. Desirably, the light emitting layer may include a semiconductor nanoparticle or an organometallic complex. That is, in an embodiment of the present disclosure, the organic film has a light emitting layer including semiconductor nanoparticles or organometallic complexes. When the light emitting layer includes semiconductor nanoparticles, the EL device may be a quantum dot electroluminescent device (QLED) or a quantum dot light emitting diode. In addition, when the light emitting layer includes an organometallic complex, the EL device is an organic electroluminescent device (OLED).

In the form in which the light emitting layer includes semiconductor nanoparticles (QLED), the light emitting layer may include a plurality of semiconductor nanoparticles (quantum dots) arranged in a single layer or a plurality of layers. Herein, the semiconductor nanoparticles (quantum dots) may be particles of predetermined sizes that have a quantum confinement effect. The diameter of the semiconductor nanoparticles (quantum dots) is not particularly limited but is greater than or equal to about 1 nanometer (nm) and less than or equal to about 20 nm.

The semiconductor nanoparticles (quantum dots) arranged in the light emitting layer may be synthesized by a wet chemical process, an organometal chemical deposition process, a molecular beam epitaxy process, or another similar process. Among them, the wet chemical process is a method of growing a particle by putting a precursor material in an organic solvent.

In the wet chemistry process, when crystals grow, the organic solvent naturally coordinates to the surface of the quantum dot crystals and acts as a dispersing agent, thereby controlling the growth of the crystals. For this reason, in the wet chemical process, compared with gas phase deposition methods, such as metal organic chemical vapor deposition (MOCVD) and molecular beam epitaxy (MBE), growth of semiconductor nanoparticles may be easily controlled at a low cost.

The semiconductor nanoparticles (quantum dots) may adjust energy bandgaps by adjusting their sizes, so that light of various wavelengths may be obtained from the light emitting layer (quantum dot light emitting layer). Thus, a plurality of differently sized quantum dots may embody a display that discharges (or emits) light of multiple wavelengths. The sizes of the quantum dots may be selected to emit red, green, and blue light to form a color display. In addition, the sizes of the quantum dots may be combined so that various color lights emit white light.

The semiconductor nanoparticles (quantum dots) may be semiconductor material selected from a Group II-VI semiconductor compound; a Group III-V semiconductor compound; a Group IV-VI semiconductor compound; a Group IV element or compound; and a combination thereof.

The Group II-VI semiconductor compound is not particularly limited, but includes, for example, a binary compound selected from CdSe, CdTe, ZnS, ZnSe, ZnTe, ZnO, HgS, HgSe, HgTe, and a mixture thereof; a ternary compound selected from CdSeS, CdSeTe, CdSTe, ZnSeS, ZnTeSe, ZnSTe, HgSeS, HgSeTe, HgSTe, CdZnS, CdZnSe, CdZnTe, CdHgS, CdHgSe, CdHgTe, HgZnS, HgZnSe, HgZnTe, and a mixture thereof; and a quaternary compound selected from CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V semiconductor compound is not particularly limited, but includes, for example, a binary compound selected from GaN, GaP, GaAs, GaSb, AlN, AlP, AlAs, AlSb, InN, InP, InAs, InSb, and a mixture thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI semiconductor compound is not particularly limited, but includes, for example, a binary compound selected from SnS, SnSe, SnTe, PbS, PbSe, PbTe, and a mixture thereof; a ternary compound selected from SnSeS, SnSeTe, SnSTe, PbSeS, PbSeTe, PbSTe, SnPbS, SnPbSe, SnPbTe, and a mixture thereof; and a quaternary compound selected from SnPbSSe, SnPbSeTe, SnPbSTe, and a mixture thereof.

The Group IV element or compound is not particularly limited, but includes, for example, a single element selected from Si, Ge, and a mixture thereof; and a binary compound selected from SiC, SiGe, and a mixture thereof.

The semiconductor nanoparticles (quantum dots) may have a homogeneous single structure or a double structure of a core-shell. The core-shell may include different materials. The material constituting each core and shell may be made of different semiconductor compounds. However, an energy bandgap of the shell material is larger than an energy bandgap of the core material. Specifically, structures such as ZnTeSe/ZnSe/ZnS, CdSe/ZnS, InP/ZnS, and the like are desirable.

For example, a process of producing a quantum dot having a core (CdSe)-shell (ZnS) structure is described. First, crystals are formed by injecting core (CdSe) precursor materials of $(CH_3)_2Cd$ (dimethyl cadmium), TOPSe (trioctylphosphine selenide) and the like into an organic solvent using TOPO (trioctylphosphine oxide) as a surfactant. At this time, after maintaining a certain time at high temperature so that the crystals grow to a certain size, the precursor materials of the shell (ZnS) are injected, to form a shell on the surface of the core already generated. As a result, a quantum dot of CdSe/ZnS capped with TOPO may be produced.

In addition, in the embodiment (OLED) in which the light emitting layer includes an organometallic complex, the light emitting layer 150 may include, for example 6,9-diphenyl-9'-(5'-phenyl-[1,1':3',1"-terphenyl]-3-yl)3,3'-bi[9H-carbazole], 3,9-diphenyl-5-(3-(4-phenyl-6-(5'-phenyl-[1,1': 3',1"-terphenyl]-3-yl)-1,3,5,-triazin-2-yl)phenyl)-9H-carbazole, 9,9'-diphenyl-3,3'-bi[9H-carbazole], tris(8-quinolinato)aluminum ($Alq_3$), 4,4'-bis(carbazol-9-yl)biphenyl (CBP), poly (N-vinyl carbazole) (PVK), 9,10-di(naphthalene)anthracene (ADN), 4,4',4"-tris(N-carbazolyl)triphenylamine (TCTA), 1,3,5-tris(N-phenyl-benzimidazol-2-yl)benzene (TPBI), 3-tert-butyl-9,10-di(naphth-2-yl)anthracene (TBADN), distyrylarylene (DSA), 4,4'-bis(9-carbazole)-2,2'-dimethyl-bipheny (dmCBP), and the like, as a host material.

In addition, the light emitting layer 150 may include, for example, perylene and a derivative thereof, rubrene and a derivative thereof, coumarin and a derivative thereof, 4-dicyanomethylene-2-(p-dimethylaminostyryl)-6-methyl-4H-pyran (DCM) and a derivative thereof, an iridium (Ir) complex such as bis[2-(4,6-difluorophenyl)pyridinate]picolinate iridium(Ill) (Flrpic)), bis(1-phenylisoquinoline) (acetylacetonate)iridium(III) ($Ir(piq)_2(acac)$), tris(2-phenylpyridine)iridium (Ill) ($Ir(ppy)_3$), tris(2-(3-p-xylyl)phenyl)pyridine iridium (Ill), an osmium (Os) complex, a platinum complex, and the like, as a dopant material. Among these, it is desirable that the light emitting material is a light emitting organometallic complex compound.

A method for forming the light emitting layer is not particularly limited. It may be formed by coating (solution coating method) coating liquid including a semiconductor nanoparticle or an organometallic complex. At this time, it is desirable to select a solvent which does not dissolve the materials (hole transport material, particularly the polymer compound) in the hole transport layer as the solvent constituting the coating liquid.

On the light emitting layer 150, an electron transport layer 160 is formed. The electron transport layer 160 is a layer having a function of transporting electrons, and is formed using a vacuum deposition method, a spin coating method, an inkjet method, or the like. For example, the electron transport layer 160 may be formed to have a thickness of greater than or equal to about 15 nm and less than or equal to about 50 nm.

The electron transport layer 160 may be formed of a known electron transport material. The known electron transport material may include, for example, (8-quinolinato) lithium (lithium quinolate) (Liq), tris(8-quinolinato) aluminum ($Alq_3$) and a compound having a nitrogen-containing aromatic ring. Examples of the compound having the nitrogen-containing aromatic ring may include, for example, a compound including a pyridine ring such as 1,3,5-tri[(3-pyridyl)-phen-3-yl]benzene), a compound including a triazine ring such as 2,4,6-tris(3'-(pyridin-3-yl)biphenyl-3-yl)-1,3,5-triazine), a compound including an imidazole ring such as 2-(4-(N-phenylbenzoimidazolyl-1-yl-phenyl)-9,10-dinaphthylanthracene or 1,3,5-tris(N-phenyl-benzimidazol-2-yl)benzene (TPBI). The electron transport material may be used alone or as a mixture of two or more thereof.

On the electron transport layer 160, an electron injection layer 170 is formed. The electron injection layer 170 is a layer having a function of facilitating injection of electrons from the second electrode 180. The electron injection layer 170 is formed using a vacuum deposition method or the like. The electron injection layer 170 may be formed to have a thickness of greater than or equal to about 0.1 nm and less than or equal to about 5 nm, and more specifically, greater than or equal to about 0.3 nm and less than or equal to about 2 nm. As a material for forming the electron injection layer 170, any known material may be used. For example, the electron injection layer 170 may be formed of a lithium compound such as (8-quinolinato) lithium (lithium quinolate) (Liq) and lithium fluoride (LiF), sodium chloride (NaCl), cesium fluoride (CsF), lithium oxide ($Li_2O$), or barium oxide (BaO).

On the electron injection layer 170, a second electrode 180 is formed. The second electrode 180 is formed using a vacuum deposition method or the like. Specifically, the second electrode 180 is a cathode, and is formed by a material having a small work function such as metals, alloys, or conductive compounds. For example, the second electrode 180 may be formed as a reflective electrode with a metal such as lithium (Li), magnesium (Mg), aluminum (Al), calcium (Ca), or aluminum-lithium (Al—Li), magnesium-indium (Mg—In), magnesium-silver (Mg—Ag), or the like. The second electrode 180 may be formed to have a thickness of greater than or equal to about 10 nm and less than or equal to about 200 nm, and more specifically, greater than or equal to about 50 nm and less than or equal to about 150 nm. Alternatively, the second electrode 180 may be formed as a transmissive electrode by a thin film of less than or equal to about 20 nm of a metal material or a transparent conductive layer such as indium tin oxide ($In_2O_3$—$SnO_2$), and indium zinc oxide ($In_2O_3$—ZnO).

The EL device 100 according to the present embodiment has been described above as an example of the electroluminescent device according to the present disclosure. The EL device 100 according to the present embodiment further improves luminous efficiency (current efficiency) and reduces a driving voltage by installing an organic film (particularly a hole transport layer or a hole injection layer) including polymer compound. Additionally, luminous efficiency (current efficiency) can be further improved and driving voltage can be reduced.

The stacked structure of the EL device 100 according to the present embodiment is not limited to the above embodiments. The EL device 100 according to the present embodiment may have another known stacked structure. For example, in the EL device 100, one or more layers of the hole injection layer 130, the hole transport layer 140, the electron transport layer 160, and the electron injection layer 170 may be omitted or another layer may be further included. In addition, each layer of the EL device 100 may be formed in a single layer or in a plurality of layers.

For example, the EL device 100 may further include a hole blocking layer between the electron transport layer 160 and the light emitting layer 150 in order to prevent excitons or holes from diffusing into the electron transport layer 160. The hole blocking layer may be formed by, for example, an oxadiazole derivative, a triazole derivative, or a phenanthroline derivative.

In addition, polymer compound according to the present embodiment may be applied to electroluminescent devices other than the QLED or OLED. Other electroluminescent devices including the polymer compound according to an embodiment may include, but are not particularly limited to, for example, organic inorganic perovskite light emitting devices.

The present disclosure includes the following aspects and embodiments.

1. A polymer compound including a Structural Unit (A) represented by Chemical Formula (1):

Chemical Formula (1)

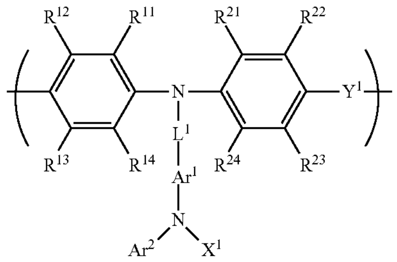

(1)

In Chemical Formula (1), $R^{11}$ to $R^{14}$ and $R^{21}$ to $R^{24}$ are each independently a hydrogen atom, a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, wherein $R^{11}$ and $R^{21}$ may be linked to each other to form a ring, $L^1$ is a substituted or unsubstituted aromatic hydrocarbon group having 6 to 25 ring-member atoms, or a substituted or unsubstituted aromatic heterocyclic group having 5 to 25 ring-member atoms, $Ar^1$ is a substituted or unsubstituted aromatic hydrocarbon group having 6 to 25 ring-member atoms, $Ar^2$ is a substituted or unsubstituted aromatic hydrocarbon group having 6 to 25 ring-member atoms, or a substituted or unsubstituted aromatic heterocyclic group having 5 to 25 ring-member atoms, or may be linked to $Ar^1$ to form a ring, $X^1$ is a substituted or unsubstituted aromatic hydrocarbon group having 6 to 25 ring-member atoms, $Y^1$ is a substituted or unsubstituted aromatic hydrocarbon group having 6 to 25 ring-member atoms, and at least one of $X^1$ and $Y^1$ is an aromatic hydrocarbon group having 6 to 25 ring-member atoms substituted with an alkyl group having 1 to 14 carbon atoms substituted with a carboxyl group or an alkyl group having 1 to 14 carbon atoms substituted with a group having a carboxyl group.

2. The polymer compound described in 1. above, further comprising Structural Unit (B) represented by Chemical Formula (2):

Chemical Formula (2)

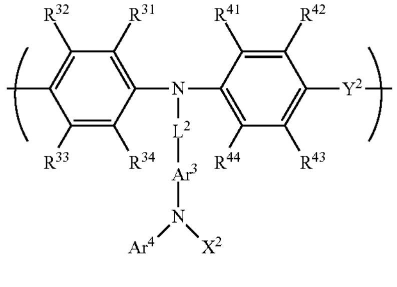

(2)

wherein, in Chemical Formula (2), $R^{31}$ to $R^{34}$ and $R^{41}$ to $R^{44}$ are each independently a hydrogen atom, a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, wherein $R^{31}$ and $R^{41}$ may be linked to each other to form a ring, $L^2$ is a substituted or unsubstituted aromatic hydrocarbon group having 6 to 25 ring-member atoms, or a substituted or unsubstituted aromatic heterocyclic group having 5 to 25 ring-member atoms, $Ar^3$ is a substituted or unsubstituted aromatic hydrocarbon group having 6 to 25 ring-member atoms, $Ar^4$ is a substituted or unsubstituted aromatic hydrocarbon group having 6 to 25 ring-member atoms, or a substituted or unsubstituted aromatic heterocyclic group having 5 to 25 ring-member atoms, or may be linked to $Ar^3$ to form a ring, $X^2$ is an aromatic hydrocarbon group having 6 to 25 ring-member atoms which may be substituted with an alkyl group having 1 to 14 carbon atoms, $Y^2$ is an aromatic hydrocarbon group having 6 to 25 ring-member atoms which may be substituted with an alkyl group having 1 to 14 carbon atoms, and $R^{31}$ to $R^{34}$, $R^{41}$ to $R^{44}$, $L^2$, $Ar^3$, and $Ar^4$ do not have an alkyl group having 1 to 14 carbon atoms substituted with a carboxyl group and an alkyl group having 1 to 14 carbon atoms substituted with a group having a carboxyl group.

3. The polymer compound described in 2. above, wherein a mole ratio of Structural Unit (A) is greater than or equal to about 10 mol % and less than or equal to about 70 mol % (a total mole ratio of Structural Unit (A) and Structural Unit (B) is 100 mol %).

4. The polymer compound described in any one of the 1. to 3. above, wherein in Chemical Formula (1), $X^1$ is an aromatic hydrocarbon group having 6 to 25 ring-member atoms substituted with an alkyl group having 1 to 14 carbon atoms substituted with a carboxyl group or an alkyl group having 1 to 14 carbon atoms substituted with a group having a carboxyl group and $Y^1$ is an aromatic hydrocarbon group having 6 to 25 ring-member atoms which is substituted or unsubstituted with a substituent other than an alkyl group having 1 to 14 carbon atoms substituted with a carboxyl group or an alkyl group having 1 to 14 carbon atoms substituted with a group having a carboxyl group.

5. The polymer compound described in the 2. or 3. above, wherein $R^{11}$ to $R^{14}$, $R^{21}$ to $R^{24}$, $L^1$, $Ar^1$, $Ar^2$, and $Y^1$ in Chemical Formula (1) are each the same as $R^{31}$ to $R^{34}$, $R^{41}$ to $R^{44}$, $L^2$, $Ar^3$, $Ar^4$, and $Y^2$ in Chemical Formula (2).

6. The polymer compound described in any one of the 1. to 5. above, wherein the alkyl group having 1 to 14 carbon atoms substituted with a carboxyl group or the alkyl group having 1 to 14 carbon atoms substituted with a group having a carboxyl group has a structure represented by Chemical Formula (i):

Chemical Formula (i)

$$***{-}C_tH_{2t}{-}(Z')_u{-}COOH \qquad (i)$$

wherein, in Chemical Formula (i), t represents an integer from 1 to 14, u is 0 or 1, $Z^1$ represents an organic group other than an alkylene group, and

*** is bonded to an aromatic hydrocarbon group having 6 to 25 ring-member atoms constituting $X^1$ or $Y^1$.

7. The polymer compound described in any one of the 1. to 6. above, wherein in Chemical Formula (1), $X^1$ is one of the groups represented by Chemical Formulas (3-1) to (3-12):

Chemical Formulas (3-1) to (3-12)

(3-1)

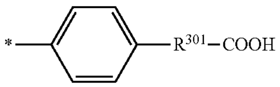

(3-2)

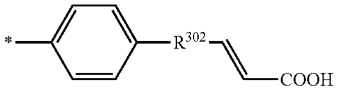

(3-3)

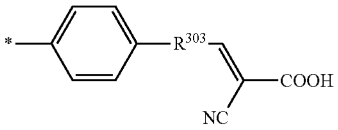

(3-4)

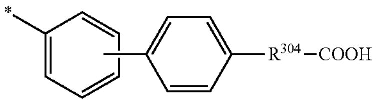

(3-5)

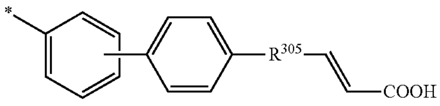

(3-6)

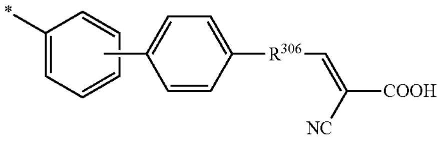

(3-7)

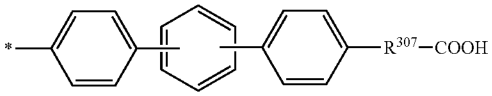

(3-8)

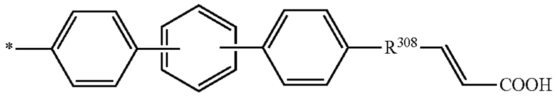

(3-9)

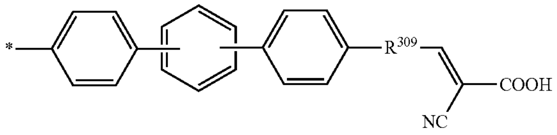

(3-10)

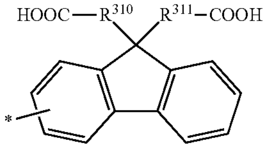

-continued (3-11)

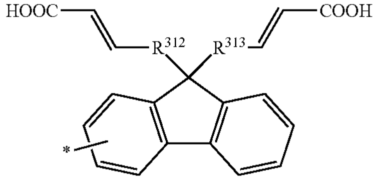

(3-12)

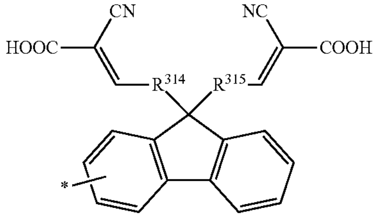

wherein, in Chemical Formulas (3-1) to (3-12), $R^{301}$ to $R^{315}$ are each independently a substituted or unsubstituted alkylene group having 1 to 14 carbon atoms, and

* is bonded to the nitrogen atom.

8. The polymer compound described in the 7. above, wherein in Chemical Formula (1), $X^1$ is one of the groups represented by Chemical Formulas (3-10) to (3-12).

9. The polymer compound described in any one of the 1. to 8. above, wherein in Chemical Formula (1), $Y^1$ is any one of the groups represented by Chemical Formulas (5-1) to (5-9):

Chemical Formula (5-1) to (5-9)

(5-1)

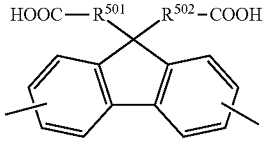

(5-2)

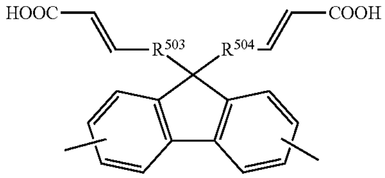

(5-3)

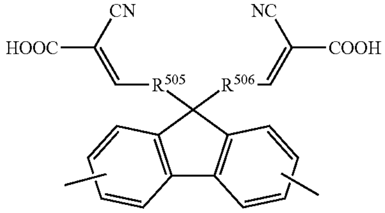

(5-4)

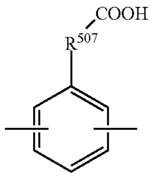

-continued (5-5)

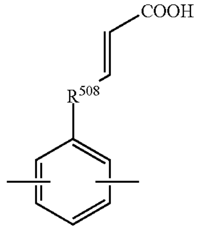

(5-6)

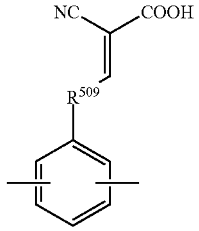

(5-7)

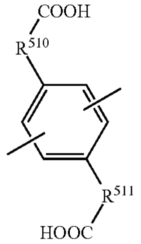

(5-8)

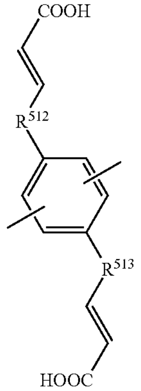

(5-9)

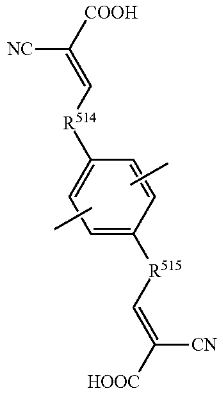

wherein, in Chemical Formulas (5-1) to (5-9), $R^{501}$ to $R^{515}$ are each independently a substituted or unsubstituted alkylene group having 1 to 14 carbon atoms.

10. The polymer compound described in any one of the 1. to 9. above, wherein in Chemical Formula (1), $L^1$ is one of the groups represented Chemical Formulas (7-1) to (7-24):
Chemical Formula (7-1) to (7-24)
(7-1)
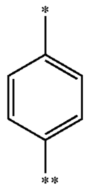
(7-2)
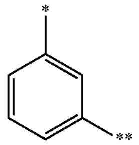
(7-3)
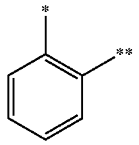
(7-4)
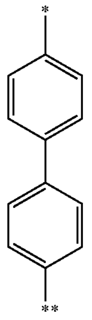
(7-5)
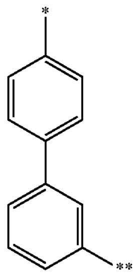
(7-6)
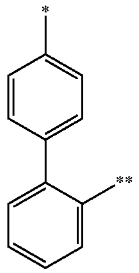
-continued
(7-7)
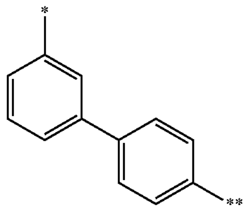
(7-8)
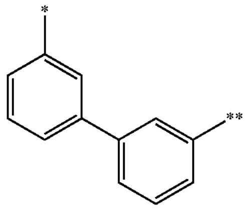
(7-9)
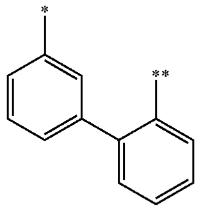
(7-10)
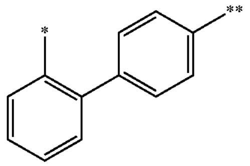
(7-11)
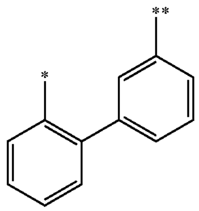
(7-12)
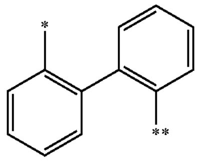
(7-13)
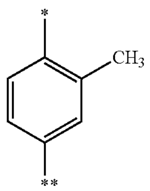
(7-14)
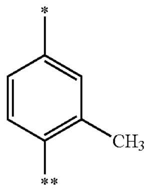

-continued
(7-15)
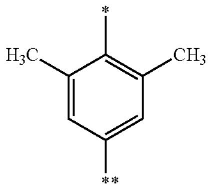
(7-16)
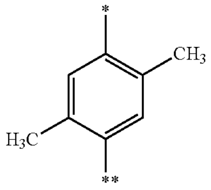
(7-17)
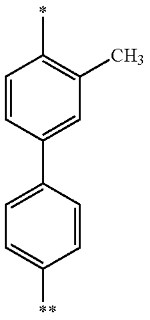
(7-18)
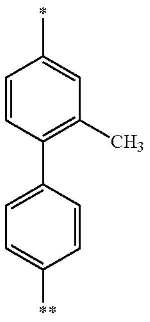
(7-19)
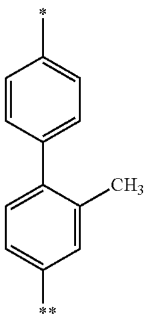
-continued
(7-20)
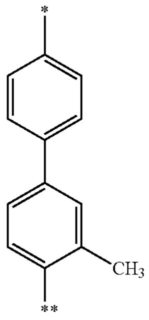
(7-21)
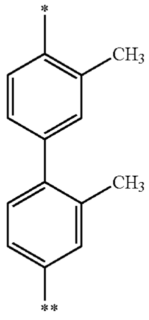
(7-22)
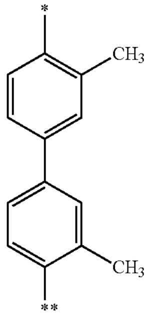
(7-23)
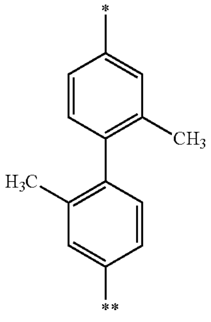
(7-24)
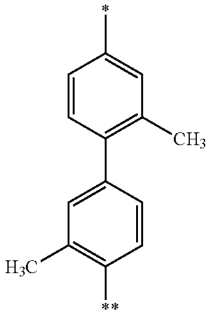

wherein, in Chemical Formulas (7-1) to (7-24),

* is bonded to a nitrogen atom, and ** is bonded to $Ar^1$.

11. The polymer compound described in any one of the 1. to 10. above, wherein $-L^1-Ar^1-N(Ar^2)(X^1)$ in Chemical Formula (1) is any one of the groups represented by Chemical Formulas (9-1) to (9-3):

Chemical Formulas (9-1) to (9-3)

(9-1)

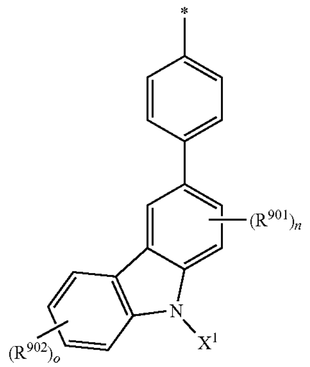

(9-2)

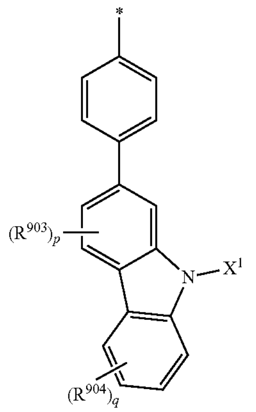

(9-3)

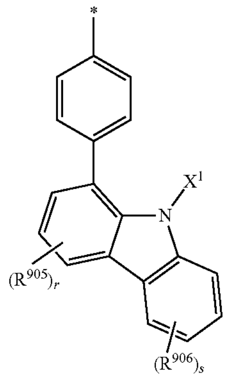

wherein, in Chemical Formulas (9-1) to (9-3), $R^{901}$ to $R^{906}$ are each independently a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, n, p, and r are each independently 0, 1, 2, or 3, o, q, and s are each independently 0, 1, 2, 3, or 4, when any one of n, o, p, q, r, and s is 2 or more, each $R^{901}$, each $R^{902}$, each $R^{903}$, each $R^{904}$, each $R^{905}$, or each $R^{906}$ is the same or different, $X^1$ is the same as defined in Chemical Formula (1), and

* is bonded to the nitrogen atom.

12. An electroluminescent device material comprising the polymer compound described in any one of the 1. to 11. above.

13. An electroluminescent device, comprising a first electrode and a second electrode, and one or more organic films between the first electrode and the second electrode, wherein at least one layer of the organic film comprises the polymer compound described in any one of the 1. to 11. above.

14. The electroluminescent device described in the 13. above wherein the layer including the polymer compound is a hole transport layer or a hole injection layer.

15. The electroluminescent device described in the 13. above wherein the organic film comprises a light emitting layer comprising a semiconductor nanoparticle or an organometal complex.

EXAMPLES

The present disclosure is described in more detail using the following examples and comparative examples. However, the technical range of the present disclosure is not limited to the following examples. In the following examples, unless specifically described, each operation was performed at room temperature (25° C.). In addition, unless specifically stated, "%" and "a part" mean "mass %" and "a part by mass", respectively.

Synthesis Example 1

Synthesis of Compound A-1

Compound A-1 was synthesized according to the following reaction.

Reaction Scheme A-1

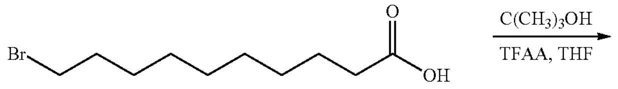

-continued

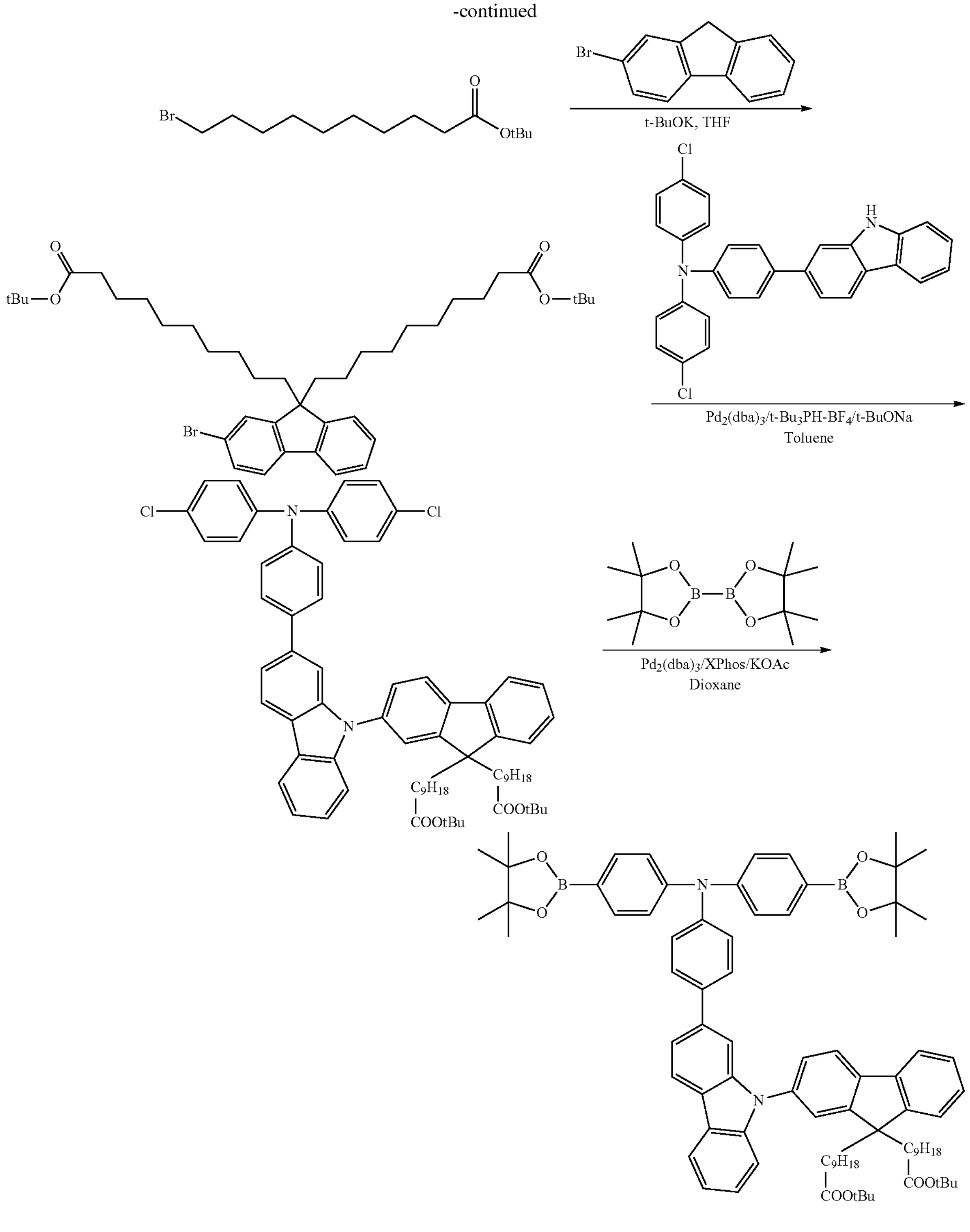

A-1

In a 1 L four-necked flask, 10-bromodecanoic acid (50.0 grams (g)) and THF (400 milliliters (mL)) were added and then stirred under a nitrogen atmosphere at room temperature. Subsequently, anhydrous trifluoroacetic acid (TFAA) (160 g) was added dropwise thereto and then stirred for 1 hour. Then, tert-butanol (76.0 g) was added dropwise and then stirred for 12 hours. The resultant mixture was neutralized with a saturated aqueous sodium bicarbonate solution, extracted with ethyl acetate after removal of THF by distillation under reduced pressure, washed with water, and dried with magnesium sulfate. After removal of the solvent by distillation under reduced pressure, the residue was purified by column chromatography (silica gel, hexane/ethyl acetate) to provide tert-butyl 10-bromodecanoate (37.8 g).

In a 1 L four-necked flask, tert-butyl 10-bromodecanoate (20.0 g) and THF (700 mL) were combined and stirred under a nitrogen atmosphere at 0° C. Subsequently, potassium tert-butoxide (t-BuOK) (7.30 g) was added thereto and then stirred for 10 minutes. A solution of 2-bromofluorene (5.31 g) dissolved in THF (55 mL) was added dropwise thereto and then stirred for 1 hour. Subsequently, the reaction mixture was allowed to warm to room temperature and stirring was continued at room temperature for 12 hours. After adding water (100 mL) and removing the solvent by distillation under reduced pressure, the residue was extracted with ethyl acetate, washed with water, and dried with magnesium sulfate. Subsequently, the solvent was removed by distillation under reduced pressure to provide di-tert-butyl-10,10'-(2-bromo-9H-fluorene-9,9-diyl)bis(decanoate) (12.4 g).

In a 200 mL four-necked flask, di-tert-butyl-10,10'-(2-bromo-9H-fluorene-9,9-diyl)bis(decanoate) (10.9 g), N-(4-(9H-carbazolyl)phenyl)-4-chloro-N-(4-chlorophenyl)aniline (7.99 g), tris(dibenzylideneacetone)dipalladium (0) ($Pd_2(dba)_3$, 0.38 g), tri-tert-butylphosphoniumtetrafluoroborate ($t\text{-}Bu_3PH{\cdot}BF_4$, 0.500 g), sodium tert-butoxide (t-BuONa) (3.21 g), and toluene (83 mL) were combined and then stirred under a nitrogen atmosphere at 100° C. for 5 hours. The filtered through Celite (registered trademark, the same hereinafter), and then activated carbon (4.0 g) and zeolite (4.0 g) were added thereto to the reaction mixture and stirred at 110° C. for 30 minutes. The solids were removed by filtering through Celite, and the filtrate was passed through silica gel. After removing the solvent by distillation under reduced pressure, the residue was purified by column chromatography (silica gel, hexane/toluene) to provide di-tert-butyl-10,10'-(2-(2-(4-(bis(4-chlorophenyl)amino)phenyl)-9H-carbazol-9-yl)-9H-fluorene-9,9-diyl)bis(decanoate) (3.55 g).

In a 100 mL four-necked flask, di-tert-butyl-10,10'-(2-(2-(4-(bis(4-chlorophenyl)amino)phenyl)-9H-carbazol-9-yl)-9H-fluorene-9,9-diyl)bis(decanoate) (3.55 g), bispinacolatodiborane (2.89 g), potassium acetate (KOAc) (1.95 g), $Pd_2(dba)_3$ (0.178 g), 2-dicyclohexylphosphino-2',4',6'-triisopropylbiphenyl (XPhos) (0.231 g), and 1,4-dioxane (47 mL) were combined and stirred under a nitrogen atmosphere for 4 hours. The reaction solution was cooled to room temperature, and the solids were removed by filtering through Celite. After removing the solvent by distillation under reduced pressure, the residue was dissolved in toluene (100 mL), and activated carbon (1 g) and zeolite (1 g) were added and stirred at 120° C. for 30 minutes. The solids were removed by filtering through Celite, and the filtrate was passed through silica gel. After removing the solvent by distillation under reduced pressure, ethanol (50 mL) was added and the mixture was stirred at 70° C. for 1 hour, filtered, and dried to provide Compound A-1 (3.82 g).

Synthesis Example 2

Synthesis of Compound A-2

Compound A-2 was synthesized according to the following reaction.

Reaction Scheme A-2

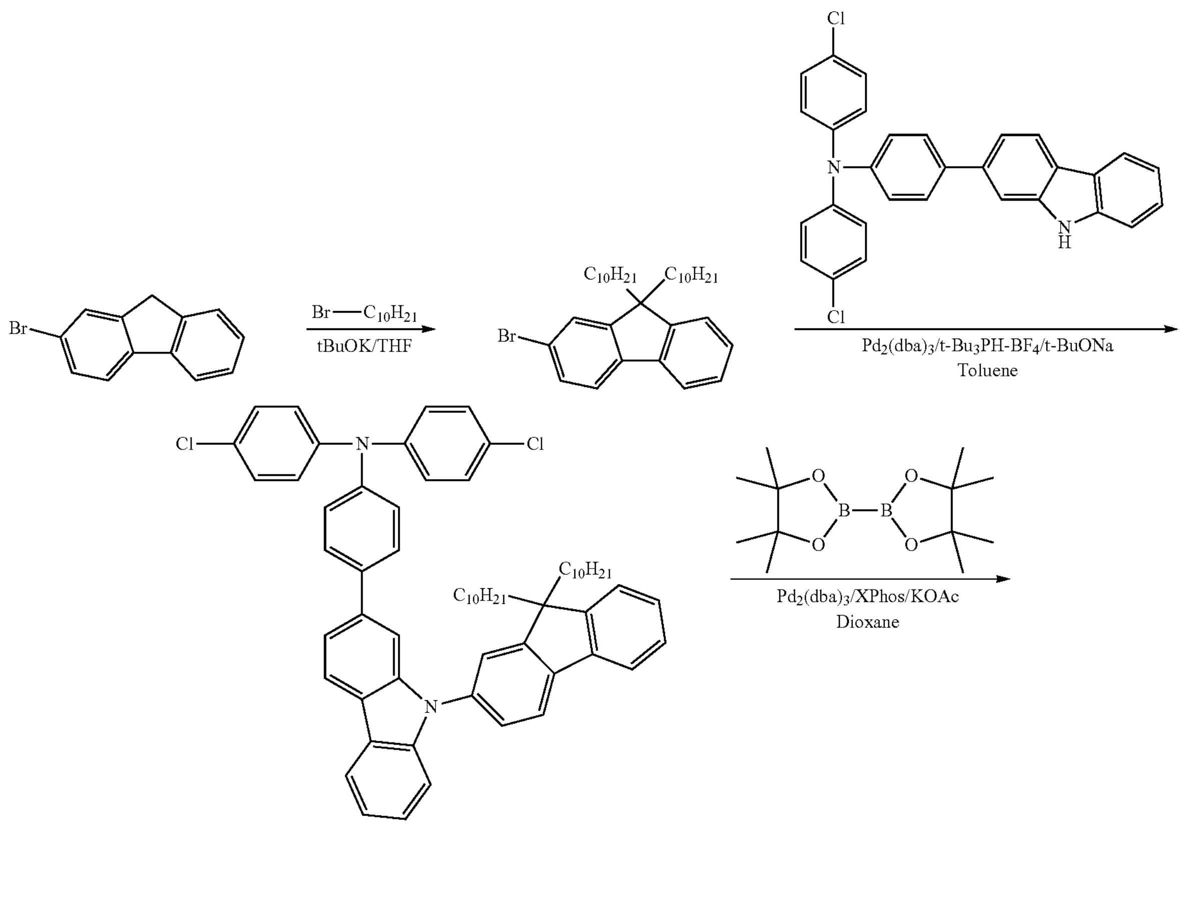

-continued

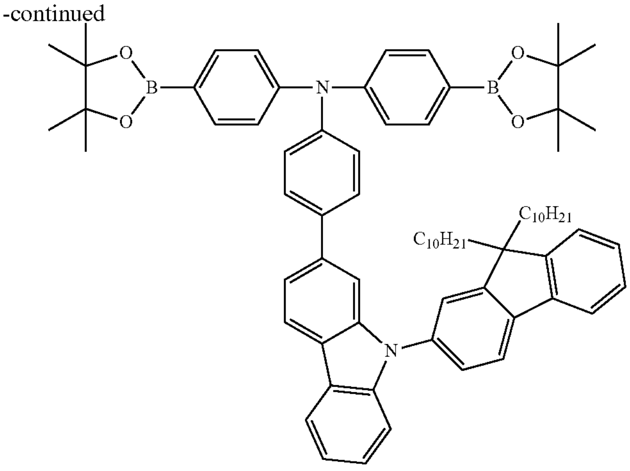

A-2

In a 1 L four-necked flask, 10-bromodecane (25.0 g) and THF (200 mL) were combined and stirred under a nitrogen atmosphere at 0° C. Subsequently, potassium tert-butoxide (12.6 g) was added and stirred for 10 minutes. A solution of 2-bromofluorene (5.31 g) in THF (55 mL) was added dropwise and then stirred for 1 hour. The reaction mixture was allowed to warm to room temperature and was stirred at room temperature for 12 hours. After addition of water (100 mL) and removal of the solvent by distillation under reduced pressure, the residue was extracted with ethyl acetate, washed with water, and dried with magnesium sulfate. The solvent was removed by distillation under reduced pressure to provide 2-bromo-9,9-di-n-decyl-9H-fluorene (18.7 g).

In a 200 mL four-necked flask, 2-bromo-9,9-di-n-decyl-9H-fluorene (5.26 g), N-(4-(9H-carbazolyl)phenyl)-4-chloro-N-(4-chlorophenyl)aniline (5.88 g), tris(dibenzylideneacetone)dipalladium (0) ($Pd_2(dba)_3$, 0.251 g), tri-tert-butylphosphoniumtetrafluoroborate (tert-$Bu_3PH{\cdot}BF_4$, 0.334 g), sodium tert-butoxide (4.40 g), and toluene (55 mL) were combined and stirred under a nitrogen atmosphere at 100° C. for 3 hours. After the solids were removed by filtering through Celite, activated carbon (3.0 g) and zeolite (3.0 g) were added to the filtrate and stirred at 110° C. for 30 minutes. The solids were removed by filtering through Celite, and the filtrate was passed through silica gel. After removing the solvent by distillation under reduced pressure, the residue was purified by column chromatography (silica gel, hexane/toluene) to provide 4-chloro-N-(4-chlorophenyl)-N-(4-(9-(9,9-di-n-decyl-9H-fluoren-2-yl)-9H-carbazol-2-yl)phenyl)aniline (7.35 g).

In a 100 mL four-necked flask, 4-chloro-N-(4-chlorophenyl)-N-(4-(9-(9,9-di-n-decyl-9H-fluoren-2-yl)-9H-carbazol-2-yl)phenyl)aniline (7.35 g), bispinacolatodiborane (7.07 g), potassium acetate (4.68 g), $Pd_2(dba)_3$ (0.436 g), XPhos (0.568 g), and 1,4-dioxane (65 mL) were combined and refluxed under a nitrogen atmosphere for 4 hours. The reaction mixture was cooled to room temperature, and the solids were removed by filtering through Celite. After removing the solvent by distillation under reduced pressure, the residue was dissolved in toluene (100 mL), and activated carbon (2 g) and zeolite (2 g) were added and stirred at 120° C. for 30 minutes. The solids were removed by filtering through Celite, and the filtrate was passed through silica gel. After removing the solvent by distillation under reduced pressure, the residue was recrystallized with acetonitrile and dried to provide Compound A-2 (7.35 g).

Synthesis Example 3

Synthesis of Compound B-1

Compound B-1 was synthesized according to the following reaction.

Reaction Scheme B-1

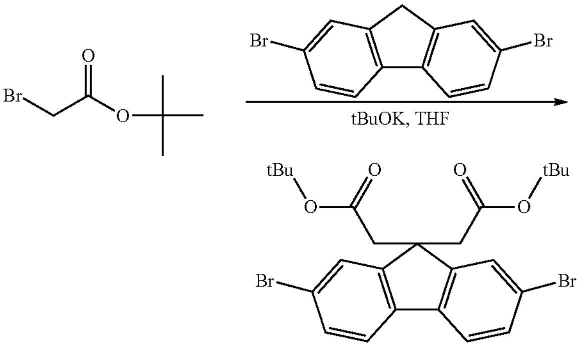

B-1

In a 1 L four-necked flask, tert-butyl bromoacetate (25.0 g) and THF (400 mL) were combined and stirred under a nitrogen atmosphere at 0° C. Subsequently, potassium tert-butoxide (14.3 g) was added and stirred for 10 minutes. A solution of 2,7-dibromofluorene (13.8 g) in THF (80 mL) was added dropwise and stirred for 1 hour. The reaction mixture was allowed to warm to room temperature and stirring was continued at room temperature for 12 hours. After adding water (100 mL) and removing the solvent by distillation under reduced pressure, the residue was extracted with ethyl acetate, washed with water, and dried with magnesium sulfate. After removing the solvent by distillation under reduced pressure, the residue was recrystallized with ethyl acetate to provide Compound B-1 (18.2 g).

Synthesis Example 4

Synthesis of Compound B-2

Compound B-2 was synthesized according to the following reaction.

Reaction Scheme B-2

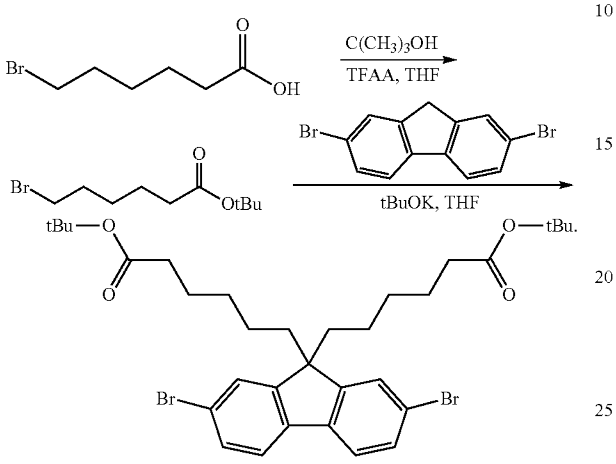

B-2

In a 1 L four-necked flask, 6-bromohexanoic acid (50.0 g) and THF (400 mL) were combined and stirred under a nitrogen atmosphere at room temperature. Subsequently, anhydrous trifluoroacetic acid (215 g) was added dropwise and stirred for 1 hour. Then, tert-butanol (114 g) was added dropwise and stirred for 12 hours. The resultant mixture was neutralized with a saturated aqueous sodium bicarbonate solution, extracted with ethyl acetate after removing THF under reduced pressure distillation, washed with water, and dried with magnesium sulfate. The solvent was removed by distillation under reduced pressure to provide tert-butyl 6-bromohexanoate (58.0 g).

In a 1 L four-necked flask, tert-butyl 6-bromohexanoate (15.0 g) and THF (400 mL) were combined and stirred under a nitrogen atmosphere at 0° C. Subsequently, potassium tert-butoxide (6.70 g) was added and stirred for 10 minutes. Then, a solution of 2,7-dibromofluorene (6.45 g) in THF (65 mL) was added dropwise and stirred for 1 hour. The reaction mixture was allowed to warm to room temperature and stirring was continued at room temperature for 12 hours. After adding water (100 mL) and removing the solvent by distillation under reduced pressure, the residue was extracted with ethyl acetate, washed with water, and dried with magnesium sulfate. After removing the solvent by distillation under reduced pressure, the residue was recrystallized with ethyl acetate to provide Compound B-2 (7.21 g).

Synthesis Example 5

Synthesis of Compound B-3

Compound B-3 was synthesized according to the following reaction.

Reaction Scheme B-3

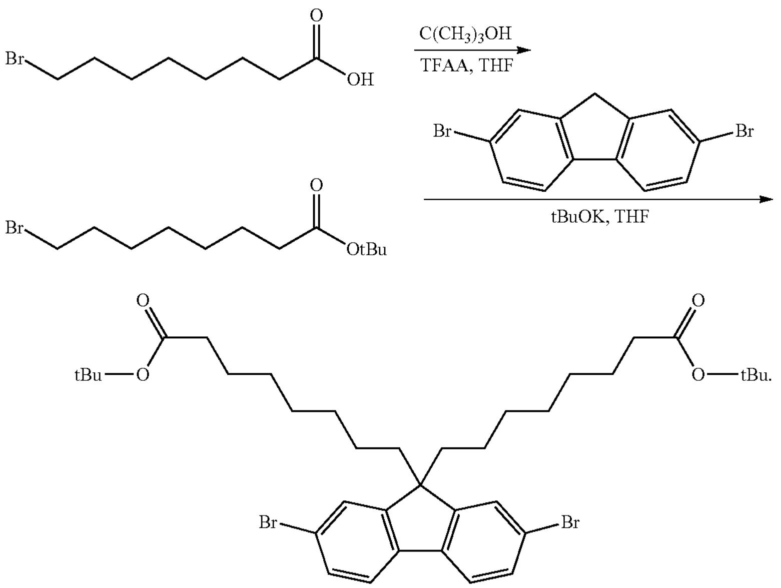

B-3

Compound B-3 (9.05 g) was obtained in the same manner as in Synthesis Example 4 except that 8-bromooctanoic acid was used instead of the 6-bromohexanoic acid in the first step. The mole ratio of each compound used in the synthesis was the same as in Synthesis Example 4.

Synthesis Example 6

Synthesis of Compound B-4

Compound B-4 was synthesized according to the following reaction.

Reaction Scheme B-4

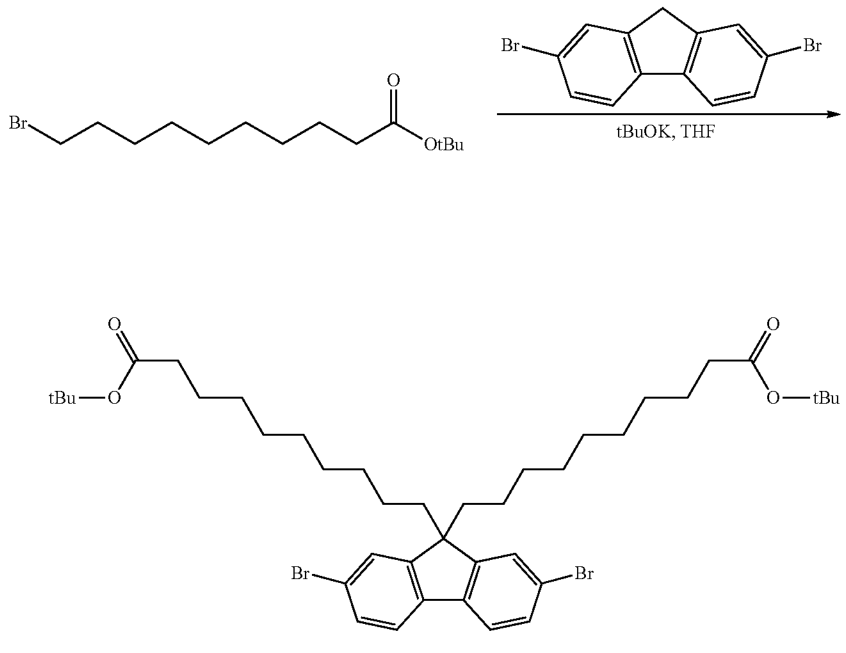

B-4

Compound B-4 (14.6 g) was obtained in the same manner as in Synthesis Example 3 except that tert-butyl 10-bromodecanoate was used instead of the tert-butyl bromoacetate in the first step. The mole ratio of each compound used in the synthesis was the same as in Synthesis Example 3.

Synthesis Example 7

Synthesis of Compound B-5

Compound B-5 was synthesized according to the following reaction.

Reaction Scheme B-5

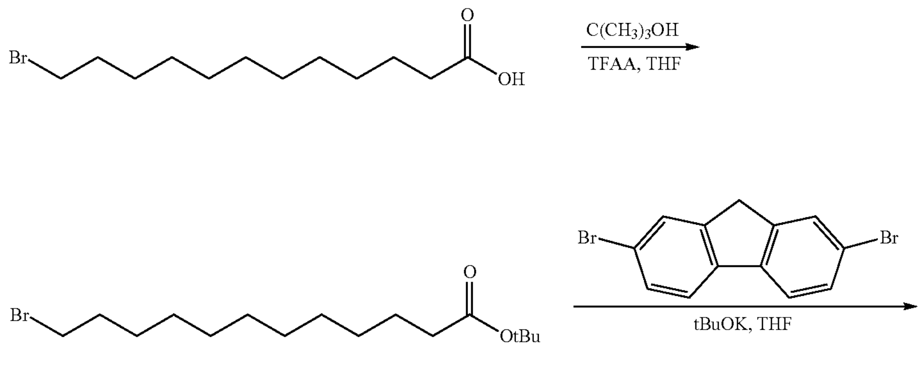

-continued

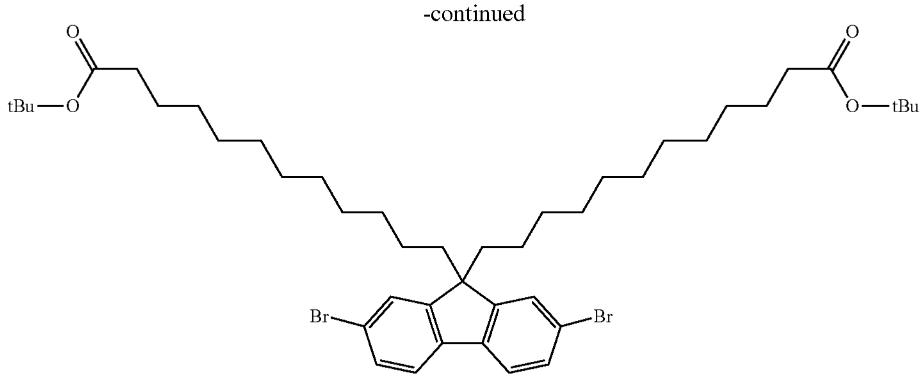

B-5

Compound B-5 (36.8 g) was obtained in the same manner as in Synthesis Example 4 except that 12-bromododecanoic acid was used instead of the 6-bromohexanoic acid in the first step. The mole ratio of each compound used in the synthesis was the same as in Synthesis Example 4.

Synthesis Example 8

Synthesis of Compound B-6

Compound B-6 was synthesized according to the following reaction.

Reaction Scheme B-6

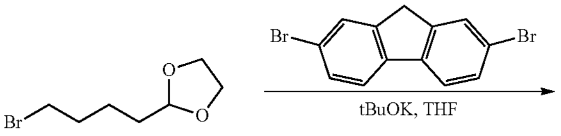

-continued

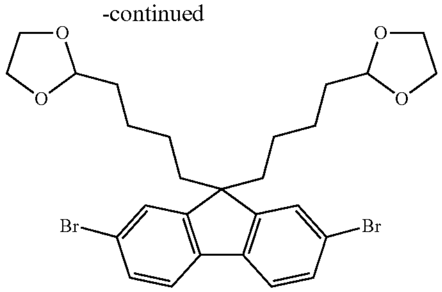

B-6

Compound B-6 (15.8 g) was obtained in the same manner as in Synthesis Example 3 except that 2-(4-bromobutyl)-1,3-dioxolane was used instead of the tert-butyl bromoacetate in the first step. The mole ratio of each compound used in the synthesis was the same as in Synthesis Example 3.

Synthesis Example 9

Synthesis of Compound C-1

Compound C-1 was synthesized according to the following reaction.

Reaction Scheme C-1

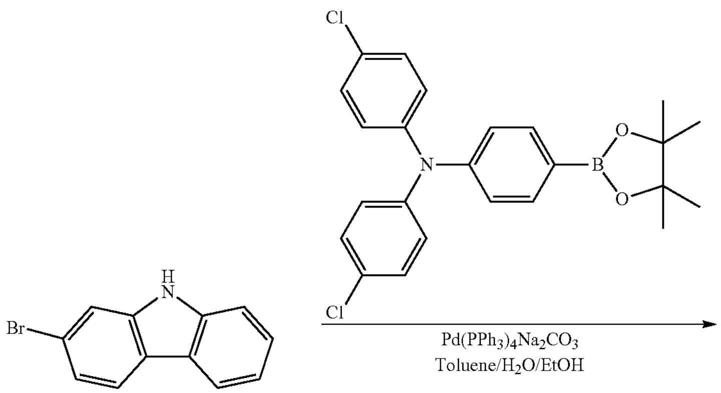

-continued

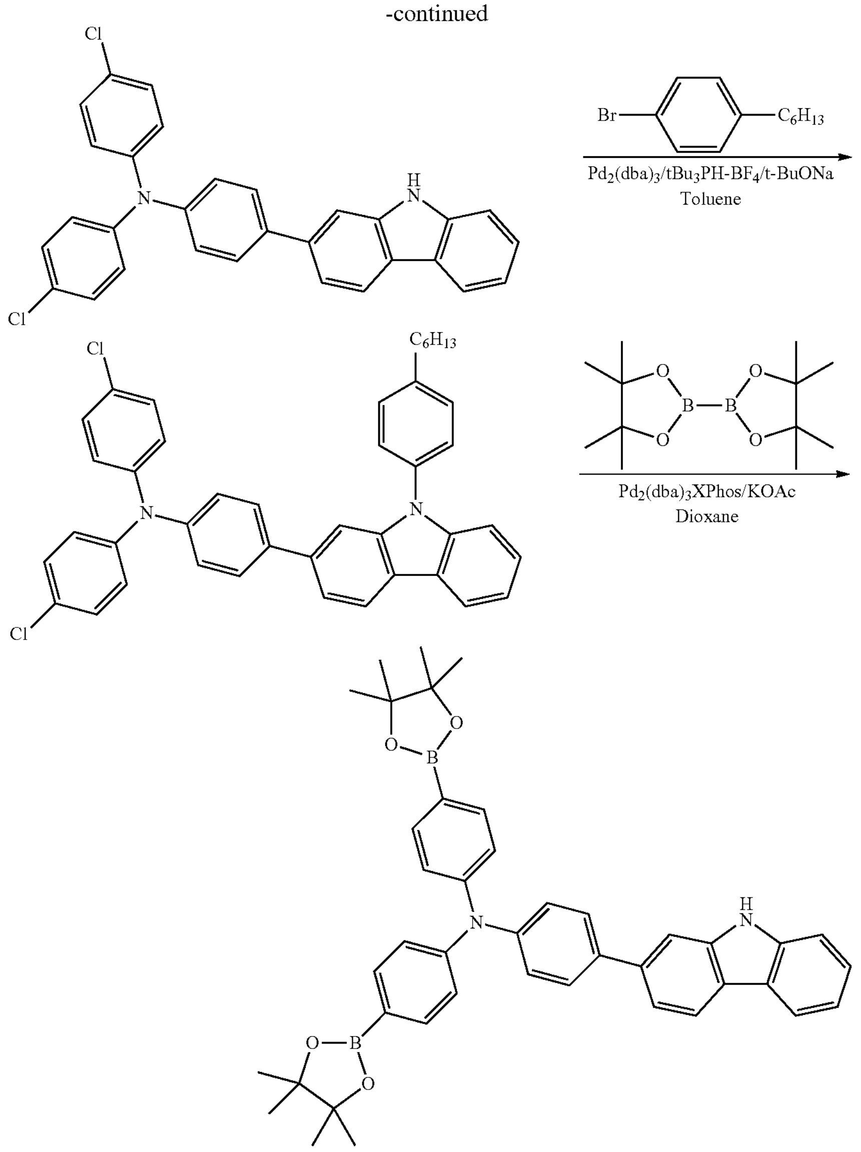

C-1

In a 100 mL four-necked flask, 2-bromocarbazole (20.0 g), 4-chloro-N-(4-chlorophenyl)-N-(4-(4,4,5,5-tetramethyl-1,3,2-dioxaborane-2-yl)phenyl)aniline (10.0 g), sodium carbonate (4.84 g), tetrakis(triphenylphosphine)palladium (0) ($Pd(PPh_3)_4$, 1.31 g), toluene (80 mL), ethanol (EtOH) (30 mL), and water (30 mL) were combined and stirred at 100° C. (bath temperature) for 3 hours. After cooling to room temperature, the layers were separated and the organic layer was washed with water (100 mL×2) and dried with magnesium sulfate. After removing the solvent by distillation under reduced pressure, toluene (200 mL) was added to the residue and then refluxed at 60° C. for 1 hour, the solids were removed by filtration and the filtrate was dried to provide N-(4-(9-carbazol-2-yl)phenyl)-4-chloro-N-(4-chlorophenyl) aniline (6.08 g).

In a four-necked flask under an argon atmosphere, N-(4-(9-carbazol-2-yl)phenyl)-4-chloro-N-(4-chlorophenyl)aniline (6.00 g), 1-bromo-4-hexylbenzene (3.00 g), tris(dibenzylideneacetone)dipalladium ($Pd_2(dba)_3$, 0.580 g), tri-tert-butylphosphoniumtetrafluoroborate ($t\text{-}Bu_3PH{\cdot}BF_4$, 0.276 g), sodium tert-butoxide (t-BuONa) (2.43 g), and toluene (60 mL) were combined and heated at 110° C. for 7 hours. The resultant mixture was cooled to room temperature and then solids were removed by filtering through Celite. After removing the solvent by distillation under reduced pressure, the residue was purified through column chromatography to provide 4-chloro-N-(4-chlorophenyl)-N-(4-(9-(4-hexylphenyl)-9-carbazol-2-yl)phenyl)aniline (1.60 g).

In a 50 mL 3-neck flask, 4-chloro-N-(4-chlorophenyl)-N-(4-(9-(4-hexylphenyl)-9-carbazol-2-yl)phenyl)aniline (1.60 g), bispinacolatodiborane (1.90 g), potassium acetate (KOAc) (1.47 g), tris(dibenzylideneacetone)dipalladium ($Pd_2(dba)_3$, 0.114 g), 2-dicyclohexylphosphino-2',4',6'-triisopropylbiphenyl] (XPhos, 0.177 g), and 1,4-dioxane (16 mL) were combined and stirred under a nitrogen atmosphere at 100° C. (a bath temperature) for 3 hours. After cooling to room temperature, solids were removed by filtering through Celite. After removing the solvent by distillation under reduced pressure, the residue was dissolved in a mixed solvent of toluene (20 mL) and hexane (40 mL), and activated carbon (2.0 g) was added and then, refluxed for 30 minutes. After the solids were removed by filtering through Celite the solvent was removed by distillation under reduced pressure, the residue was recrystallized with toluene/acetonitrile to provide Compound C-1 (1.85 g).

Synthesis Example 10

Synthesis of Compound C-2

Compound C-2 was synthesized according to the following reaction.

Reaction Scheme C-2

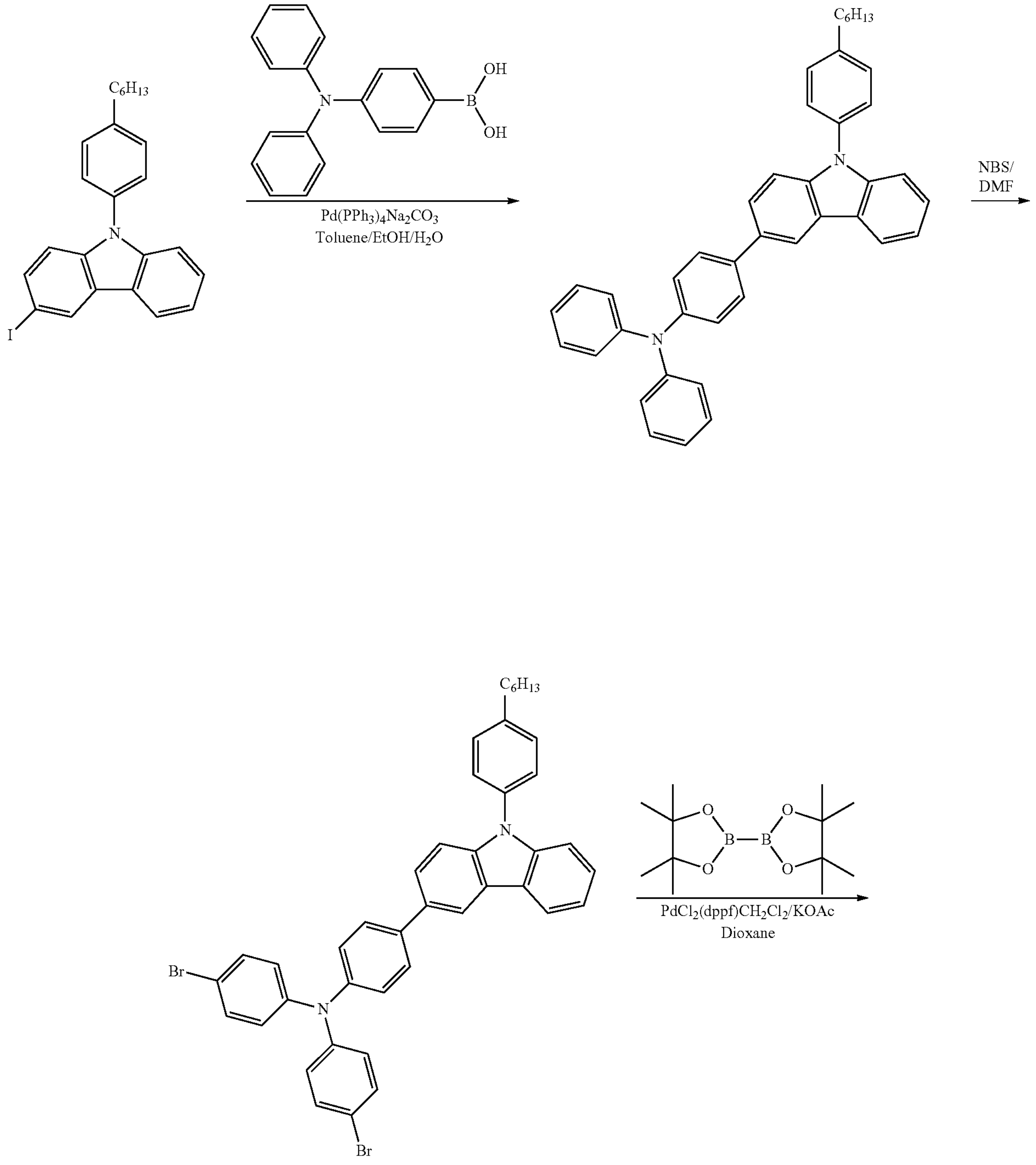

-continued

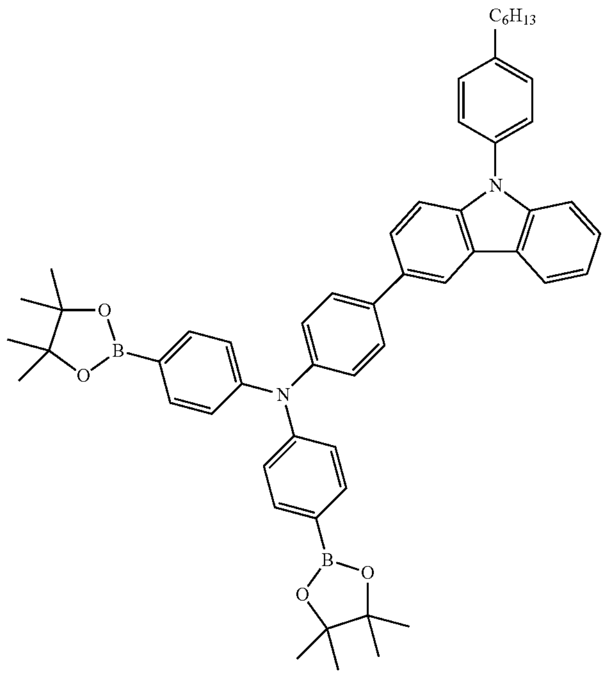

C-2

In a 1 L four-necked flask, 9-(4-hexylphenyl)-3-iodo-9-carbazole (20.0 g), 4-(diphenylamino)phenylboronic acid (15.3 g), sodium carbonate (9.51 g), tetrakis(triphenylphosphine)palladium (0) ($Pd(PPh_3)_4$, 2.49 g), toluene (221 mL), ethanol (110 mL), and water (110 mL) were combined and stirred at 120° C. (bath temperature) for 3 hours. After cooling to room temperature, the organic layer was separated from the aqueous layer. The organic layer was washed with water (100 mL×2) and dried with magnesium sulfate. After removing the solvent by distillation under reduced pressure, the residue was purified by column chromatography to provide 4-(9-(4-hexylphenyl)-9-carbazol-3-yl)-N,N-diphenyl)aniline (17.7 g).

In a 500 mL four-necked flask, 4-(9-(4-hexylphenyl)-9-carbazol-3-yl)-N,N-diphenyl)aniline (17.7 g) and N,N-dimethyl formamide (DMF, 310 mL) were combined, ice-cooled, and a solution of N-bromosuccinimide (NBS) (11.7 g) in DMF (30 mL) under a nitrogen atmosphere was added dropwise and stirred for 6 hours. After removal of the solids by filtration, washing the filtrate with methanol (800 mL) and water (800 mL), and vacuum-drying provided 4-bromo-N-(4-bromophenyl)-N-(4-(9-(4-hexylphenyl)-9-carbazol-3-yl)phenyl)aniline (14.0 g).

In a 500 mL four-necked flask, 4-bromo-N-(4-bromophenyl)-N-(4-(9-(4-hexylphenyl)-9-carbazol-3-yl)phenyl)aniline (14.0 g), bispinacolatodiborane (14.8 g), potassium acetate (KOAc) (11.4 g), an [1,1'-bis(diphenylphosphino)ferrocene] dichloro palladium(II) complex with dichloromethane ($PdCl_2(dppf)CH_2Cl_2$, 0.477 g), and 1,4-dioxane (160 mL) were combined and refluxed under a nitrogen atmosphere at 100° C. for 4 hours. The reaction mixture was cooled to room temperature, and the solids were removed by filtering through Celite and the filtrate was passed through silica gel. After removing the solvent by distillation under reduced pressure, the residue was dissolved in toluene (200 mL), and activated carbon (14.2 g) was added and then refluxed for 30 minutes. After filtering the activated carbon and removing the solvent by distillation under reduced pressure, the solids were recrystallized with a mixed solvent solution of toluene and acetonitrile and dried to provide Compound C-2 (11.9 g).

Synthesis Example 11
Synthesis of Compound C-3
Compound C-3 was synthesized according to the following reaction.
Reaction Scheme C-3
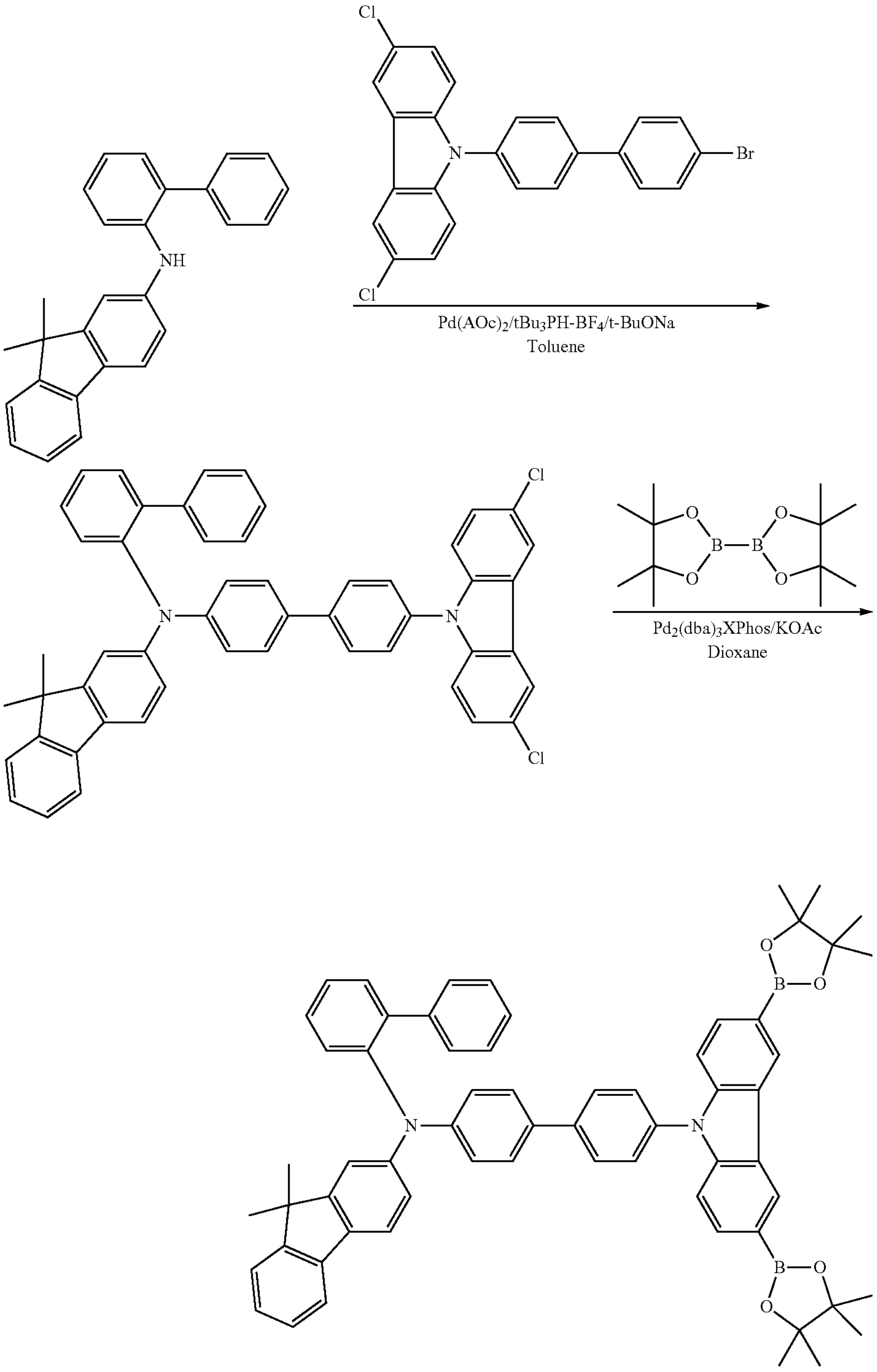
C-3

In a 500 mL four-necked flask, 2-(2-biphenylyl)amino-9,9-dimethylfluorene (12.0 g), 9-(4'bromo-[1,1'-biphenyl]-4-yl)-3,6-dichloro-9H-carbazole (15.5 g), palladium acetate ($Pd(OAc)_2$, 0.372 g), tri-tert-butylphosphonium tetrafluoroborate ($t-Bu_3PH·BF_4$, 0.722 g), sodium tert-butoxide (6.38 g), and toluene (330 mL) were combined and stirred under a nitrogen atmosphere at 100° C. for 1 hour. After the solids were removed by filtering through Celite, activated carbon (6.0 g) and zeolite (6.0 g) were added and then stirred at 110° C. for 30 minutes. After the solids were removed by filtering through Celite, the filtrate was passed through silica gel. After removing the solvent by distillation under reduced pressure, the residue was purified by column chromatography (silica gel, hexane/toluene) to provide N-([1,1'-biphenyl]-2-yl)-N-(4'-(3,6-dichloro-9H-carbazol-9-yl)-[1,1'-biphenyl]-4-yl)-9,9'-dimethyl-9H-fluorene-2-amine (18.2 g, 73.4%).

In a 200 mL four-necked flask, N-([1,1'-biphenyl]-2-yl)-N-(4'-(3,6-dichloro-9H-carbazol-9-yl)-[1,1'-biphenyl]-4-yl)-9,9'-dimethyl-9H-fluorene-2-amine (9.00 g), bispinacolatodiborane (7.64 g), potassium acetate (7.08 g), tris(dibenzylideneacetone)dipalladium ($Pd_2(dba)_3$, 0.551 g), 2-dicyclohexylphosphino-2',4',6'-triisopropylbiphenyl (XPhos, 0.860 g), and 1,4-dioxane (100 mL) were combined and refluxed under a nitrogen atmosphere for 4 hours. The reaction solution was cooled to room temperature and then, the solids were removed by filtering through Celite. After removing the solvent by distillation under reduced pressure, the residue was dissolved in toluene (100 mL), and activated carbon (3 g) and zeolite (3 g) were added and then stirred at 130° C. for 30 minutes. After the solids were removed by filtering through Celite, the filtrate was passed through silica gel. After removing the solvent by distillation under reduced pressure, the residue was recrystallized with a mixed solvent of toluene and hexane and dried to provide Compound C-3 (7.88 g, 63.5%).

Example 1-1

Under a nitrogen atmosphere, Compound C-1 (1.441 g) of Synthesis Example 9, 2,7-dibromo-9,9-di-n-decylfluorene (Hereinafter, referred to as "Compound D-1") (0.953 g), Compound B-4 (0.131 g) of Synthesis Example 6, palladium acetate (3.90 mg), tris(2-methoxyphenyl)phosphine (36.8 mg), toluene (54 mL), and a 20 mass % tetraethylammonium hydroxide aqueous solution (5.88 g) were combined in a four-necked flask and the reaction mixture was stirred at 85° C. for 6 hours. Subsequently, phenylboronic acid (210 mg), bis(triphenylphosphine)palladium(II) dichloride (73.7 mg), a 20 mass % tetraethylammonium hydroxide aqueous solution (5.88 g) were added and the reaction mixture was stirred at 85° C. for 6 hours. Then, sodium N,N-diethyldithiocarbamate trihydrate (8.97 g) dissolved in ion-exchanged water (50 mL) was added and the reaction mixture was stirred at 85° C. for 2 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-1 (1.01 g). The weight average molecular weight (Mw) and polydispersity (Mw/Mn) of the obtained Polymer Compound P-1 were measured by SEC. The measured weight average molecular weight (Mw) and polydispersity (Mw/Mn) of Polymer Compound P-1 were 83,600 g/mol and 2.39, respectively.

The polymer Compound P-1 obtained was approximated to contain the following monomer ratio of structural units based on the monomer input ratio of the synthesis.

Polymer Compound P-1

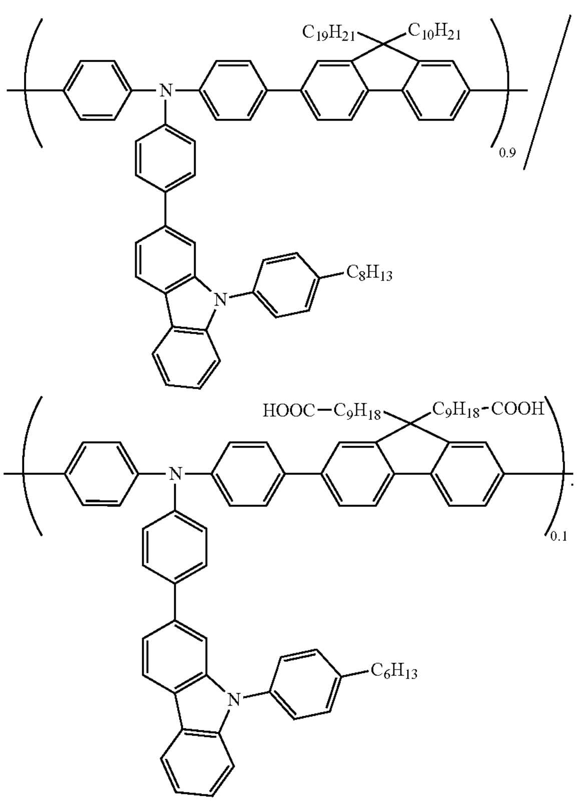

Example 1-2

Under a nitrogen atmosphere, Compound C-1 (1.421 g) of Synthesis Example 9, Compound D-1 (0.825 g), Compound B-4 (0.259 g) of Synthesis Example 6, palladium acetate (3.90 mg), tris(2-methoxyphenyl)phosphine (36.8 mg), toluene (54 mL), and a 20 mass % tetraethylammonium hydroxide aqueous solution (8.90 g) were combined in a four-necked flask and then stirred at 85° C. for 6 hours. Subsequently, phenylboronic acid (209 mg), bis(triphenylphosphine)palladium(II) dichloride (72.7 mg), and a 20 mass % tetraethylammonium hydroxide aqueous solution (8.90 g) were added and then stirred at 85° C. for 6 hours. Then, sodium N,N-diethyldithiocarbamate trihydrate (8.97 g) dissolved in ion-exchanged water (50 mL) was added and then stirred at 85° C. for 2 hours. After separating the organic layer from the aqueous layer, the solvent in the organic layer was distilled off under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtered, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-2 (1.23 g). The weight average molecular weight (Mw) and polydispersity (Mw/Mn) of the obtained Polymer Compound P-2 were measured by SEC. The measured weight average molecular weight (Mw) and polydispersity (Mw/Mn) of Polymer Compound P-2 were 108,000 g/mol and 2.24, respectively.

The following monomer ratio of structural units for Polymer Compound P-2 was approximated based on the monomer input ratio of the synthesis.

Polymer Compound P-2

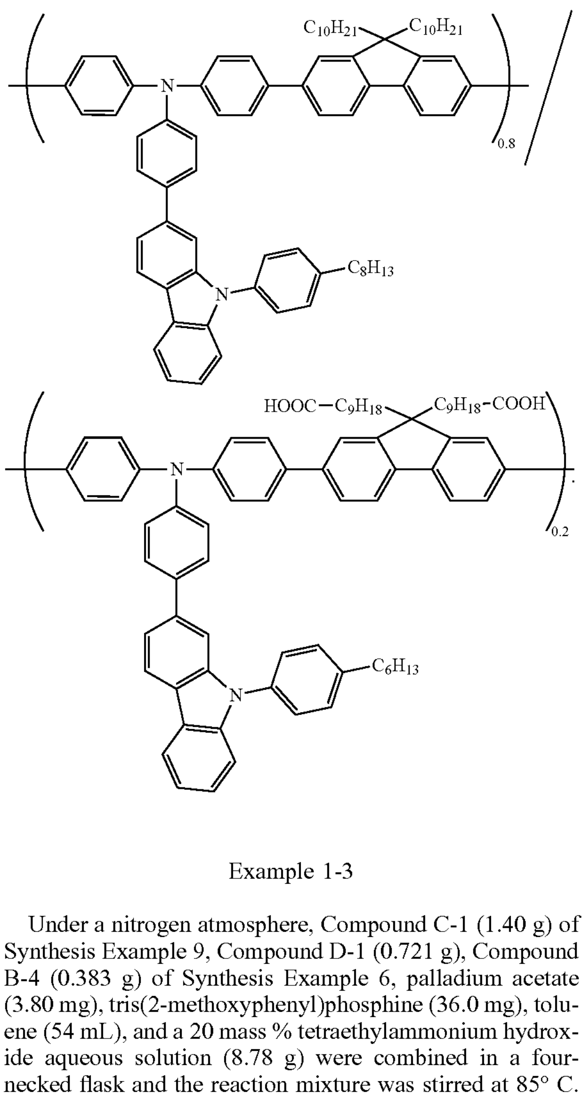

Example 1-3

Under a nitrogen atmosphere, Compound C-1 (1.40 g) of Synthesis Example 9, Compound D-1 (0.721 g), Compound B-4 (0.383 g) of Synthesis Example 6, palladium acetate (3.80 mg), tris(2-methoxyphenyl)phosphine (36.0 mg), toluene (54 mL), and a 20 mass % tetraethylammonium hydroxide aqueous solution (8.78 g) were combined in a four-necked flask and the reaction mixture was stirred at 85° C. for 6 hours. Subsequently, phenylboronic acid (206 mg), bis(triphenylphosphine)palladium (II) dichloride (71.7 mg), and a 20 mass % tetraethylammonium hydroxide aqueous solution (8.78 g) were added and the reaction mixture was stirred at 85° C. for 6 hours.

Sodium N,N-diethyldithiocarbamate trihydrate (5.76 g) dissolved in ion-exchanged water (50 mL) was added, and the mixture was stirred at 85° C. for 2 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-3 (1.16 g). The weight average molecular weight (Mw) and polydispersity (Mw/Mn) of the obtained Polymer Compound P-3 were measured by SEC. The measured weight average molecular weight (Mw) and polydispersity (Mw/Mn) of Polymer Compound P-3 were 125,000 g/mol and 2.24, respectively.

The following monomer ratio of structural units for Polymer Compound P-3 was approximated based on the monomer input ratio of the synthesis.

Polymer Compound P-3

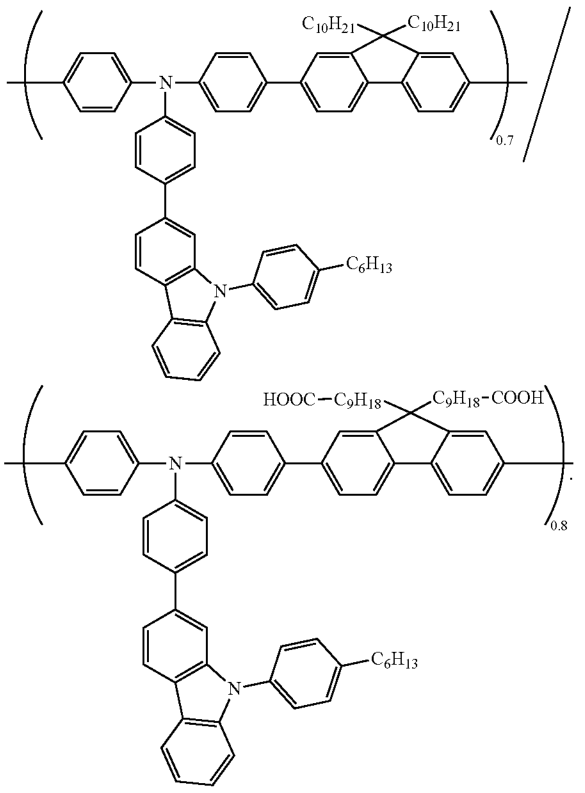

Example 1-4

Under a nitrogen atmosphere, Compound C-1 (1.36 g) of Synthesis Example 9, Compound D-1 (0.501 g), Compound B-4 (0.621 g) of Synthesis Example 6, palladium acetate (3.70 mg), tris(2-methoxyphenyl)phosphine (35.1 mg), toluene (54 mL), and a 20 mass % tetraethylammonium hydroxide aqueous solution (8.55 g) were combined in a four-necked flask and the reaction mixture was stirred at 85° C. for 6 hours. Subsequently, phenylboronic acid (201 mg), bis(triphenylphosphine)palladium(II) dichloride (69.8 mg), and a 20 mass % tetraethylammonium hydroxide aqueous solution (8.55 g) were added and the reaction mixture was stirred at 85° C. for 6 hours. Then, sodium N,N-diethyldithiocarbamate trihydrate (5.60 g) dissolved in ion-exchanged water (50 mL) was added and the reaction mixture was stirred at 85° C. for 2 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-4 (1.00 g). The weight average molecular weight (Mw) and polydispersity (Mw/Mn) of the obtained Polymer Compound P-4 were measured by SEC. The measured weight average molecular weight (Mw) and polydispersity (Mw/Mn) of Polymer Compound P-4 were 383,000 g/mol and 3.01, respectively.

The following monomer ratio of structural units for Polymer Compound P-4 was approximated based on the monomer input ratio of the synthesis.

Polymer Compound P-4

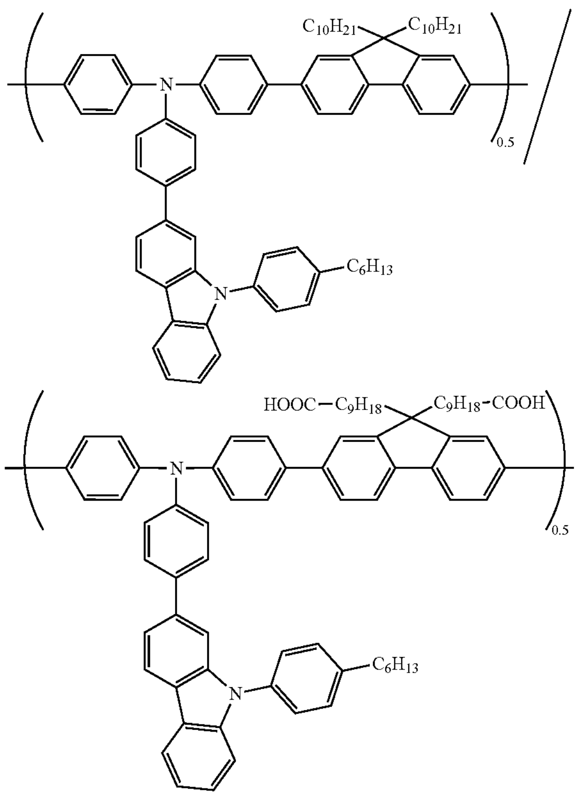

Example 1-5

Under a nitrogen atmosphere, Compound C-1 (1.33 g) of Synthesis Example 9, Compound D-1 (0.293 g), Compound B-4 (0.846 g) of Synthesis Example 6, palladium acetate (3.60 mg), tris(2-methoxyphenyl)phosphine (34.1 mg), toluene (54 mL), and a 20 mass % tetraethylammonium hydroxide aqueous solution (8.32 g) were combined in a four-necked flask and the reaction mixture was stirred at 85° C. for 6 hours. Subsequently, phenylboronic acid (195 mg), bis(triphenylphosphine)palladium(II) dichloride (68.0 mg), and a 20 mass % tetraethylammonium hydroxide aqueous solution (8.32 g) were added and the reaction mixture was stirred at 85° C. for 6 hours. Then, sodium N,N-diethyldithiocarbamate trihydrate (5.46 g) dissolved in ion-exchanged water (50 mL) was added and stirred at 85° C. for 2 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-5 (0.458 g). The weight average molecular weight (Mw) and polydispersity (Mw/Mn) of the obtained Polymer Compound P-5 were measured by SEC. The measured weight average molecular weight (Mw) and polydispersity (Mw/Mn) of Polymer Compound P-5 were 393,000 g/mol and 2.36, respectively.

The following monomer ratio of structural units for Polymer Compound P-5 was approximated based on the monomer input ratio of the synthesis.

Polymer Compound P-5

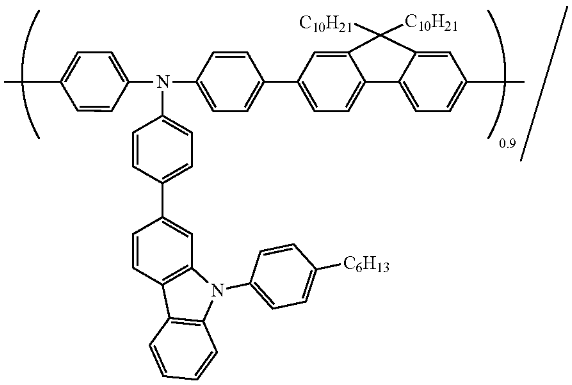

-continued

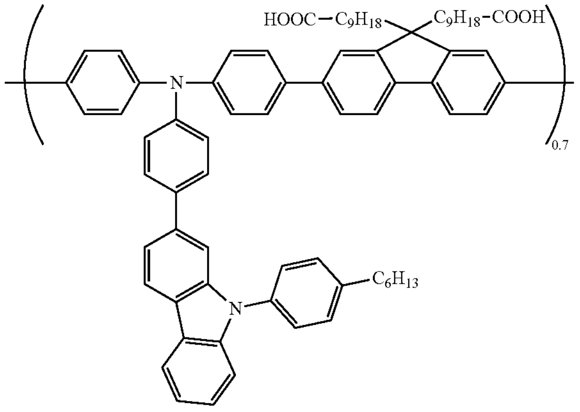

Example 1-6

Under a nitrogen atmosphere, Compound C-2 (1.44 g) of Synthesis Example 10, Compound D-1 (0.953 g), Compound B-4 (0.131 g) of Synthesis Example 6, palladium acetate (3.90 mg), tris(2-methoxyphenyl)phosphine (37.0 mg), toluene (54 mL), and a 20 mass % tetraethylammonium hydroxide aqueous solution (9.03 g) were combined in a four-necked flask and the reaction mixture was stirred at 85° C. for 6 hours. Subsequently, phenylboronic acid (212 mg), bis(triphenylphosphine)palladium(II) dichloride (73.7 mg), and a 20 mass % tetraethylammonium hydroxide aqueous solution (9.03 g) were added and stirred at 85° C. for 6 hours. Then, sodium N,N-diethyldithiocarbamate trihydrate (5.92 g) dissolved in ion-exchanged water (50 mL) was added and stirred at 85° C. for 2 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-6 (1.45 g). The weight average molecular weight (Mw) and polydispersity (Mw/Mn) of the obtained Polymer Compound P-6 were measured by SEC. The measured weight average molecular weight (Mw) and polydispersity (Mw/Mn) of Polymer Compound P-6 were 117,000 g/mol and 2.35, respectively.

The following monomer ratio of structural units for Polymer Compound P-6 was approximated based on the monomer input ratio of the synthesis.

Polymer Compound P-6

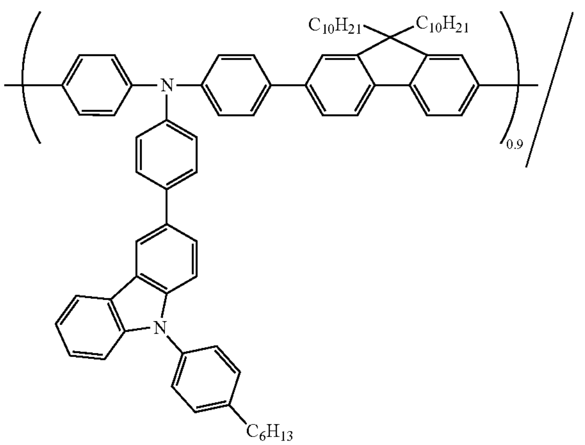

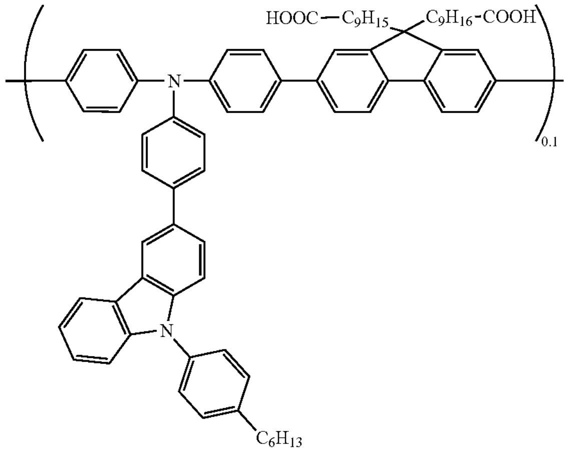

Example 1-7

Under a nitrogen atmosphere, Compound C-2 (1.40 g) of Synthesis Example 10, Compound D-1 (0.721 g), Compound B-4 (0.383 g) of Synthesis Example 6, palladium acetate (3.90 mg), tris(2-methoxyphenyl)phosphine (37.0 mg), toluene (54 mL), and a 20 mass % tetraethylammonium hydroxide aqueous solution (8.78 g) were combined in a four-necked flask and the reaction mixture was stirred at 85° C. for 6 hours. Subsequently, phenylboronic acid (206 mg), bis(triphenylphosphine)palladium (II) dichloride (71.7 mg), and a 20 mass % tetraethylammonium hydroxide aqueous solution (8.78 g) were added and the reaction mixture was stirred at 85° C. for 6 hours. After that, sodium N,N-diethyldithiocarbamate trihydrate (5.76 g) dissolved in ion-exchanged water (50 mL) was added, and the mixture was stirred at 85° C. for 2 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solid were washed with methanol and water and dried under vacuum to provide Polymer Compound P-7 (1.04 g). The weight average molecular weight (Mw) and polydispersity (Mw/Mn) of the obtained Polymer Compound P-7 were measured by SEC. The measured Mw and Mw/Mn of Polymer Compound P-7 were 143,000 g/mol and 2.37, respectively.

The following monomer ratio of structural units for Polymer Compound P-7 was approximated based on the monomer input ratio of the synthesis.

Polymer Compound P-7

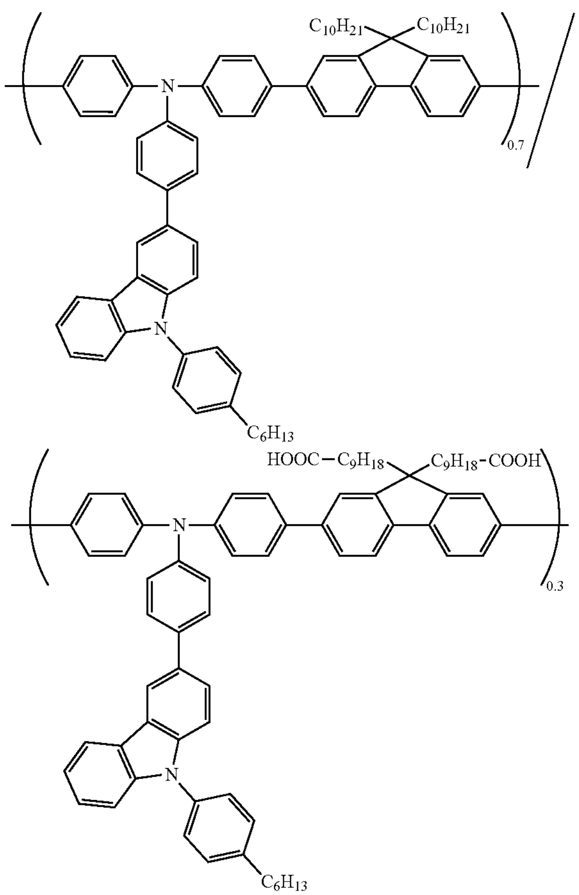

Example 1-8

Under a nitrogen atmosphere, Compound C-2 (1.36 g) of Synthesis Example 10, Compound D-1 (0.501 g), Compound B-4 (0.621 g) of Synthesis Example 6, palladium acetate (3.70 mg), tris(2-methoxyphenyl)phosphine (37.0 mg), toluene (54 mL), and a 20 mass % tetraethylammonium hydroxide aqueous solution (8.55 g) were combined in a four-necked flask and the reaction mixture was stirred at 85° C. for 6 hours. Subsequently, phenylboronic acid (479 mg), bis(triphenylphosphine)palladium(II) dichloride (69.8 mg), and a 20 mass % tetraethylammonium hydroxide aqueous solution (8.55 g) were added and the reaction mixture was stirred at 85° C. for 6 hours. After that, sodium N,N-diethyldithiocarbamate trihydrate (5.76 g) dissolved in ion-exchanged water (50 mL) was added, and the mixture was stirred at 85° C. for 2 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-8 (1.01 g). The weight average molecular weight (Mw) and polydispersity (Mw/Mn) of the obtained Polymer Compound P-8 were measured by SEC. The measured weight average molecular weight (Mw) and polydispersity (Mw/Mn) of Polymer Compound P-8 were 99,600 g/mol and 1.74, respectively.

The following monomer ratio of structural units for Polymer Compound P-8 was approximated based on the monomer input ratio of the synthesis.

Polymer Compound P-8

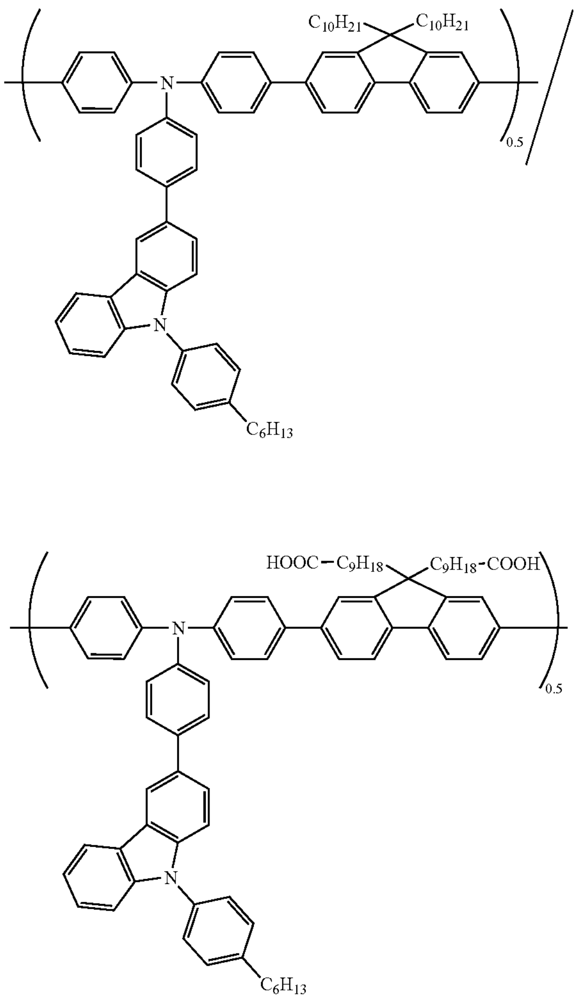

Example 1-9

Under a nitrogen atmosphere, Compound C-2 (1.32 g) of Synthesis Example 10, Compound D-1 (0.293 g), Compound B-4 (0.846 g) of Synthesis Example 6, palladium acetate (3.60 mg), tris(2-methoxyphenyl)phosphine (34.1 mg), toluene (54 mL), and a 20 mass % tetraethylammonium hydroxide aqueous solution (8.32 g) were combined in a four-necked flask and the reaction mixture was stirred at 85° C. for 6 hours. Subsequently, phenylboronic acid (467 mg), bis(triphenylphosphine)palladium(II) dichloride (68.0 mg), and a 20 mass % tetraethylammonium hydroxide aqueous solution (8.32 g) were added and the reaction mixture was stirred at 85° C. for 6 hours. After that, sodium N,N-diethyldithiocarbamate trihydrate (5.76 g) dissolved in ion-exchanged water (50 mL) was added, and the mixture was stirred at 85° C. for 2 hours. After separating the organic layer from the aqueous layer, the organic layer was removed by distillation under reduced pressure, and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-9 (1.11 g). The weight average molecular weight (Mw) and polydispersity (Mw/Mn) of the obtained Polymer Compound P-9 were measured by SEC. The measured weight average molecular weight (Mw) and polydispersity (Mw/Mn) of Polymer Compound P-9 were 355,000 g/mol and 2.32, respectively.

The following monomer ratio of structural units for Polymer Compound P-9 was approximated based on the monomer input ratio of the synthesis.

Polymer Compound P-9

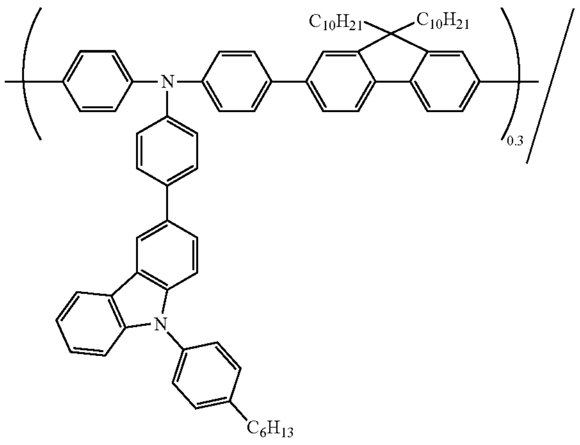

-continued

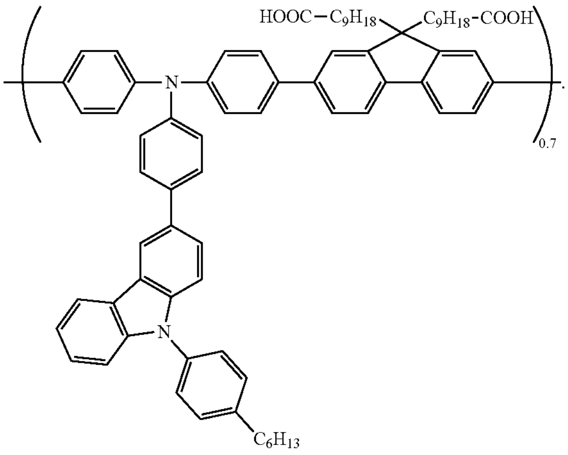

Example 1-10

Under a nitrogen atmosphere, Compound C-1 (1.50 g) of Synthesis Example 9, Compound D-1 (0.551 g), Compound B-1 (0.503 g) of Synthesis Example 3, palladium acetate (4.10 mg), tris(2-methoxyphenyl)phosphine (38.5 mg), toluene (54 mL), and a 20 mass % tetraethylammonium hydroxide aqueous solution (9.40 g) were combined in a four-necked flask and then, the reaction mixture was stirred at 85° C. for 6 hours. Subsequently, phenylboronic acid (220 mg), bis(triphenylphosphine)palladium(II) dichloride (76.8 mg), a 20 mass % tetraethylammonium hydroxide aqueous solution (9.40 g), and a sodium carbamate trihydrate (6.16 g) were added and the reaction mixture was stirred at 85° C. for 6 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-10 (1.15 g). The weight average molecular weight (Mw) and polydispersity (Mw/Mn) of the obtained Polymer Compound P-10 were measured by SEC. The measured weight average molecular weight (Mw) and polydispersity (Mw/Mn) of Polymer Compound P-10 were 137,000 g/mol and 1.63, respectively.

The following monomer ratio of structural units for Polymer Compound P-10 was approximated based on the monomer input ratio of the synthesis.

Polymer Compound P-10

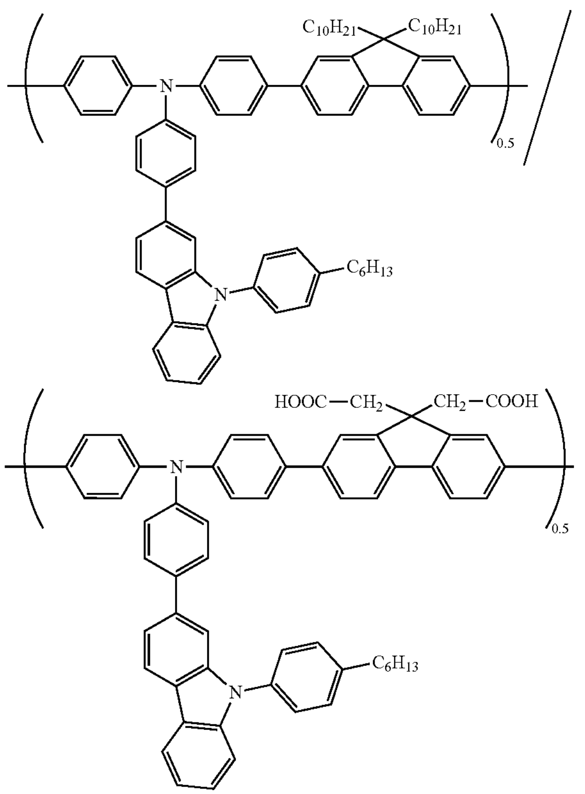

Example 1-11

Under a nitrogen atmosphere, Compound C-1 (1.41 g) of Synthesis Example 9, Compound D-1 (0.521 g), Compound B-2 (0.573 g) of Synthesis Example 4, palladium acetate (3.90 mg), tris(2-methoxyphenyl)phosphine (36.5 mg), toluene (54 mL), and a 20 mass % tetraethylammonium hydroxide aqueous solution (8.89 g) were combined in a four-necked flask and the reaction mixture was stirred at 85° C. for 6 hours. Subsequently, phenylboronic acid (208 mg), bis(triphenylphosphine)palladium(II) dichloride (72.6 mg), a 20 mass % tetraethylammonium hydroxide aqueous solution (8.89 g), and sodium carbamate trihydrate (6.16 g) were added and the reaction mixture was stirred at 85° C. for 6 hours. After separating an organic layer from an aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-11 (1.10 g). The weight average molecular weight (Mw) and polydispersity (Mw/Mn) of the obtained Polymer Compound P-11 were measured by SEC. The measured weight average molecular weight (Mw) and polydispersity (Mw/Mn) of Polymer Compound P-11 were 86,200 g/mol and 1.87, respectively.

The following monomer ratio of structural units for Polymer Compound P-11 was approximated based on the monomer input ratio of the synthesis.

Polymer Compound P-11

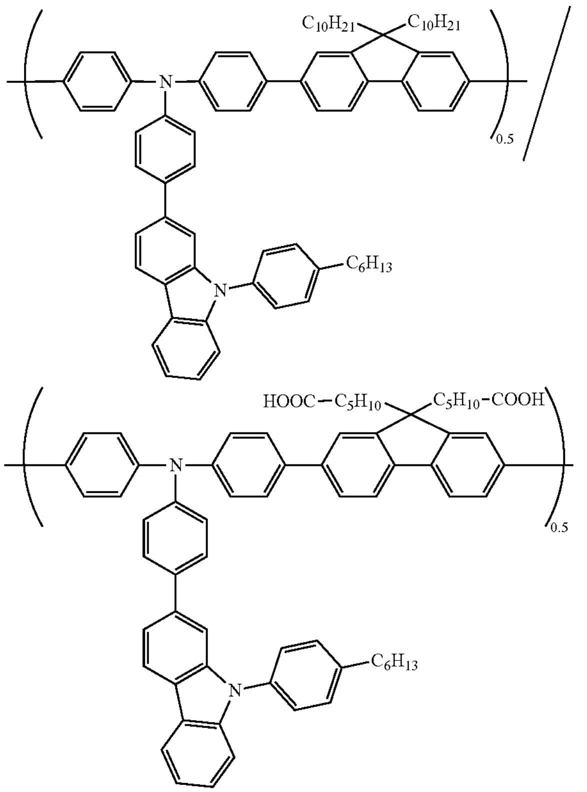

Example 1-12

Under a nitrogen atmosphere, Compound C-1 (1.38 g) of Synthesis Example 9, Compound D-1 (0.508 g), Compound B-3 (0.605 g) of Synthesis Example 5, palladium acetate (3.80 mg), tris(2-methoxyphenyl)phosphine (36.5 mg), toluene (54 mL), and a 20 mass % tetraethylammonium hydroxide aqueous solution (8.66 g) were combined in a four-necked flask and the reaction mixture was stirred at 85° C. for 6 hours. Subsequently, phenylboronic acid (203 mg), bis(triphenylphosphine)palladium(II) dichloride (70.7 mg), a 20 mass % tetraethylammonium hydroxide aqueous solution (8.66 g), and sodium carbamate trihydrate (5.68 g) were added and the reaction mixture was stirred at 85° C. for 6 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-12 (1.17 g). The weight average molecular weight (Mw) and polydispersity (Mw/Mn) of the obtained Polymer Compound P-12 were measured by SEC. the measured weight average molecular weight (Mw) and polydispersity (Mw/Mn) of Polymer Compound P-12 were 75,100 g/mol and 1.83, respectively.

The following monomer ratio of structural units for Polymer Compound P-12 was approximated based on the monomer input ratio of the synthesis.

Polymer Compound P-12

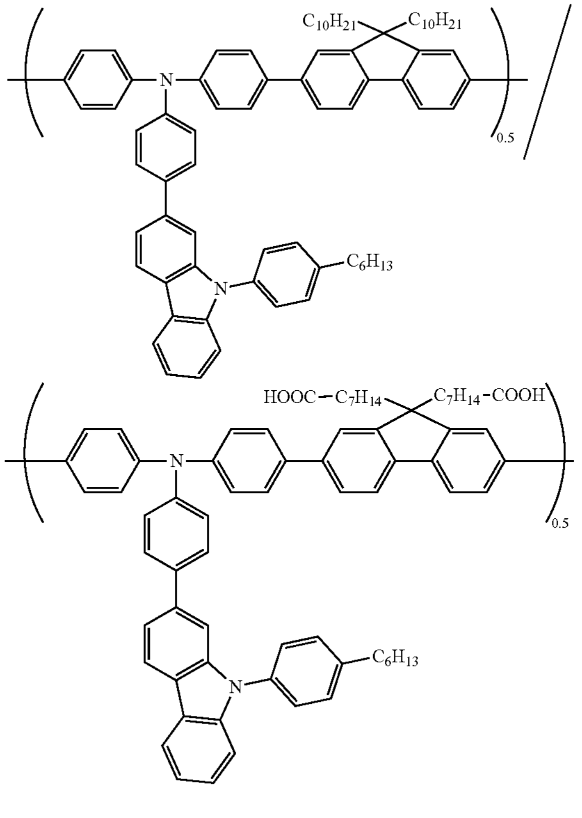

Example 1-13

Under a nitrogen atmosphere, Compound C-1 (1.31 g) of Synthesis Example 9, Compound D-1 (0.483 g), Compound B-5 (0.665 g) of Synthesis Example 7, palladium acetate (3.60 mg), tris(2-methoxyphenyl)phosphine (33.7 mg), toluene (54 mL), and a 20 mass % tetraethylammonium hydroxide aqueous solution (8.23 g) were combined in a four-necked flask and the reaction mixture was stirred at 85° C. for 6 hours. Subsequently, phenylboronic acid (193 mg), bis(triphenylphosphine)palladium(II) dichloride (67.2 mg), a 20 mass % tetraethylammonium hydroxide aqueous solution (8.23 g), and sodium carbamate trihydrate (5.39 g) were added and the reaction mixture stirred at 85° C. for 2 hours. After separating an organic layer from an aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-13 (1.25 g). The weight average molecular weight (Mw) and polydispersity (Mw/Mn) of the obtained Polymer Compound P-13 were measured by SEC. The measured weight average molecular weight (Mw) and polydispersity (Mw/Mn) of Polymer Compound P-13 were 64,900 g/mol and 1.84, respectively.

The following monomer ratio of structural units for Polymer Compound P-13 was approximated based on the monomer input ratio of the synthesis.

Polymer Compound P-13

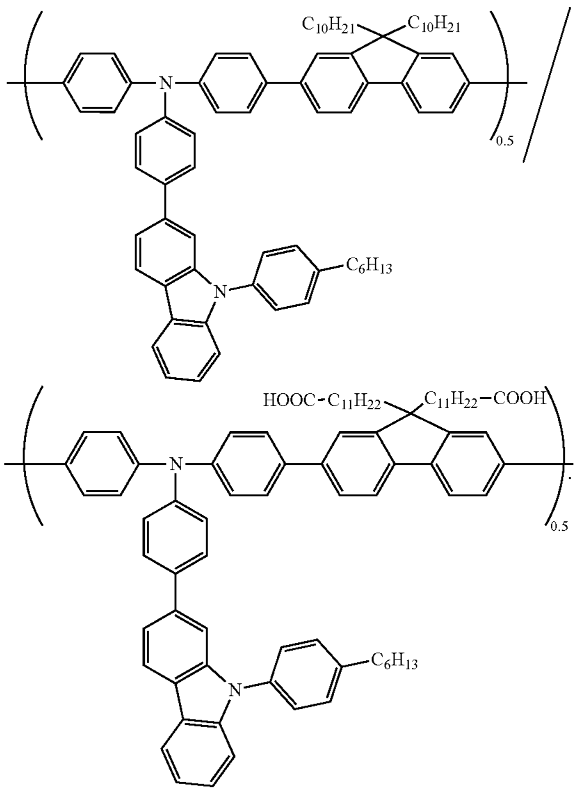

Example 1-14

Under a nitrogen atmosphere, Compound A-1 (0.599 g) of Synthesis Example 1, Compound A-2 (1.21 g) of Synthesis Example 2, 2,7-dibromo-9,9-di-n-propylfluorene (Hereinafter, referred to as "Compound D-2") (0.637 g), palladium acetate (3.50 mg), tris(2-methoxyphenyl)phosphine (33.0 mg), toluene (54 mL), and a 20 mass % tetraethylammonium hydroxide aqueous solution (8.03 g) were combined in a four-necked flask and the reaction mixture was stirred at 85° C. for 6 hours. Subsequently, phenylboronic acid (169 mg), bis(triphenylphosphine)palladium(II) dichloride (65.7 mg), a 20 mass % tetraethylammonium hydroxide aqueous solution (8.03 g), and sodium carbamate trihydrate (5.26 g) were added the reaction mixture was stirred at 85° C. for 6 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-14 (1.14 g). The weight average molecular weight (Mw) and polydispersity (Mw/Mn) of the obtained Polymer Compound P-14 were measured by SEC. The measured weight average molecular weight (Mw) and polydispersity (Mw/Mn) of Polymer Compound P-14 were 53,400 g/mol and 1.87, respectively.

The following monomer ratio of structural units for Polymer Compound P-14 was approximated based on the monomer input ratio of the synthesis.

referred to as "Compound D-3") (0.763 g), palladium acetate (3.10 mg), tris(2-methoxyphenyl)phosphine (26.5 mg), toluene (54 mL), and a 20 mass % tetraethylammonium hydroxide aqueous solution (6.80 g) were combined in a four-necked flask and the reaction mixture was stirred at 85° C. for 6 hours. Subsequently, phenylboronic acid (401 mg), bis(triphenylphosphine)palladium(II) dichloride (68.6 mg), a 20 mass % tetraethylammonium hydroxide aqueous solution (6.80 g), and sodium carbamate trihydrate (4.70 g) were added and the reaction mixture was stirred at 85° C. for 6 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-15 (0.906 g). The weight average molecular weight (Mw) and polydispersity (Mw/Mn) of the obtained Polymer Compound P-15 were measured by SEC. the measured weight Polymer Compound P-14

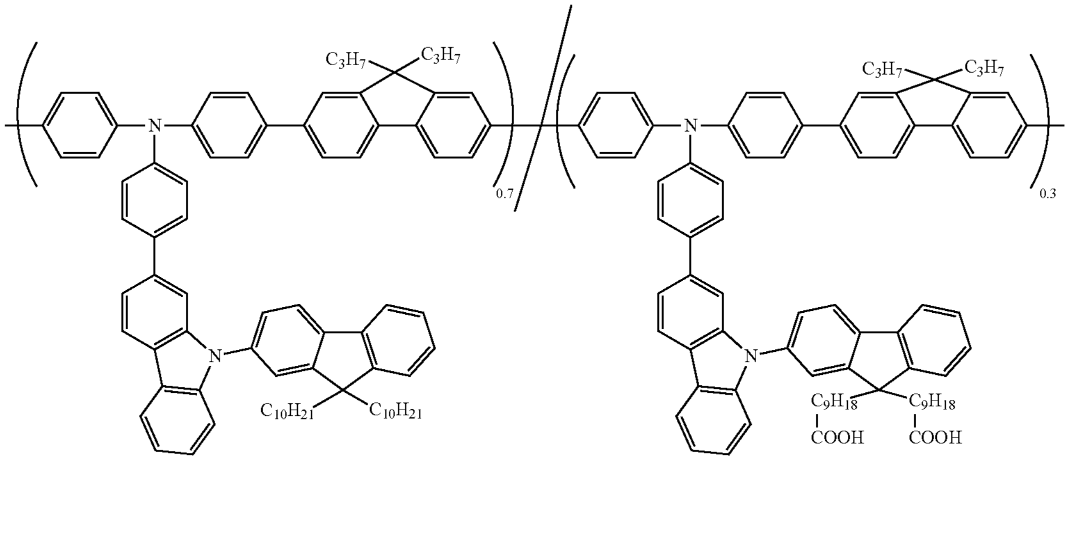

Example 1-15

Under a nitrogen atmosphere, Compound A-1 (0.534 g) of Synthesis Example 1, Compound A-2 (1.07 g) of Synthesis Example 2, 2,7-dibromo-9,9-di-n-octylfluorene (hereinafter, average molecular weight (Mw) and polydispersity (Mw/Mn) of Polymer Compound P-15 were 71,500 g/mol and 1.74, respectively.

The following monomer ratio of structural units for Polymer Compound P-15 was approximated based on the monomer input ratio of the synthesis.

Polymer Compound P-15

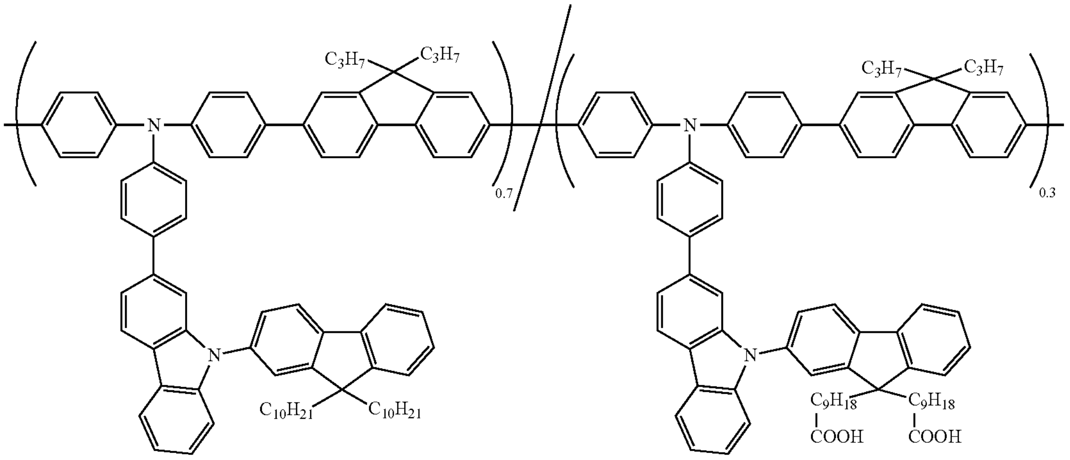

Example 1-16

Under a nitrogen atmosphere, Compound A-1 (0.512 g) of Synthesis Example 1, Compound A-2 (1.03 g) of Synthesis Example 2, Compound D-1 (0.806 g), palladium acetate (3.00 mg), tris(2-methoxyphenyl)phosphine (28.3 mg), toluene (54 mL), and a 20 mass % tetraethylammonium hydroxide aqueous solution (6.80 g) were combined in a four-necked flask and the reaction mixture was stirred at 85° C. for 6 hours. Subsequently, phenylboronic acid (369 mg), bis(triphenylphosphine)palladium(II) dichloride (55.1 mg), a 20 mass % tetraethylammonium hydroxide aqueous solution (6.80 g), and sodium carbamate trihydrate (4.70 g) were added and the reaction mixture was stirred at 85° C. for 6 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-16 (0.906 g). The weight average molecular weight (Mw) and polydispersity (Mw/Mn) of the obtained Polymer Compound P-16 were measured by SEC. The measured weight average molecular weight (Mw) and polydispersity (Mw/Mn) of Polymer Compound P-16 were 56,700 g/mol and 1.78, respectively.

The following monomer ratio of structural units for Polymer Compound P-16 was approximated based on the monomer input ratio of the synthesis.

Polymer Compound P-16

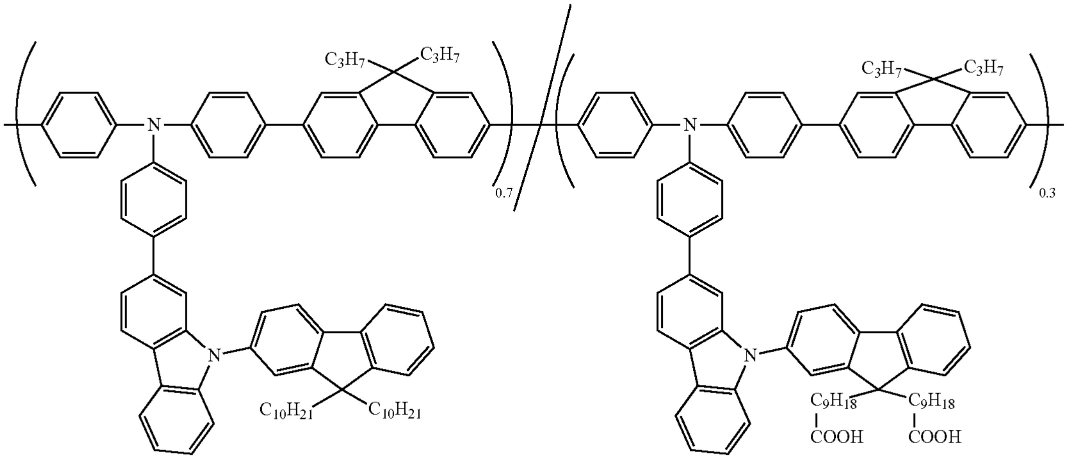

Example 1-17

Under a nitrogen atmosphere, Compound C-3 (1.364 g) of Synthesis Example 11, Compound B-4 (0.621 g) of Synthesis Example 6, Compound D-1 (0.501 g), palladium acetate (3.50 mg), tris(2-methoxyphenyl)phosphine (33.0 mg), toluene (49 mL), and a 20 mass % tetraethylammonium hydroxide aqueous solution (8.06 g) were combined in a four-necked flask and the reaction mixture was stirred at 85° C. for 6 hours. Subsequently, phenylboronic acid (189 mg), bis(triphenylphosphine)palladium(II) dichloride (65.8 mg), a 20 mass % tetraethylammonium hydroxide aqueous solution (8.06 g), and sodium carbamate trihydrate (4.70 g) were added and the reaction mixture was stirred at 85° C. for 6 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-17 (0.400 g). The weight average molecular weight (Mw) and polydispersity (Mw/Mn) of the obtained Polymer Compound P-17 were measured by SEC. The measured weight average molecular weight (Mw) and polydispersity (Mw/Mn) of Polymer Compound P-17 were 14,600 g/mol and 1.45, respectively.

The following monomer ratio of structural units for Polymer Compound P-17 was approximated based on the monomer input ratio of the synthesis.

Example 1-18

Under a nitrogen atmosphere, Compound C-3 (1.44 g) of Synthesis Example 11, Compound B-4 (0.720 g) of Synthesis Example 6, Compound D-1 (0.281 g), palladium acetate (3.50 mg), tris(2-methoxyphenyl)phosphine (32.7 mg), toluene (49 mL), and a 20 mass % tetraethylammonium hydroxide aqueous solution (87.97 g) were combined in a four-necked flask and the reaction mixture was stirred at 85° C. for 6 hours. Subsequently, phenylboronic acid (187 mg), bis(triphenylphosphine)palladium(II) dichloride (55.1 mg), a 20 mass % tetraethylammonium hydroxide aqueous solution (7.97 g), and sodium carbamate trihydrate (5.23 g) were added and the reaction mixture was stirred at 85° C. for 6 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (20 mL), alumina (9.0 g) and Celite (4.5 g) were added, and the mixture was stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-18 (0.290 g). The weight average molecular weight (Mw) and polydispersity (Mw/Mn) of the obtained Polymer Compound P-18 were measured by SEC. The measured weight average molecular weight (Mw) and polydispersity (Mw/Mn) of Polymer Compound P-18 were 17,500 g/mol and 1.45, respectively.

Polymer Compound P-17

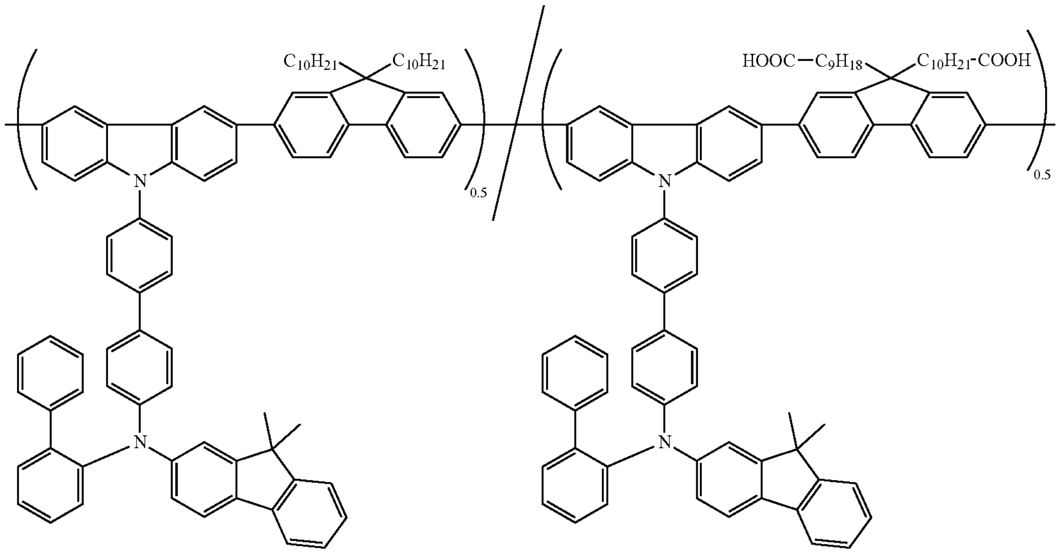

The following monomer ratio of structural units for Polymer Compound P-18 was approximated based on the monomer input ratio of the synthesis.

Polymer Compound P-18

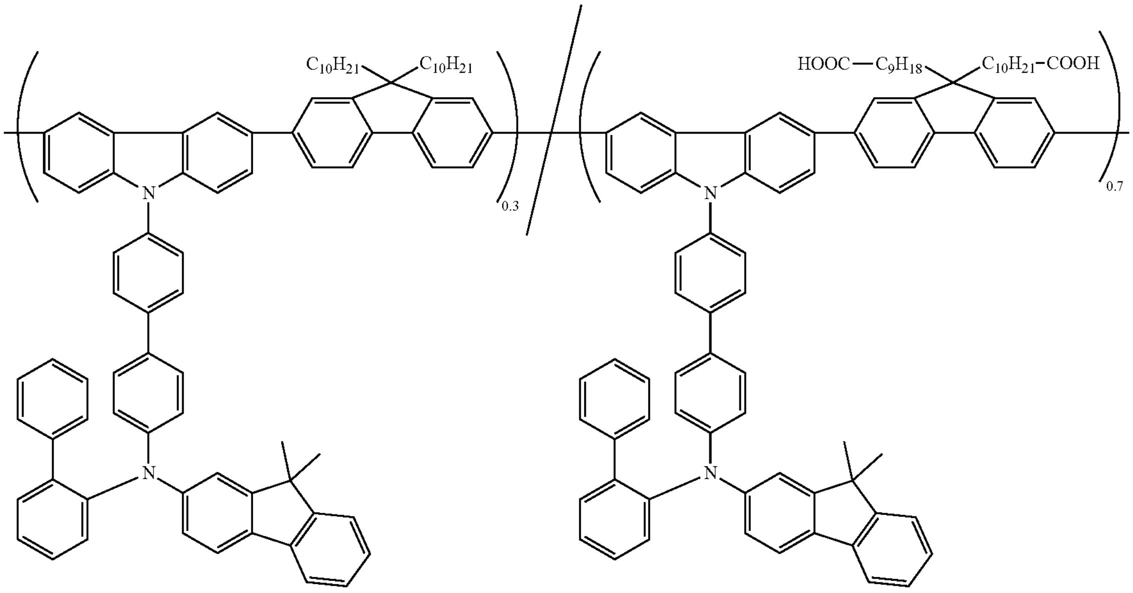

Example 1-19

Under a nitrogen atmosphere, Compound C-2 (2.47 g) of Synthesis Example 10, Compound B-6 (0.519 g) of Synthesis Example 8, Compound D-1 (1.26 g), palladium acetate (6.8 mg), tris(2-methoxyphenyl)phosphine (63.6 mg), toluene (90 mL), and a 20 mass % tetraethylammonium hydroxide aqueous solution (15.5 g) were combined in a four-necked flask and the reaction mixture was stirred at 85° C. for 6 hours. Subsequently, phenylboronic acid (364 mg), bis(triphenylphosphine)palladium(II) dichloride (126 mg), a 20 mass % tetraethylammonium hydroxide aqueous solution (15.5 g), and sodium carbamate trihydrate (10.1 g) were added and the reaction mixture was stirred at 85° C. for 6 hours. After separating the organic layer from the aqueous layer, the solvent in the organic layer was removed by distillation under reduced pressure and the solids were reprecipitated with toluene/methanol. The precipitated solids were filtered, washed with water and methanol, and dried. The dried solids were dissolved in toluene (30 mL), and alumina (15.0 g) and Celite (7.5 g) were added thereto and then, stirred at 90° C. for 1 hour. Alumina and Celite were removed by filtration, 12N-hydrochloric acid (10 mL) was added to the filtrate, and the mixture was stirred at room temperature for 12 hours. The aqueous layer was separated, and the organic layer was added dropwise to methanol. The precipitated solids were washed with methanol and water and dried under vacuum to provide Polymer Compound P-19 precursor (2.42 g). The weight average molecular weight (Mw) and polydispersity (Mw/Mn) of the obtained Polymer Compound P-19 precursor were measured by SEC. The weight measured average molecular weight (Mw) and polydispersity (Mw/Mn) of the Polymer Compound P-19 precursor were 116,000 g/mol and 2.29, respectively.

The Polymer Compound P-19 precursor (0.400 g), cyanoacetic acid (0.200 g), piperidine (0.1 mL), and toluene (10 mL) were combined in a flask and stirred under nitrogen at 60° C. for 6 hours. The solvent was removed by distillation under reduced pressure and solids were reprecipitated with toluene/methanol. The precipitated solids were filtered, washed with water and methanol, and dried to provide Polymer Compound P-19 (0.316 g). The obtained Polymer Compound P-19 was analyzed by SEC, but there was no elution, failing in obtaining a weight average molecular weight and polydispersity thereof (therefore, shown as "-" in Table 1).

The following monomer ratio of structural units for Polymer Compound P-19 was approximated based on the monomer input ratio of the synthesis.

Polymer Compound P-19

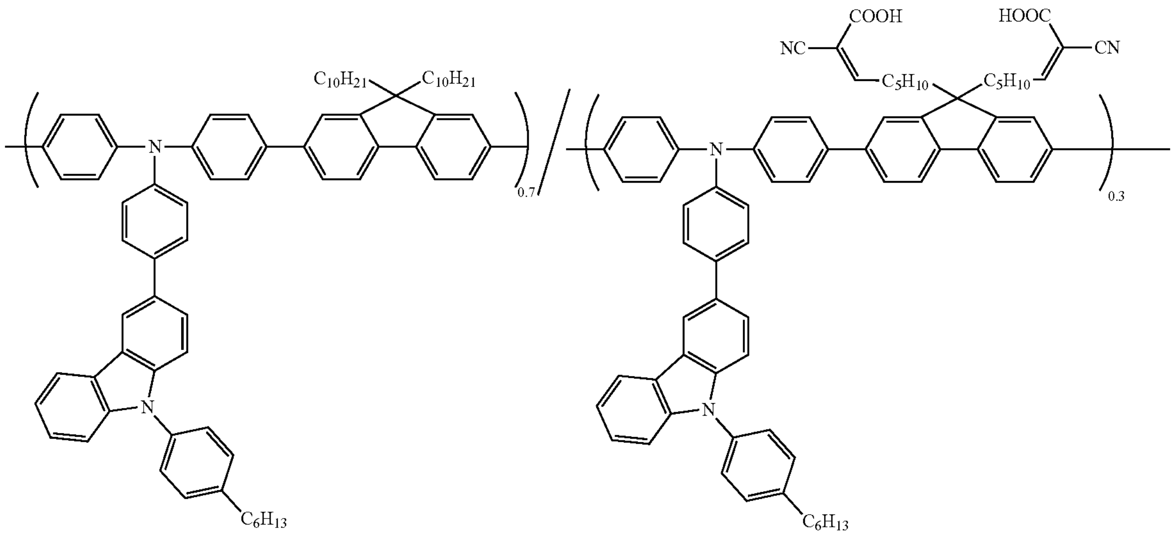

Example 1-20

Under a nitrogen atmosphere, the Polymer Compound P-19 precursor (0.400 g) according to Example 1-19, malonic acid (0.200 g), piperidine (0.1 mL), and toluene (10 mL) were combined in a flask and the reaction mixture was stirred at 60° C. for 6 hours. The solvent was removed by distillation under reduced pressure and the solids were reprecipitated with toluene/methanol. The precipitated solids were filtered, washed with water and methanol, and dried to provide Polymer Compound P-20 (0.336 g). The obtained Polymer Compound P-20 was analyzed by SEC, but there was no elution, failing in obtaining a weight average molecular weight and polydispersity thereof (therefore, shown as "-" in Table 1).

The following monomer ratio of structural units for Polymer Compound P-20 was approximated based on the monomer input ratio of the synthesis.

Comparative Example 1-1

Under a nitrogen atmosphere, Compound C-1 (1.49 g) of Synthesis Example 9, Compound D-1 (0.97 g), palladium acetate (3.6 mg), tris(2-methoxyphenyl)phosphine (33.9 mg), toluene (54 mL), and a 20 mass % tetraethylammonium hydroxide aqueous solution (8.27 g) were combined in a four-necked flask and the reaction mixture was stirred at 85° C. for 6 hours. Subsequently, phenylboronic acid (194 mg), bis(triphenylphosphine)palladium(II) dichloride (67.6 mg), a 20 mass % tetraethylammonium hydroxide aqueous solution (8.27 g), and sodium carbamate trihydrate (5.42 g) were added and the reaction mixture was stirred at 85° C. for 2 hours. After separating the organic layer from the aqueous layer, the organic layer was washed with water. The resultant organic layer was purified by column chromatography (packing material: silica gel/alumina, eluent: toluene), reprecipitated with toluene/methanol, and dried under vacuum to Polymer Compound P-20

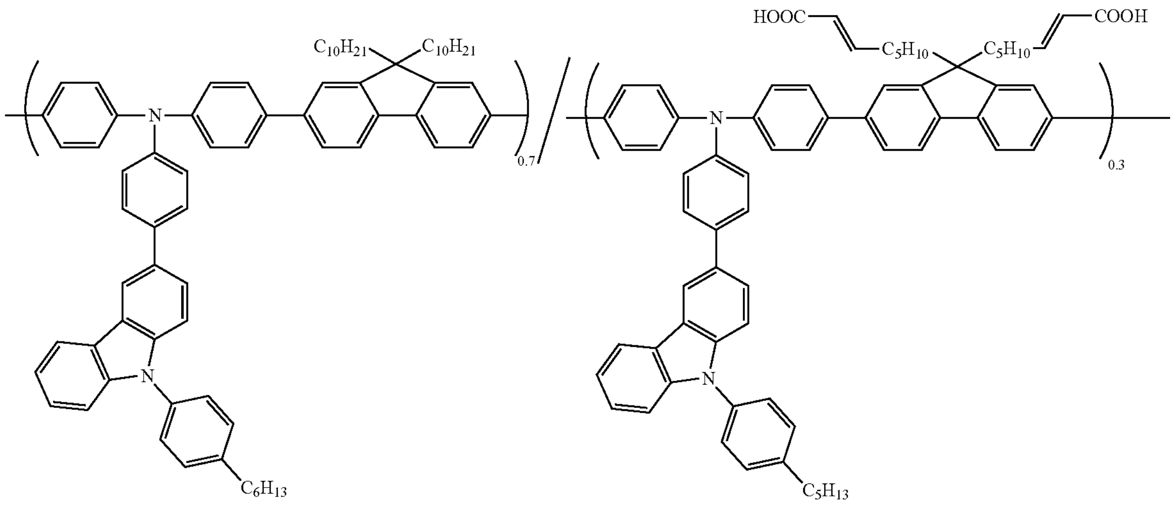

provide Polymer Compound P-21 (1.17 g). The weight average molecular weight (Mw) and polydispersity (Mw/Mn) of the obtained Polymer Compound P-21 were measured by SEC. The measured weight average molecular weight (Mw) and polydispersity (Mw/Mn) of Polymer Compound P-21 were 73,000 g/mol and 1.40, respectively.

The following monomer ratio of structural units for Polymer Compound P-21 was approximated based on the monomer input ratio of the synthesis.

Polymer Compound P-21

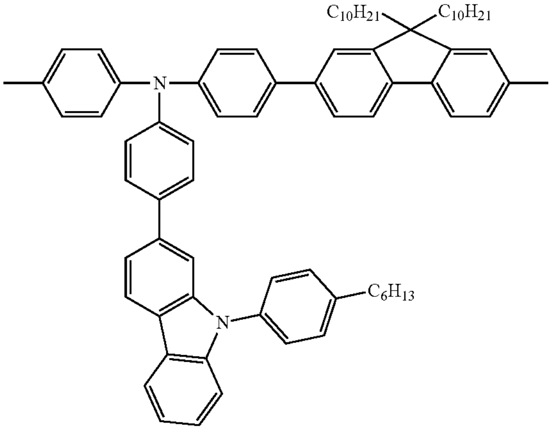

Comparative Example 1-2

Under a nitrogen atmosphere, Compound C-2 (1.49 g) of Synthesis Example 10, Compound D-1 (0.97 g), palladium acetate (3.6 mg), tris(2-methoxyphenyl)phosphine (33.9 mg), toluene (54 mL), and a 20 mass % tetraethylammonium hydroxide aqueous solution (8.27 g) were combined in a four-necked flask and the reaction mixture was stirred at 85° C. for 6 hours. Subsequently, phenylboronic acid (194 mg), bis(triphenylphosphine)palladium(II) dichloride (67.6 mg), a 20 mass % tetraethylammonium hydroxide aqueous solution (8.27 g), and sodium carbamate trihydrate (5.42 g) were added and the reaction mixture was, stirred at 85° C. for 2 hours. After separating the organic layer from the aqueous layer, the organic layer was washed with water. The resultant organic layer was purified by column chromatography (packing material: silica gel/alumina, eluent: toluene), reprecipitated with toluene/methanol, and dried under vacuum to provide Polymer Compound P-22 (1.25 g). The weight average molecular weight (Mw) and polydispersity (Mw/Mn) of the obtained Polymer Compound P-22 were measured by SEC. The measured weight average molecular weight (Mw) and polydispersity (Mw/Mn) of Polymer Compound P-22 were 101,000 g/mol and 2.66, respectively.

The following monomer ratio of structural units for Polymer Compound P-22 was approximated based on the monomer input ratio of the synthesis.

Polymer Compound P-22

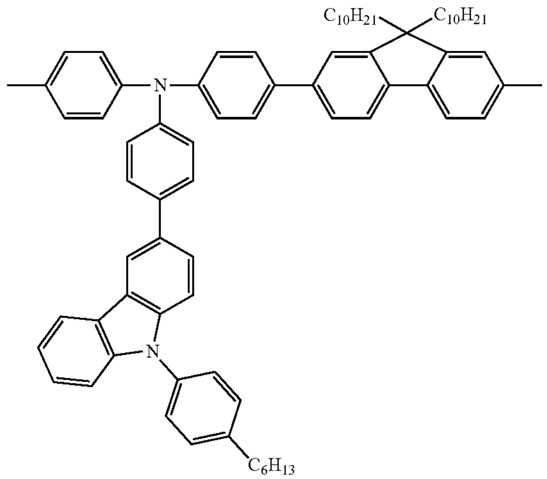

Comparative Example 1-3

Compound D-2 (0.667 g), palladium acetate (3.7 mg), tris(2-methoxyphenyl)phosphine (34.5 mg), toluene (54 mL), and a 20 mass % tetraethylammonium hydroxide aqueous solution (8.42 g) were combined in a four-necked flask and the reaction mixture was stirred at 85° C. for 6 hours. Subsequently, phenylboronic acid (197 mg), bis(triphenylphosphine)palladium(II) dichloride (68.8 mg), a 20 mass % tetraethylammonium hydroxide aqueous solution (8.42 g), and sodium carbamate trihydrate (5.23 g) were added and the reaction mixture was stirred at 85° C. for 2 hours. After separating the organic layer from the aqueous layer, the organic layer was washed with water. The resultant organic layer was purified by column chromatography (packing material: silica gel/alumina, eluent: toluene), reprecipitated with toluene/methanol, and dried under vacuum to provide Polymer Compound P-23 (0.78 g). The weight average molecular weight (Mw) and polydispersity (Mw/Mn) of the obtained Polymer Compound P-23 were measured by SEC. The measured weight average molecular weight (Mw) and polydispersity (Mw/Mn) of Polymer Compound P-23 were 74,600 g/mol and 1.69, respectively.

The following monomer ratio of structural units for Polymer Compound P-23 was approximated based on the monomer input ratio of the synthesis.

Polymer Compound P-23

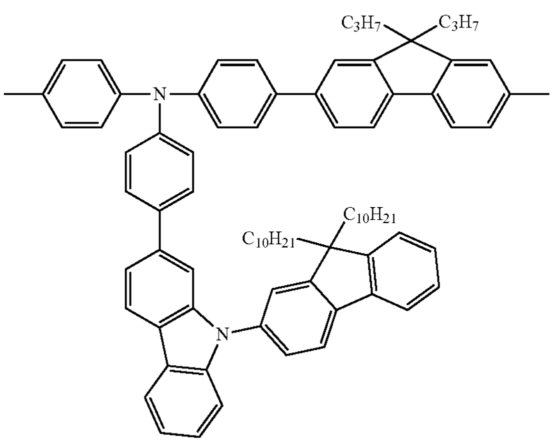

Comparative Example 1-4

Under a nitrogen atmosphere, Compound C-3 (1.49 g) of Synthesis Example 11, Compound D-1 (0.970 g), palladium acetate (3.6 mg), tris(2-methoxyphenyl)phosphine (33.9 mg), toluene (54 mL), and a 20 mass % tetraethylammonium hydroxide aqueous solution (8.27 g) were combined in a four-necked flask and the reaction mixture was stirred at 85° C. for 6 hours. Subsequently, phenylboronic acid (194 mg), bis(triphenylphosphine)palladium(II) dichloride (67.6 mg), a 20 mass % tetraethylammonium hydroxide aqueous solution (8.27 g), and sodium carbamate trihydrate (5.42 g) were added and the reaction mixture was stirred at 85° C. for 2 hours. After separating the organic layer from the aqueous layer, the organic layer was washed with water. The resultant organic layer was purified by column chromatography (packing material: silica gel/alumina, eluent: toluene), reprecipitated with toluene/methanol, and dried in vacuum to provide Polymer Compound P-24 (0.44 g). The weight average molecular weight (Mw) and polydispersity (Mw/Mn) of the obtained Polymer Compound P-24 were measured by SEC. The measured weight average molecular weight (Mw) and polydispersity (Mw/Mn) of Polymer Compound P-24 were 20,000 g/mol and 1.63, respectively.

The following monomer ratio of structural units for Polymer Compound P-19 was approximated based on the monomer input ratio of the synthesis.

Polymer Compound P-24

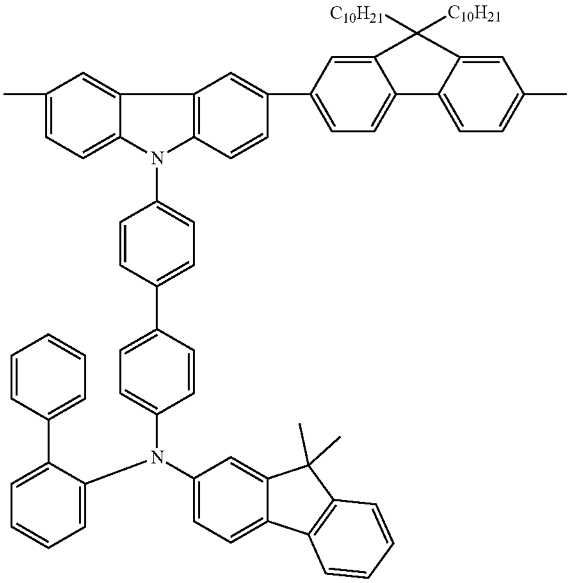

Evaluation of Characteristics of Each Polymer Compound

Polymer Compounds P-1 to P-20 according to Example 1-1 to 1-20 and Polymer Compounds P-21 to P-24 according to Comparative Example 1-1 to 1-4 were measured with respect to HOMO level (eV), LUMO level (eV), and a glass transition temperature ($T_g$) (° C.) by the following methods. The results are shown in Table 1.

Measurement of HOMO Level

Each polymer compound was dissolved in xylene at a concentration of 1 mass %, preparing a coating liquid. The coating liquid was spin-coated at 2000 rpm on a UV-cleaned and ITO-attached glass substrate and dried on a hot plate at 150° C. for 30 minutes to manufacture a sample for measurement (a film thickness: about 70 nm). The samples were measured with respect to HOMO levels with a photoelectron spectrometer (AC-3, Riken Keiki Co., Ltd.) in the air. Herein, the measurement results were used to calculate a rising tangent point of intersection, which is regarded as the HOMO levels (eV). The HOMO levels are usually a negative number.

Measurement of LUMO Level

Each of the polymer compounds was dissolved in toluene at a concentration of 3.2 mass % to prepare a coating solution. On a UV-washed and ITO-attached glass substrate, the coating solution was spin-coated at 1600 rpm to form a film and dried on a hot plate at 250° C. for 60 minutes to manufacture a sample for measurement (a film thickness: about 70 nm). The obtained sample was cooled to 77K (−196° C.) to measure a photoluminescence (PL) spectrum. A LUMO level (eV) was calculated from a peak value at the shortest wavelength side of the PL spectrum.

Glass Transition Temperature ($T_g$)

Each polymer compound was heated to 300° C. (heating rate of 10° C./min), held at 300° C. for 10 minutes, cooled to 25° C. (cooling rate of 10° C./min), and held at 25° C. for 10 minutes, and then, heated again to 300° C. (10° C./min ° C.) to measure a glass transition temperature ($T_g$). When the measurement was completed, the sample was cooled to room temperature (25° C.) (10° C./min).

TABLE 1

| | Polymer compound (polymer) | Monomer input ratio (mol %) | Mw (g/mol) (Mw/Mn) | HOMO (eV) | LUMO (eV) | $T_g$ (° C.) |
|---|---|---|---|---|---|---|
| Example 1-1 | P-1 | C-1/B-4/D-1 (50/5/45) | 83,600 (2.39) | 5.54 | 2.70 | 119 |
| Example 1-2 | P-2 | C-1/B-4/D-1 (50/10/40) | 108,000 (2.24) | 5.50 | 2.66 | 134 |
| Example 1-3 | P-3 | C-1/B-4/D-1 (50/15/35) | 125,000 (2.24) | 5.49 | 2.65 | 135 |
| Example 1-4 | P-4 | C-1/B-4/D-1 (50/25/25) | 383,000 (3.01) | 5.47 | 2.62 | 129 |

TABLE 1-continued

| | Polymer compound (polymer) | Monomer input ratio (mol %) | Mw (g/mol) (Mw/Mn) | HOMO (eV) | LUMO (eV) | $T_g$ (° C.) |
|---|---|---|---|---|---|---|
| Example 1-5 | P-5 | C-1/B-4/D-1 (50/35/15) | 393,000 (2.36) | 5.44 | 2.59 | 120 |
| Example 1-6 | P-6 | C-2/B-4/D-1 (50/5/45) | 117,000 (2.35) | 5.44 | 2.60 | 120 |
| Example 1-7 | P-7 | C-2/B-4/D-1 (50/15/35) | 143,000 (2.37) | 5.39 | 2.59 | 123 |
| Example 1-8 | P-8 | C-2/B-4/D-1 (50/25/25) | 99,600 (1.74) | 5.23 | 2.51 | 106 |
| Example 1-9 | P-9 | C-2/B-4/D-1 (50/35/15) | 355,000 (2.32) | 5.35 | 2.51 | 106 |
| Example 1-10 | P-10 | C-1/B-1/D-1 (50/25/25) | 137,000 (1.63) | 5.47 | 2.63 | 151 |
| Example 1-11 | P-11 | C-1/B-2/D-1 (50/25/25) | 86,200 (1.87) | 5.47 | 2.63 | 150 |
| Example 1-12 | P-12 | C-1/B-3/D-1 (50/25/25) | 75,100 (1.83) | 5.46 | 2.62 | 114 |
| Example 1-13 | P-13 | C-1/B-5/D-1 (50/25/25) | 64,900 (1.84) | 5.45 | 2.60 | 110 |
| Example 1-14 | P-14 | A-2/A-1/D-2 (35/15/50) | 53,400 (1.87) | 5.50 | 2.65 | 149 |
| Example 1-15 | P-15 | A-2/A-1/D-3 (35/15/50) | 71,500 (1.74) | 5.50 | 2.65 | 101 |
| Example 1-16 | P-16 | A-2/A-1/D-1 (35/15/50) | 56,700 (1.78) | 5.50 | 2.65 | 79.8 |
| Example 1-17 | P-17 | C-3/B-4/D-1 (50/25/25) | 14,600 (1.45) | 5.61 | 2.56 | 133 |
| Example 1-18 | P-18 | C-3/B-4/D-1 (50/35/15) | 17,500 (1.45) | 5.56 | 2.51 | 131 |
| Example 1-19 | P-19 | C-2/B-6/D-1 (50/15/35) | — | 5.50 | 2.65 | 134 |
| Example 1-20 | P-20 | C-2/B-6/D-1 (50/15/35) | — | 5.50 | 2.65 | 132 |
| Comparative Example 1-1 | P-21 | C-1/D-1 (50/50) | 73,000 (1.40) | 5.52 | 2.68 | 125 |
| Comparative Example 1-2 | P-22 | C-2/D-1 (50/50) | 101,000 (2.66) | 5.44 | 2.61 | 129 |
| Comparative Example 1-3 | P-23 | A-2/D-2 (50/50) | 74,600 (1.69) | 5.50 | 2.71 | 144 |
| Comparative Example 1-4 | P-24 | C-3/D-1 (50/50) | 20,000 (1.63) | 5.65 | 2.60 | 149 |

Example 2-1

For a first electrode (an anode), a glass substrate with adhered indium tin oxide (ITO) which is patterned to have a film thickness of 150 nm was used. This ITO-adhered glass substrate was sequentially washed with a neutral detergent, deionized water, water, and isopropyl alcohol and then, treated with UV-ozone. Subsequently, poly(3,4-ethylenedioxythiophene)/poly(4-styrenesulfonate) (PEDOT/PSS) (Sigma-Aldrich Co., Ltd.) was spin-coated on the ITO-adhered glass substrate and dried to provide a dry film thickness of 30 nm. As a result, a hole injection layer having a thickness (dry film thickness) of 30 nm was formed on the ITO-adhered glass substrate.

On the hole injection layer, a toluene solution of 1.0 mass % of Polymer Compound P-1 (hole transport material) according to Example 1-1 was spin-coated to provide a dry film thickness of 30 nm and then, dried at 230° C. for 60 minutes to form a hole transport layer. As a result, the hole transport layer with a thickness (dry film thickness) of 30 nm was formed on the hole injection layer.

Figure 2:
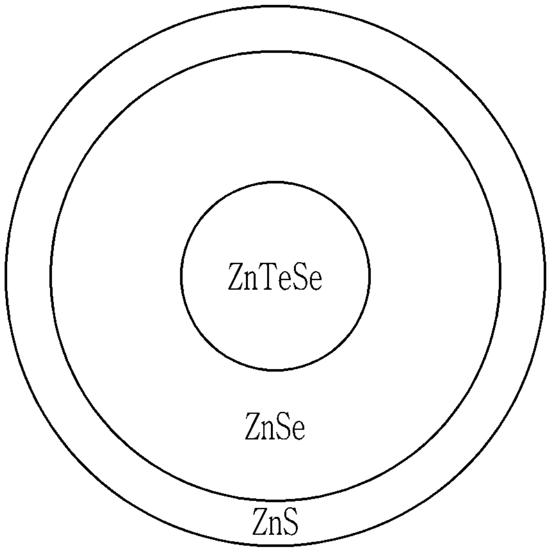
FIG. 2 is a cross-sectional view of an exemplary embodiment of a quantum dot structure.

Subsequently, a quantum dot dispersion was prepared by dispersing a blue quantum dot of ZnTeSe/ZnSe/ZnS (core/shell/shell quantum dot prepared according to U.S. Pat. No. 11,702,593; an average diameter=about 10 nm, with a structure as shown in FIG. 2) in cyclohexane at 1.0 mass %. The hole transport layer (particularly, Polymer Compound P-1) did not dissolve in cyclohexane. The quantum dot dispersion was spin-coated to provide a dry film thickness of 30 nm on the hole transport layer and dried. As a result, a quantum dot light emitting layer with a thickness (dry film thickness) of 30 nm was formed on the hole transport layer. When the quantum dot dispersion was irradiated with ultraviolet (UV), light generated therefrom had a central wavelength of 462 nm and a half width of 30 nm.

The quantum dot light emitting layer was completely dried. On the quantum dot light emitting layer, lithium quinolate (Liq) and 1,3,5-tris(N-phenylbenzimidazol-2-yl) benzene (TPBI) (Sigma-Aldrich Co., Ltd.) as an electron transport material were codeposited with a vacuum deposition apparatus. As a result, an electron transport layer with a thickness of 36 nm was formed on the quantum dot light emitting layer.

On the electron transport layer, (8-quinolato)lithium (lithium quinolate, Liq) was deposited with the vacuum deposition apparatus. As a result, a 0.5 nm-thick electron injection layer was formed on the electron transport layer.

Aluminum (Al) was deposited on the electron injection layer with a vacuum deposition apparatus. As a result, a second electrode (cathode) with a thickness of 100 nm was formed on the electron injection layer. Accordingly, Quantum Dot Electroluminescent Device 1 was so obtained.

Example 2-2

Quantum dot electroluminescent device 2 was manufactured in the same manner as in Example 2-1 except that Polymer Compound P-2 of Example 1-2 was used instead of Polymer Compound P-1.

Example 2-3

Quantum dot electroluminescent device 3 was manufactured in the same manner as in Example 2-1 except that Polymer Compound P-3 of Example 1-3 was used instead of Polymer Compound P-1.

Example 2-4

Quantum dot electroluminescent device 4 was manufactured in the same manner as in Example 2-1 except that Polymer Compound P-4 of Example 1-4 was used instead of Polymer Compound P-1.

Example 2-5

Quantum dot electroluminescent device 5 was manufactured in the same manner as in Example 2-1 except that Polymer Compound P-5 of Example 1-5 was used instead of Polymer Compound P-1.

Example 2-6

Quantum dot electroluminescent device 6 was manufactured in the same manner as in Example 2-1 except that Polymer Compound P-6 of Example 1-6 was used instead of Polymer Compound P-1.

Example 2-7

Quantum dot electroluminescent device 7 was manufactured in the same manner as in Example 2-1 except that Polymer Compound P-7 of Example 1-7 was used instead of Polymer Compound P-1.

Example 2-8

Quantum dot electroluminescent device 8 was manufactured in the same manner as in Example 2-1 except that Polymer Compound P-8 of Example 1-8 was used instead of Polymer Compound P-1.

Example 2-9

Quantum dot electroluminescent device 9 was manufactured in the same manner as in Example 2-1 except that Polymer Compound P-9 of Example 1-9 was used instead of Polymer Compound P-1.

Example 2-10

Quantum dot electroluminescent device 10 was manufactured in the same manner as in Example 2-1 except that Polymer Compound P-10 of Example 1-10 was used instead of Polymer Compound P-1.

Example 2-11

Quantum dot electroluminescent device 11 was manufactured in the same manner as in Example 2-1 except that Polymer Compound P-11 of Example 1-11 was used instead of Polymer Compound P-1.

Example 2-12

Quantum dot electroluminescent device 12 was manufactured in the same manner as in Example 2-1 except that Polymer Compound P-12 of Example 1-12 was used instead of Polymer Compound P-1.

Example 2-13

Quantum dot electroluminescent device 13 was manufactured in the same manner as in Example 2-1 except that Polymer Compound P-13 of Example 1-13 was used instead of Polymer Compound P-1.

Example 2-14

Quantum dot electroluminescent device 14 was manufactured in the same manner as in Example 2-1 except that Polymer Compound P-14 of Example 1-14 was used instead of Polymer Compound P-1.

Example 2-15

Quantum dot electroluminescent device 15 was manufactured in the same manner as in Example 2-1 except that Polymer Compound P-15 of Example 1-15 was used instead of Polymer Compound P-1.

Example 2-16

Quantum dot electroluminescent device 16 was manufactured in the same manner as in Example 2-1 except that Polymer Compound P-16 of Example 1-16 was used instead of Polymer Compound P-1.

Example 2-17

Quantum dot electroluminescent device 17 was manufactured in the same manner as in Example 2-1 except that Polymer Compound P-17 of Example 1-17 was used instead of Polymer Compound P-1.

Example 2-18

Quantum dot electroluminescent device 18 was manufactured in the same manner as in Example 2-1 except that Polymer Compound P-18 of Example 1-18 was used instead of Polymer Compound P-1.

Example 2-19

Quantum dot electroluminescent device 19 was manufactured in the same manner as in Example 2-1 except that Polymer Compound P-19 of Example 1-19 was used instead of Polymer Compound P-1.

Example 2-20

Quantum dot electroluminescent device 20 was manufactured in the same manner as in Example 2-1 except that Polymer Compound P-20 of Example 1-20 was used instead of Polymer Compound P-1.

Comparative Example 2-1

Comparative quantum dot electroluminescent device 1 was manufactured in the same manner as in Example 2-1 except that Polymer Compound P-21 of Comparative Example 1-1 was used instead of Polymer Compound P-1.

Comparative Example 2-2

Comparative quantum dot electroluminescent device 2 was manufactured in the same manner as in Example 2-1 except that Polymer Compound P-22 of Comparative Example 1-2 was used instead of Polymer Compound P-1.

Comparative Example 2-3

Comparative quantum dot electroluminescent device 3 was manufactured in the same manner as in Example 2-1 except that Polymer Compound P-23 of Comparative Example 1-3 was used instead of Polymer Compound P-1.

Comparative Example 2-4

Comparative quantum dot electroluminescent device 4 was manufactured in the same manner as in Example 2-1 except that Polymer Compound P-24 of Comparative Example 1-4 was used instead of Polymer Compound P-1.

Evaluation of Quantum Dot Electroluminescent Devices

Quantum dot electroluminescent devices 1 to 20 according to Examples 2-1 to 2-20 and Comparative quantum dot electroluminescent devices 1 to 4 according to Comparative Examples 2-1 to 2-4 were evaluated with respect to luminous efficiency and luminescence lifespan in the following methods. The results are shown in Tables 2-1 to 2-4.

Luminous Efficiency

When a voltage is applied to each quantum dot electroluminescent device, and a current starts to flow at a constant voltage, the quantum dot electroluminescent device emits light. While the voltage of each device is gradually increased by a DC constant voltage power supply (a source meter, Keyence Corp.), the current at that time is measured, and in addition, luminance thereof during the light emission is measured by a luminance-measuring device (SR-3, Topcom Technology Co., Ltd.). Herein, when the luminance starts to decline, the measurement is ended. The luminance (in candela per meter squared, $cd/m^2$) is divided by current density (ampere per meter squared, $A/m^2$), which is obtained as a current per unit area from an area of each device, obtaining current efficiency (candela per ampere, cd/A). In Tables 2-1 to 2-4, the highest current efficiency within the measured voltage range is regarded as "cd/A max."

The current efficiency means efficiency (conversion efficiency) of converting a current into light emitting energy, wherein a higher current efficiency indicates better device performance.

In addition, the spectral emission luminance spectrum measured by the luminance-measuring device, assuming that Lambertian radiation is performed, is used to calculate external quantum efficiency (EQE) (%) at Cd/A max, evaluating luminous efficiency.

In addition, when a DC constant voltage source (a source meter, KEYENCE Corp.) was used to apply a voltage to each of the quantum dot electroluminescent devices, so that a current might flow at the constant voltage, the quantum dot electroluminescent device emitted light. The device was measured with respect to light emission with a luminance measurement device (SR-3, Topcom Technology Co., Ltd.), while the current was slowly increased, and when luminance reached 1000 nit ($cd/m^2$), the device was allowed to stand with the current constant. Herein, a voltage at 1000 nit was set as "V@1000 nit."

Luminescence Lifespan

Each quantum dot electroluminescent device is made to emit light by applying a predetermined voltage thereto with a DC constant voltage power supply (a source meter, Keyence Corp.). The quantum dot electroluminescent device is measured with respect to light emission with a luminance-measuring device (SR-3, Topcom Technology Co., Ltd.), while a current is gradually increased, and when the luminance reaches 650 nit ($cd/m^2$), the device is allowed to stand, while the current is made constant. The time as the luminance measured with a luminance-measuring device gradually decreases and reaches 90% of the initial luminance is "LT90 (hr)."

In addition, the time as the luminance measured with a luminance-measuring device gradually decreases and reaches 50% of the initial luminance is "LT50 (hr)."

TABLE 2-1

| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| Ex. 2-1 | P-1 | 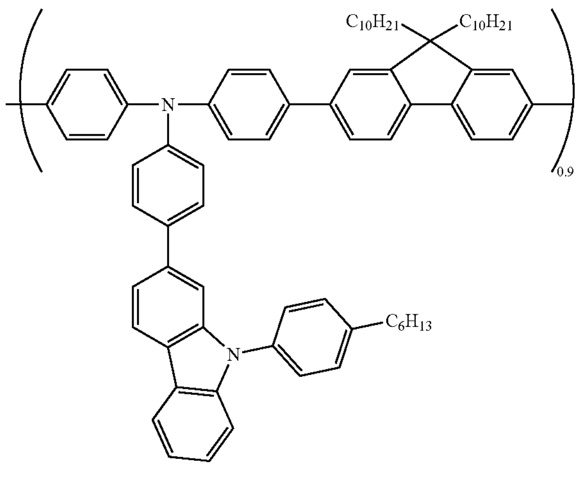 | 10:90 | 7.1 | 8.4 | 3.0 | 4 | 47 |

TABLE 2-1-continued
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| | | 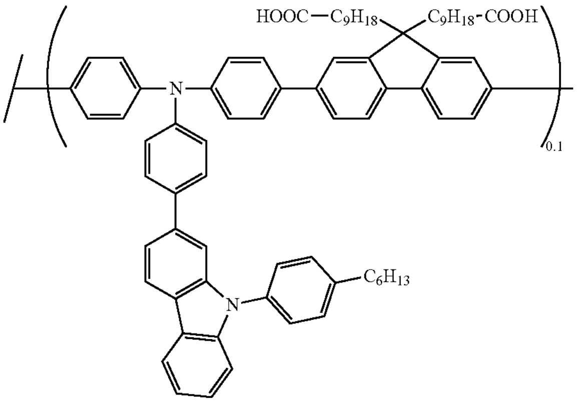 | | | | | | |
| Ex. 2-2 | P-2 | | 20:80 | 8.1 | 9.4 | 3.0 | 3 | 36 |
| | | 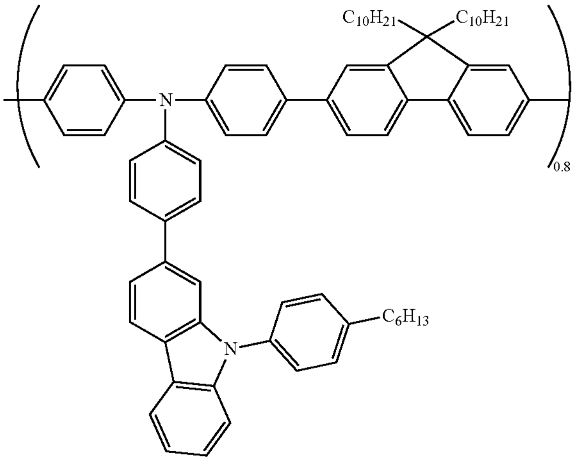 | | | | | | |
| | | 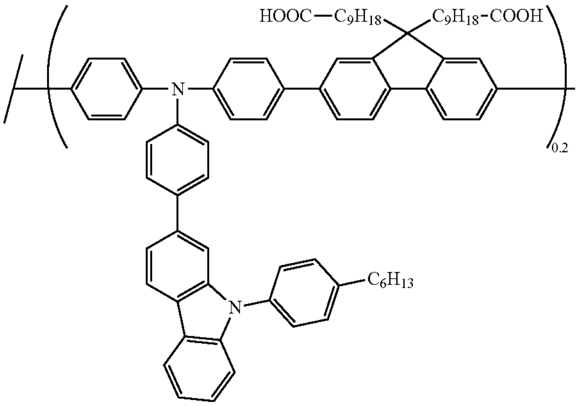 | | | | | | |

TABLE 2-1-continued
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| Ex. 2-3 | P-3 | 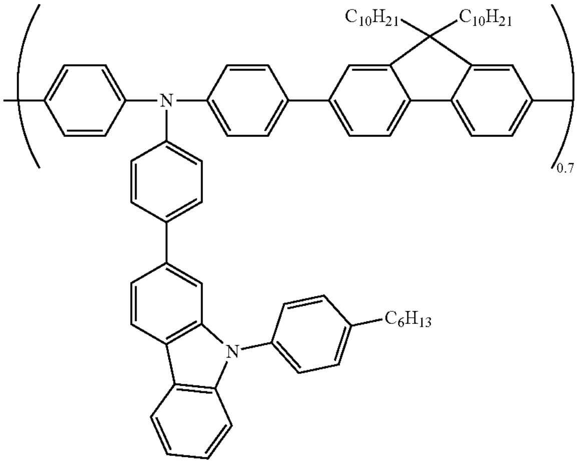 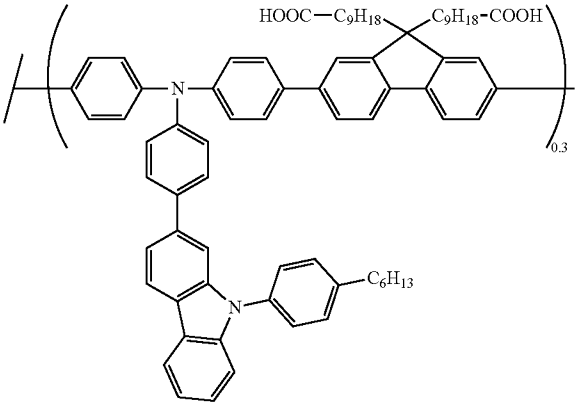 | 30:70 | 15.1 | 13.0 | 3.0 | 7.8 | 60 |
| Ex. 2-4 | P-4 | 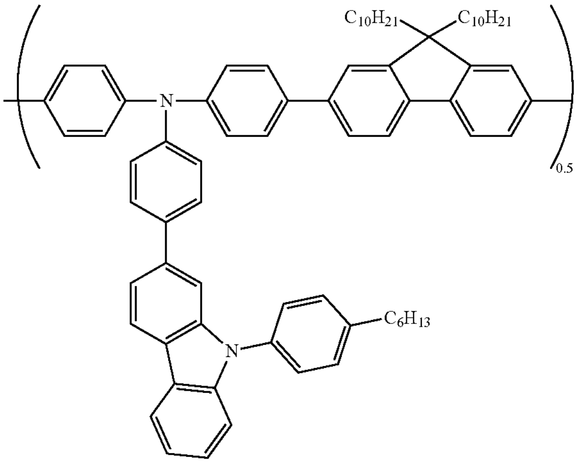 | 50:50 | 14.9 | 10.0 | 3.1 | 9.1 | 59 |

TABLE 2-1-continued
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| | | 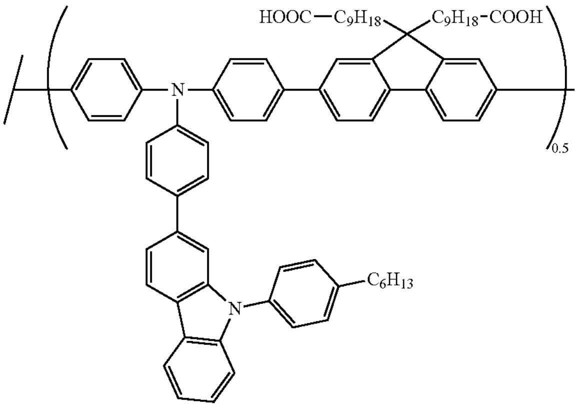 | | | | | | |
| Ex. 2-5 | P-5 | 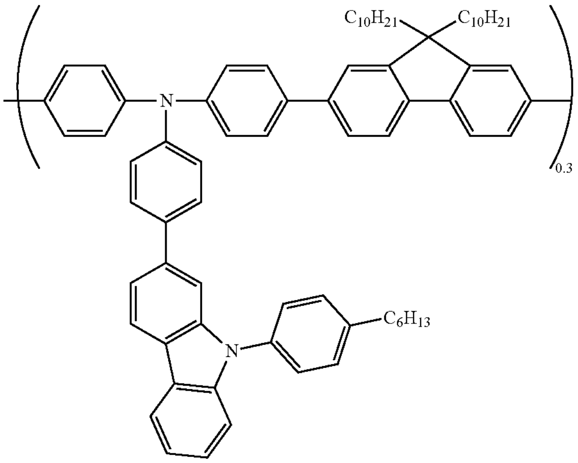 | 70:30 | 14.5 | 11.0 | 3.1 | 12 | 52 |
| | | 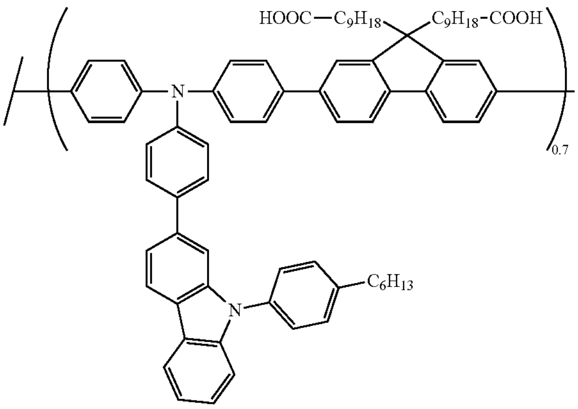 | | | | | | |

TABLE 2-1-continued
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| Ex. 2-6 | P-6 | 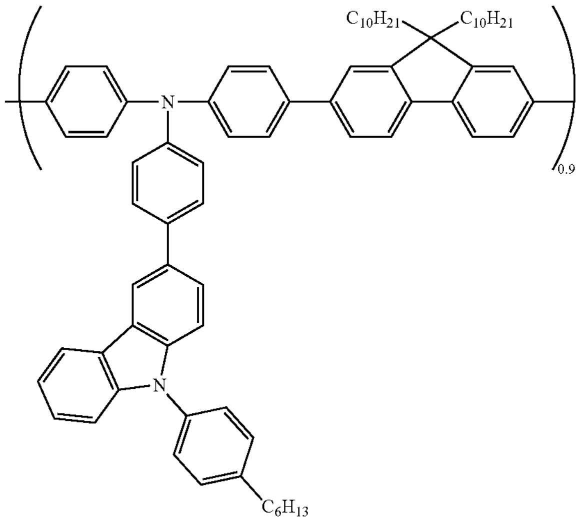 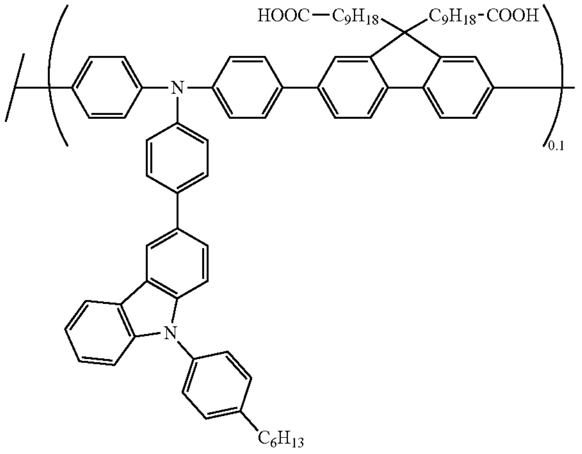 | 10:90 | 11.7 | 10.0 | 3.0 | 9.3 | — |
| Ex. 2-7 | P-7 | 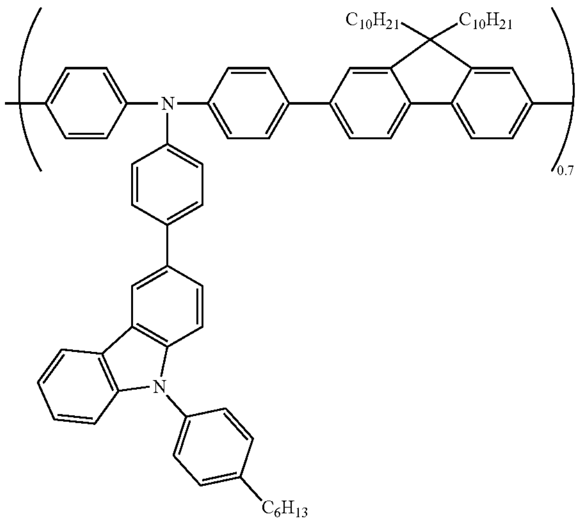 | 30:70 | 7.8 | 7.0 | 2.9 | 15 | 61 |

TABLE 2-1-continued
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| | | 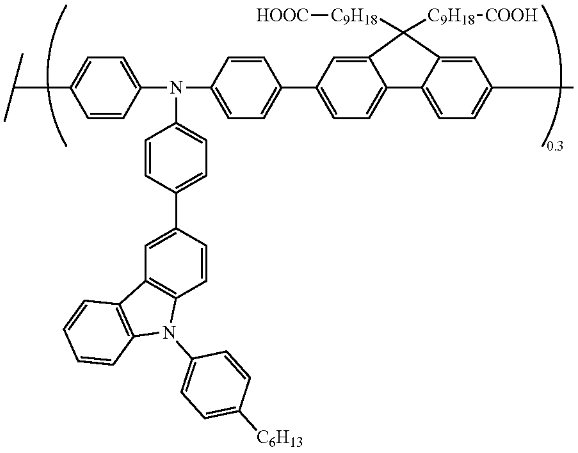 | | | | | | |
| Ex. 2-8 | P-8 | 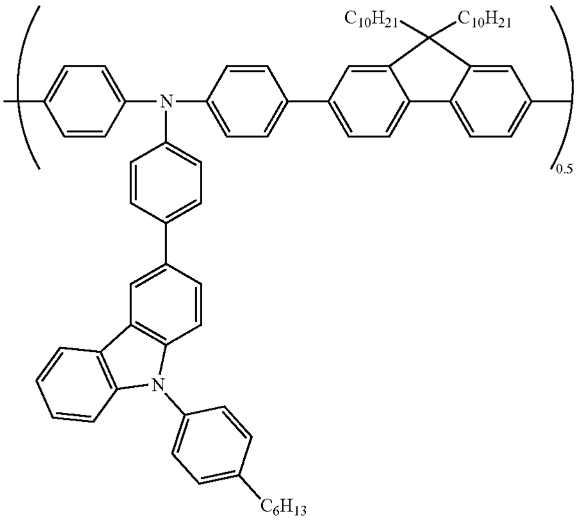 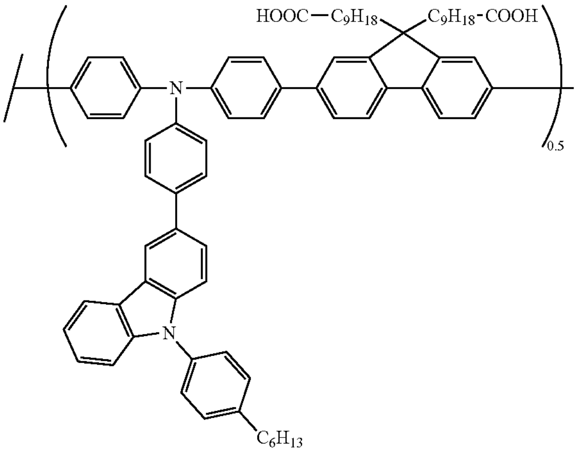 | 50:50 | 6.9 | 6.1 | 3.0 | 10 | 40 |

TABLE 2-1-continued
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| Ex. 2-9 | P-9 | 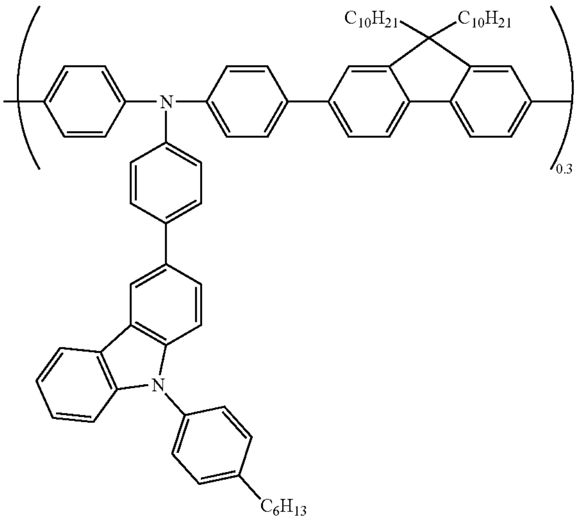 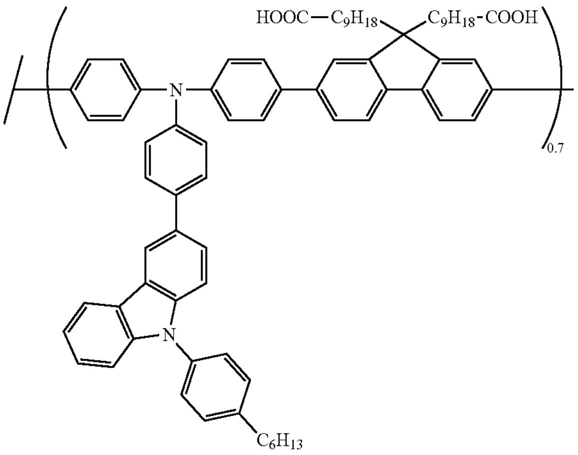 | 70:30 | 7.4 | 6.1 | 3.0 | 11 | 40 |

TABLE 2-2
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| Ex. 2-10 | P-10 | 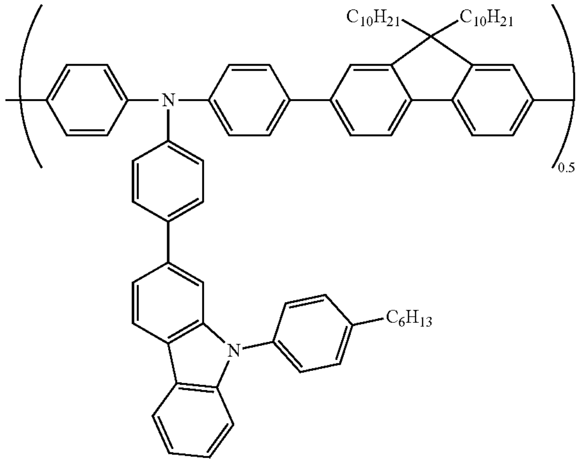 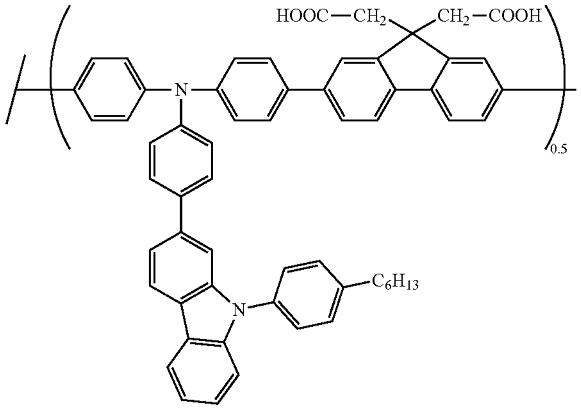 | 50:50 | 14.5 | 13.2 | 3.0 | 5.3 | 49 |
| Ex. 2-11 | P-11 | 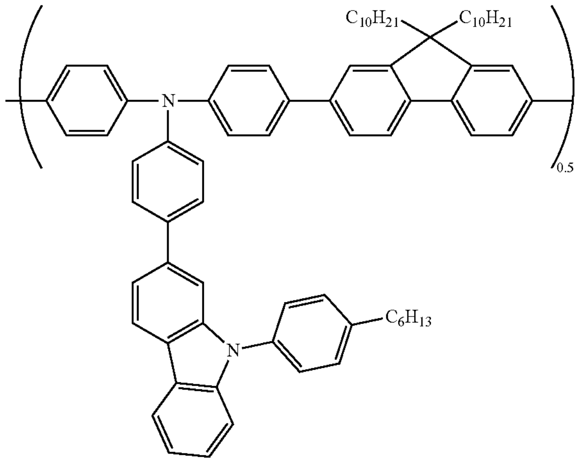 | 50:50 | 14.2 | 12.3 | 3.1 | 7.2 | 52 |

TABLE 2-2-continued
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| | | 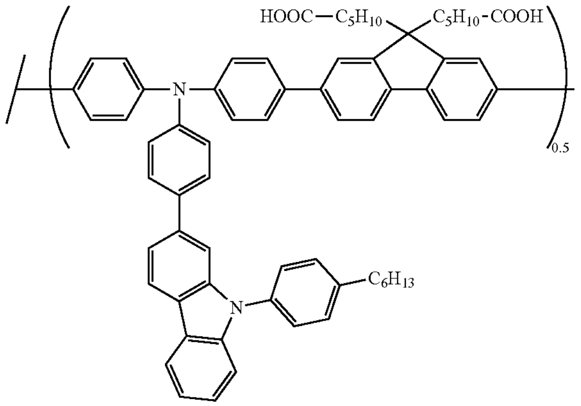 | | | | | | |
| Ex. 2-12 | P-12 | | 50:50 | 14.1 | 13.6 | 3.1 | 9.3 | 55 |
| | | 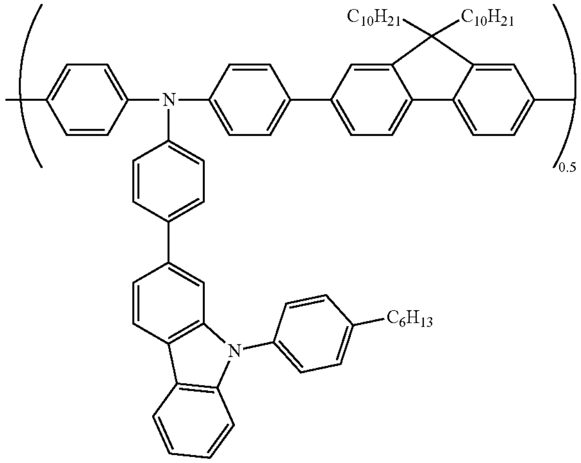 | | | | | | |
| | | 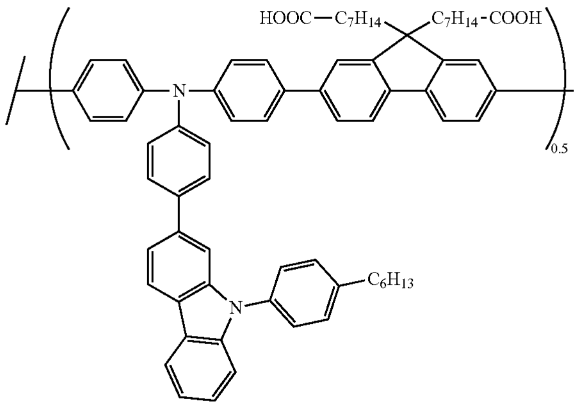 | | | | | | |

TABLE 2-2-continued
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| Ex. 2-13 | P-13 | 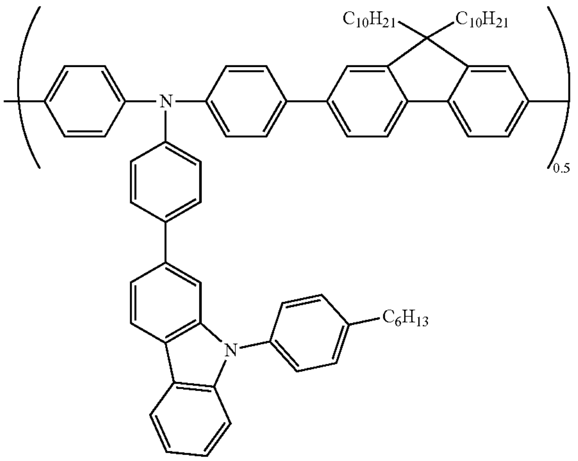 | 50:50 | 14.0 | 11.0 | 3.1 | 11 | 56 |
| | | 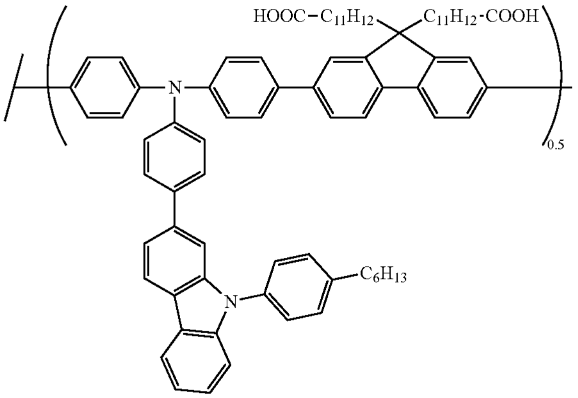 | | | | | | |
| Ex. 2-14 | P-14 | 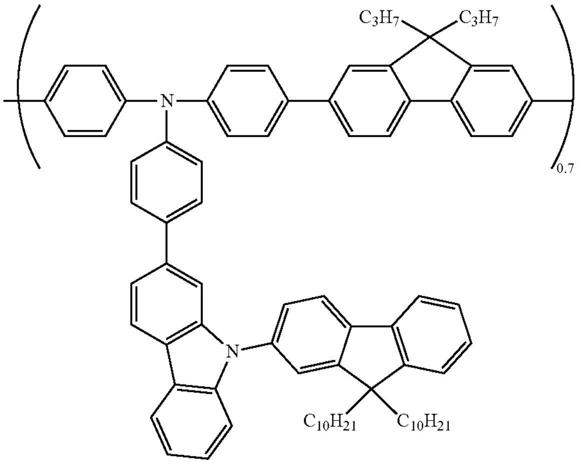 | 30:70 | 10.8 | 9.5 | 2.9 | 24 | 123 |

TABLE 2-2-continued
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| | | 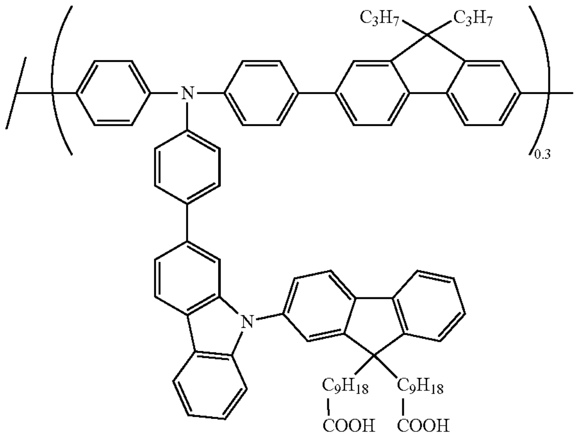 | | | | | | |
| Ex. 2-15 | P-15 | 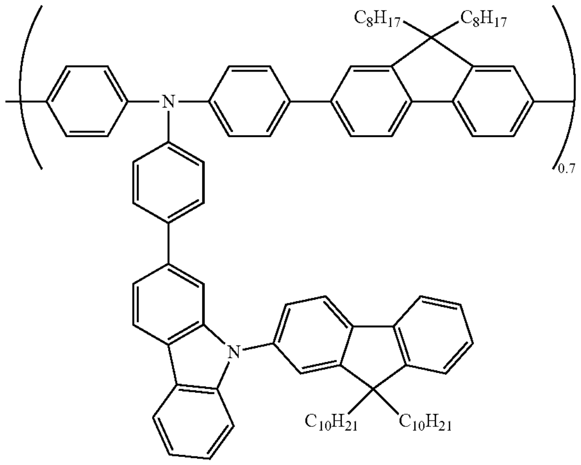 | 30:70 | 12.9 | 11.2 | 2.8 | 15 | 132 |
| | | 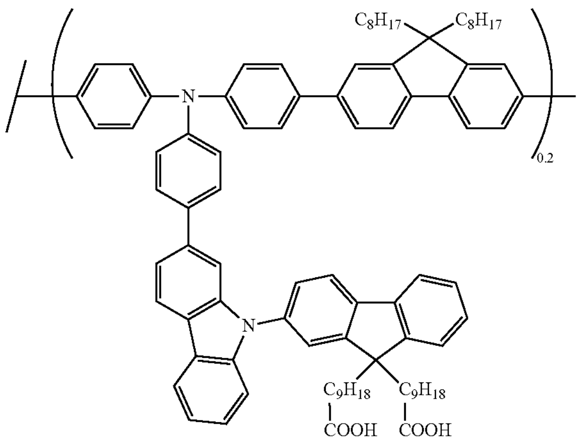 | | | | | | |

TABLE 2-3
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| Ex. 2-16 | P-16 | 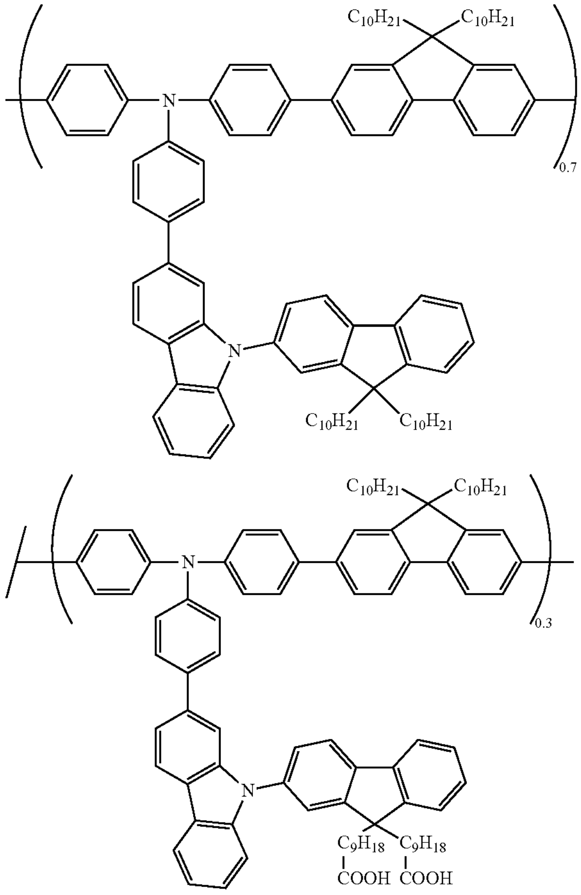 | 30:70 | 12.8 | 10.9 | 2.8 | 16 | 132 |
| Ex. 2-17 | P-17 | 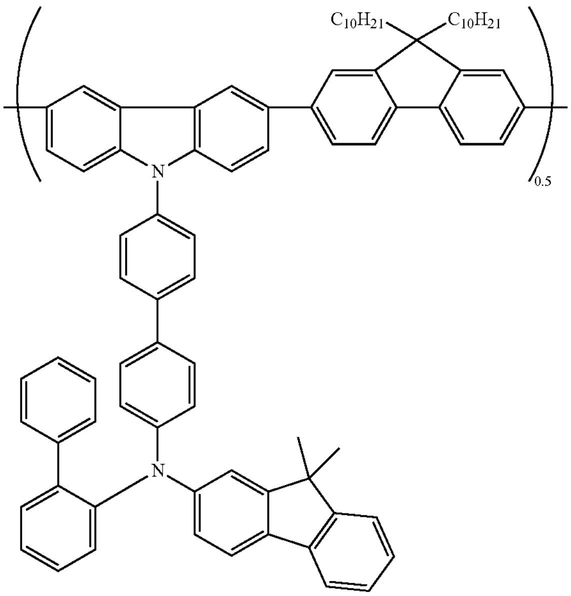 | 50:50 | 15.1 | 15.9 | 2.8 | 8 | 50 |

TABLE 2-3-continued
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| | | 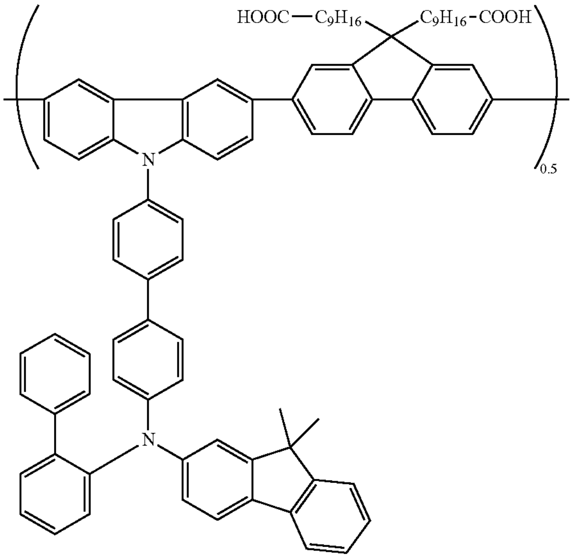 | | | | | | |
| Ex. 2-18 | P-18 | | 70:30 | 13.8 | 17.7 | 2.5 | 16 | 66 |
| | | 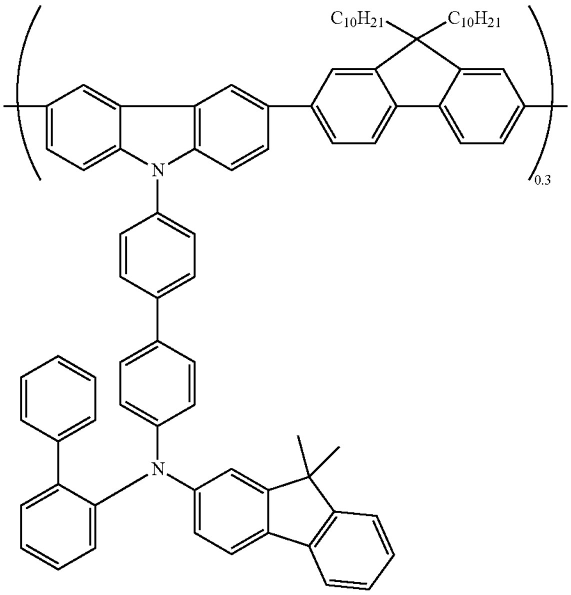 | | | | | | |

TABLE 2-3-continued
| Polymer compound | | Structural unit | Structural unit (A):(B) | Luminous efficiency [Cd/A] | EQE [%] | V @1000 nit | T90 [hr] | T50 [hr] |
|---|---|---|---|---|---|---|---|---|
| | | 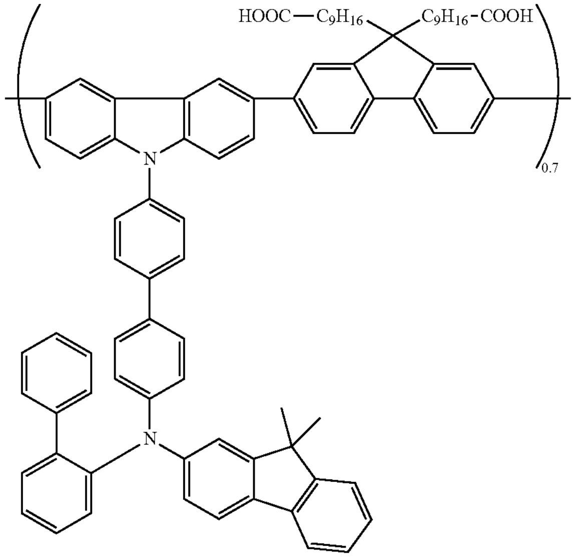 | | | | | | |
| Ex. 2-19 | P-19 | 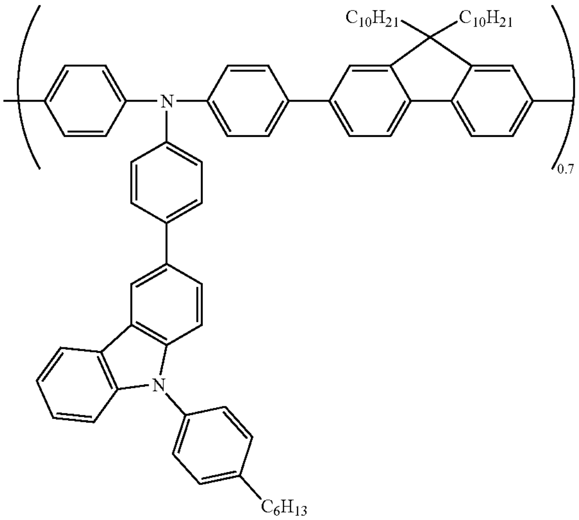 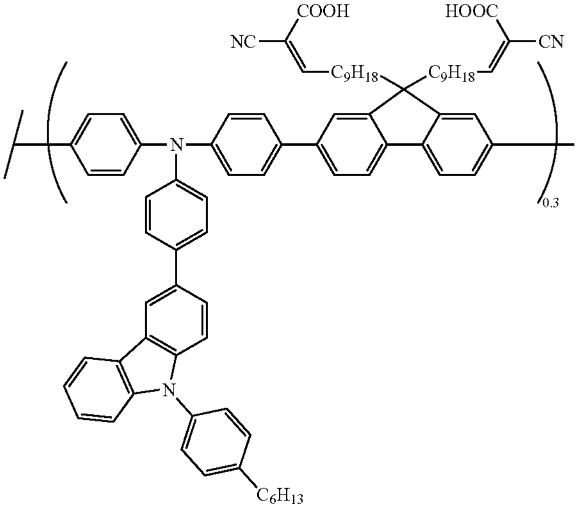 | 30:70 | 16.4 | 15.2 | 3.0 | 4.8 | 48 |

TABLE 2-3-continued
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| Ex. 2-20 | P-20 | 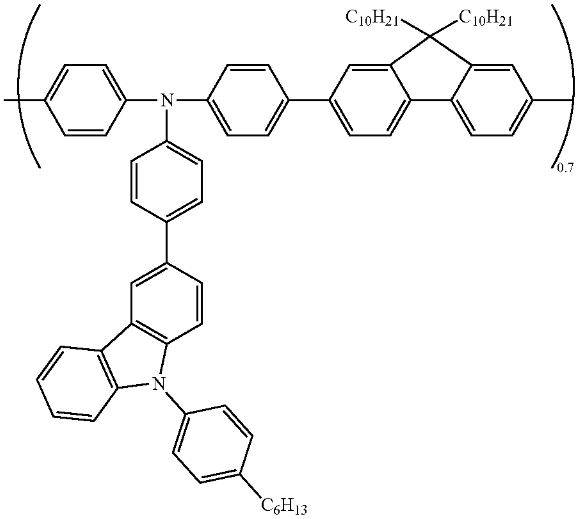 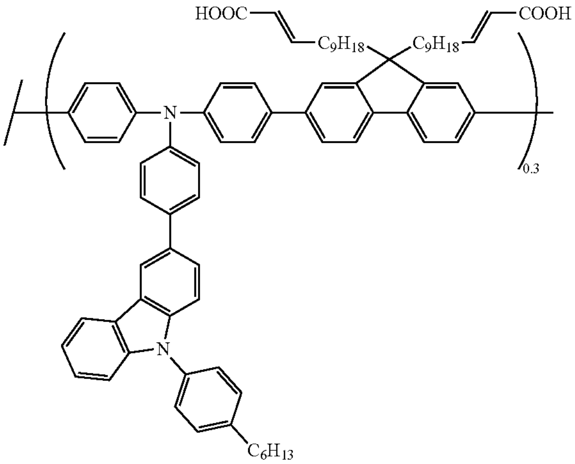 | 30:70 | 17.3 | 15.1 | 3.0 | 6.8 | 65 |

TABLE 2-4
| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| Comp. Ex. 2-1 | P-21 | 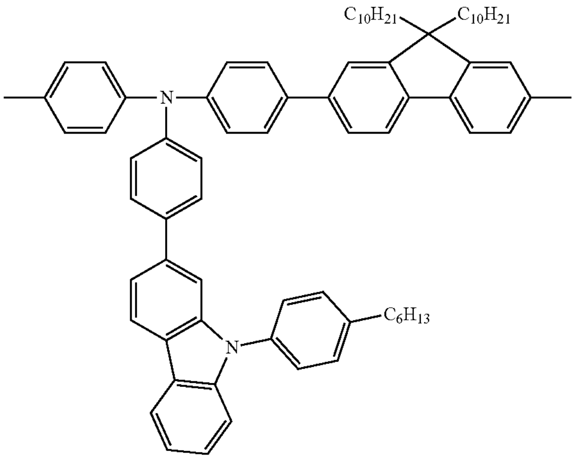 | — | 7.1 | 8.7 | 3.3 | 2 | 37 |
| Comp. Ex. 2-2 | P-22 | 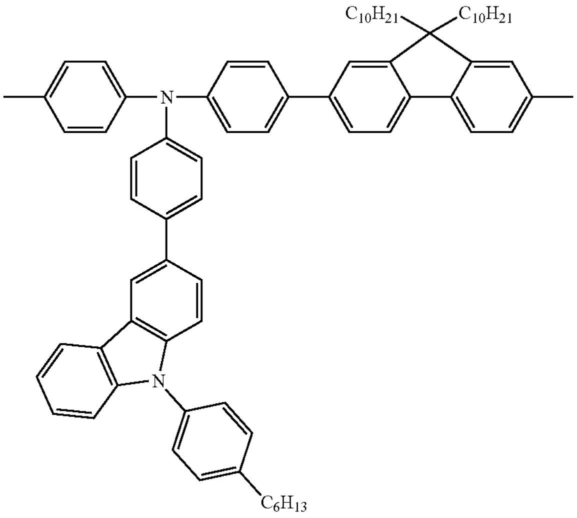 | — | 3.5 | 3.5 | 3.2 | 6 | 33 |
| Comp. Ex. 2-3 | P-23 | 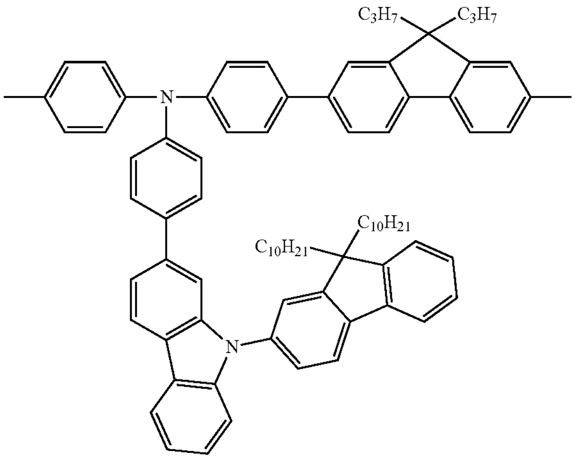 | — | 2.5 | 3.5 | 3.2 | 6 | 33 |

TABLE 2-4-continued

| | Polymer compound | Structural unit | Structural unit (A):(B) | Luminous efficiency [Cd/A] | EQE [%] | V @1000 nit | T90 [hr] | T50 [hr] |
|---|---|---|---|---|---|---|---|---|
| Comp. Ex. 2-4 | P-24 | 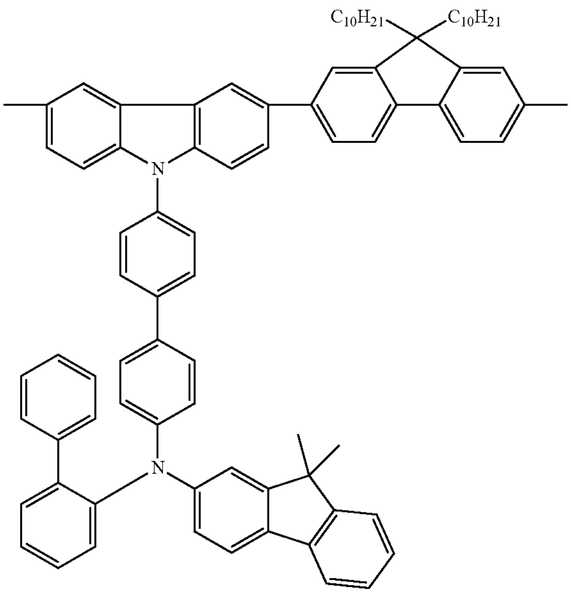 | — | 7.1 | 8.7 | 3.3 | 1 | 11 |

Referring to the results of Tables 2-1 to 2-4, Quantum dot electroluminescent devices 1 to 20 of the examples, in comparison with Comparative quantum dot electroluminescent devices 1 to 4 without the polymer compound according to an embodiment, generally exhibited higher durability (longer luminescence lifespans).

For example, Comparative quantum dot electroluminescent device 1 (Comparative Example 2-1) with a polymer compound consisting of only Structural Unit (B) and including no carboxyl group provided a luminescence lifespan (T90) of 2 hours versus Quantum dot electroluminescent devices 1 to 5 and 10 to 13 (Examples 2-1 to 2-5, 2-10 to 2-13) with a polymer compound further including the structural unit (A) including the carboxyl group as well as the same Structural Unit (B) exhibited luminescence lifespan (T90) results greater than 3 hours. Similarly, the Comparative quantum dot electroluminescent device 2 (Comparative Example 2-2) with a polymer compound consisting of only Structural Unit (B) including no carboxyl group versus Quantum dot electroluminescent devices 6 to 9 and 20 (Examples 2-6 to 2-9 and 2-20) with the polymer compound further including Structural Unit (A) including the carboxyl group as well as the same Structural Unit (B) also exhibited excellent luminous efficiency and external quantum efficiency (EQE) as well as the longer luminescence lifespan (T90). Quantum dot electroluminescent device 19 (Example 2-19) in comparison with Comparative quantum dot electroluminescent device 2 (Comparative Example 2-2), exhibited a slightly deteriorated luminescence lifespan (T90), which was still sufficiently longer in terms of the luminescence lifespan (T50) and provided excellent luminous efficiency and external quantum efficiency (EQE), which were suitable light emitting performance (balance between luminous efficiency and luminescence lifespan) for actual use. In comparison to Comparative quantum dot electroluminescent device 3 (Comparative Example 2-3) with a polymer compound including only Structural Unit (B) including no carboxyl group, Quantum dot electroluminescent device 14 (Example 2-14) with the polymer compound further including the structural unit (A) including the carboxyl group as well as the same Structural Unit (B) exhibited a longer luminescence lifespan (T90 and T50) and also, excellent luminous efficiency and external quantum efficiency (EQE).

Comparative quantum dot electroluminescent devices 2 and 3 of Comparative Examples 2-2 and 2-3 exhibited excellent luminescence lifespans (T90) of 6 hours but low luminous efficiency and external quantum efficiency (EQE), which was inferior to the quantum dot electroluminescent devices of the present embodiment in terms of light emitting performance (balance between luminous efficiency and luminescence lifespan) during actual use.

Furthermore, compared with Comparative quantum dot electroluminescent device 4 (Comparative Example 2-4) with a polymer compound including only Structural Unit (B), Quantum dot electroluminescent devices 17 and 18 (Examples 2-17 and 2-18) with the polymer compound further including the structural unit (A) including the carboxyl group as well as the same Structural Unit (B) exhibited a very long luminescence lifespan (T90 and T50) and also, excellent luminous efficiency and external quantum efficiency (EQE).

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

100: electroluminescent device (EL device)
110: substrate
120: first electrode

130: hole injection layer

140: hole transport layer

150: light emitting layer

160: electron transport layer

170: electron injection layer

180: second electrode

What is claimed is:

1. A polymer compound including a Structural Unit (A) represented by Chemical Formula (1):

Chemical Formula (1)

(1)

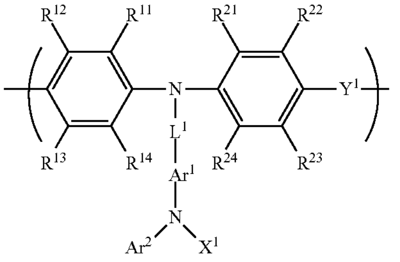

wherein, in Chemical Formula (1), $R^{11}$ to $R^{14}$ and $R^{21}$ to $R^{24}$ are each independently a hydrogen atom, a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, wherein $R^{11}$ and $R^{21}$ are optionally linked to each other to form a ring, $L^1$ is a substituted or unsubstituted aromatic hydrocarbon group having 6 to 25 ring-member atoms, or a substituted or unsubstituted aromatic heterocyclic group having 5 to 25 ring-member atoms, $Ar^1$ is a substituted or unsubstituted aromatic hydrocarbon group having 6 to 25 ring-member atoms, $Ar^2$ is a substituted or unsubstituted aromatic hydrocarbon group having 6 to 25 ring-member atoms, or a substituted or unsubstituted aromatic heterocyclic group having 5 to 25 ring-member atoms, or is linked to $Ar^1$ to form a ring, $X^1$ is a substituted or unsubstituted aromatic hydrocarbon group having 6 to 25 ring-member atoms, $Y^1$ is a substituted or unsubstituted aromatic hydrocarbon group having 6 to 25 ring-member atoms, and at least one of $X^1$ and $Y^1$ is an aromatic hydrocarbon group having 6 to 25 ring-member atoms substituted with an alkyl group having 1 to 14 carbon atoms substituted with a carboxyl group or an alkyl group having 1 to 14 carbon atoms substituted with a group having a carboxyl group.

2. The polymer compound of claim 1, wherein the polymer compound further comprises Structural Unit (B) represented by Chemical Formula (2):

Chemical Formula (2)

(2)

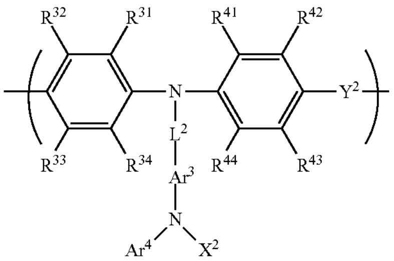

wherein, in Chemical Formula (2)

$R^{31}$ to $R^{34}$ and $R^{41}$ to $R^{44}$ are each independently a hydrogen atom, a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, wherein $R^{31}$ and $R^{41}$ are optionally linked to each other to form a ring, $L^2$ is a substituted or unsubstituted aromatic hydrocarbon group having 6 to 25 ring-member atoms, or a substituted or unsubstituted aromatic heterocyclic group having 5 to 25 ring-member atoms, $Ar^3$ is a substituted or unsubstituted aromatic hydrocarbon group having 6 to 25 ring-member atoms, $Ar^4$ is a substituted or unsubstituted aromatic hydrocarbon group having 6 to 25 ring-member atoms, or a substituted or unsubstituted aromatic heterocyclic group having 5 to 25 ring-member atoms, or is linked to $Ar^3$ to form a ring, $X^2$ is an aromatic hydrocarbon group having 6 to 25 ring-member atoms which is optionally substituted with an alkyl group having 1 to 14 carbon atoms, $Y^2$ is an aromatic hydrocarbon group having 6 to 25 ring-member atoms which is optionally substituted with an alkyl group having 1 to 14 carbon atoms, and $R^{31}$ to $R^{34}$, $R^{41}$ to $R^{44}$, $L^2$, $Ar^3$, and $Ar^4$ do not have an alkyl group having 1 to 14 carbon atoms substituted with a carboxyl group and an alkyl group having 1 to 14 carbon atoms substituted with a group having a carboxyl group.

3. The polymer compound of claim 2, wherein a mole ratio of Structural Unit (A) is greater than or equal to about 10 mol % and less than or equal to about 70 mol % based on that a total mole ratio of Structural Unit (A) and Structural Unit (B) is 100 mol %.

4. The polymer compound of claim 1, wherein

In Chemical Formula (1), $X^1$ is an aromatic hydrocarbon group having 6 to 25 ring-member atoms substituted with an alkyl group having 1 to 14 carbon atoms substituted with a carboxyl group or an alkyl group having 1 to 14 carbon atoms substituted with a group having a carboxyl group and $Y^1$ is an aromatic hydrocarbon group having 6 to 25 ring-member atoms which is substituted or unsubstituted with a substituent other than an alkyl group having 1 to 14 carbon atoms substituted with a carboxyl group or an alkyl group having 1 to 14 carbon atoms substituted with a group having a carboxyl group.

5. The polymer compound of claim 2, wherein $R^{11}$ to $R^{14}$, $R^{21}$ to $R^{24}$, $L^1$, $Ar^1$, $Ar^2$, and $Y^1$ in Chemical Formula (1) are each the same as $R^{31}$ to $R^{34}$, $R^{41}$ to $R^{44}$, $L^2$, $Ar^3$, $Ar^4$, and $Y^2$ in Chemical Formula (2).

6. The polymer compound of claim 1, wherein the alkyl group having 1 to 14 carbon atoms substituted with a carboxyl group or the alkyl group having 1 to 14 carbon atoms substituted with a group having a carboxyl group has a structure represented by Chemical Formula (i):

Chemical Formula (i)

$$***—C_tH_{2t}—(Z')_u—COOH \quad (i)$$

wherein, in Chemical Formula (i), t represents an integer from 1 to 14, u is 0 or 1, $Z^1$ represents an organic group other than an alkylene group, and

*** is bonded to an aromatic hydrocarbon group having 6 to 25 ring-member atoms constituting $X^1$ or $Y^1$.

7. The polymer compound of claim 1, wherein in Chemical Formula (1), $X^1$ is one of the groups represented by Chemical Formulas (3-1) to (3-12):

Chemical Formulas (3-1) to (3-12)

(3-1)

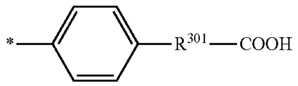

(3-2)

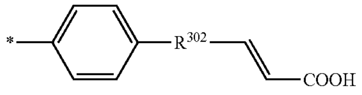

(3-3)

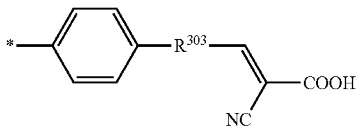

(3-4)

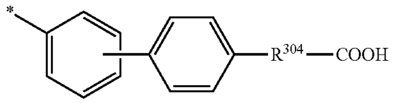

(3-5)

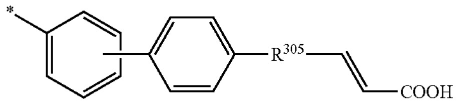

(3-6)

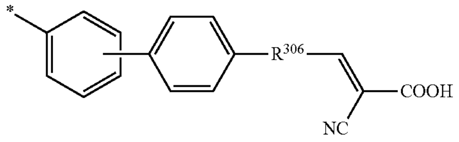

(3-7)

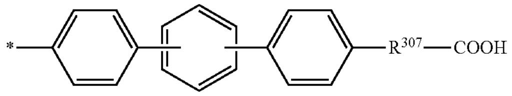

(3-8)

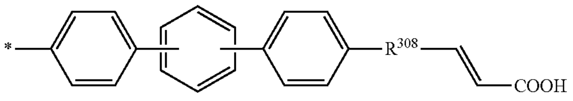

-continued (3-9)

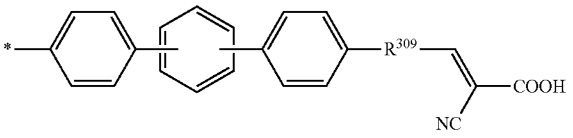

(3-10)

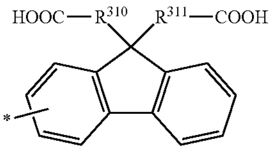

(3-11)

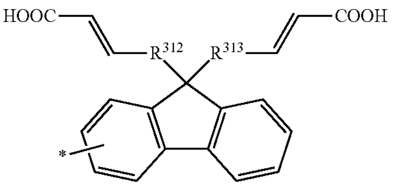

(3-12)

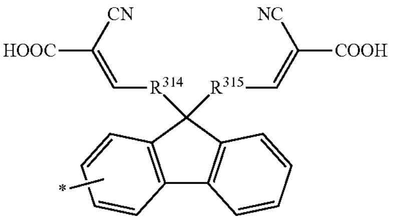

wherein, in Chemical Formulas (3-1) to (3-12), $R^{301}$ to $R^{315}$ are each independently a substituted or unsubstituted alkylene group having 1 to 14 carbon atoms, and

* is bonded to a nitrogen atom.

8. The polymer compound of claim 7, wherein in Chemical Formula (1), $X^1$ is one of the groups represented by Chemical Formulas (3-10) to (3-12).

9. The polymer compound of claim 1, wherein in Chemical Formula (1), $Y^1$ is any one of the groups represented by Chemical Formulas (5-1) to (5-9):

Chemical Formulas (5-1) to (5-9)

(5-1)

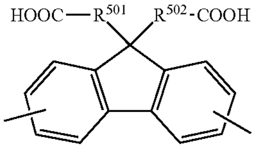

(5-2)

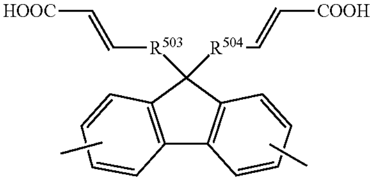

-continued
(5-3)
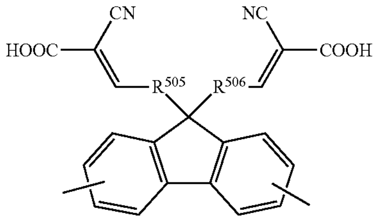
(5-4)
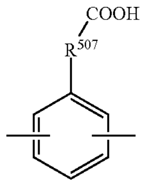
(5-5)
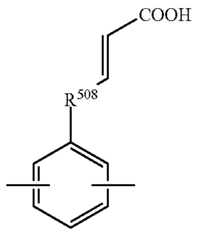
(5-6)
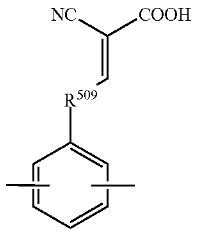
(5-7)
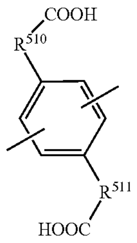
(5-8)
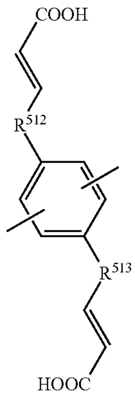
-continued
(5-9)
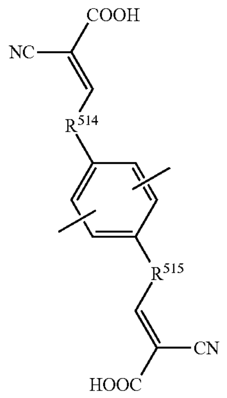
wherein, in Chemical Formulas (5-1) to (5-9),
$R^{501}$ to $R^{515}$ are each independently a substituted or unsubstituted alkylene group having 1 to 14 carbon atoms.
10. The polymer compound of claim 1, wherein
in Chemical Formula (1), $L^1$ is one of the groups represented by Chemical Formulas (7-1) to (7-24):
Chemical Formulas (7-1) to (7-24)
(7-1)
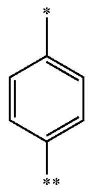
(7-2)
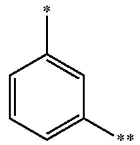
(7-3)
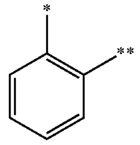
(7-4)
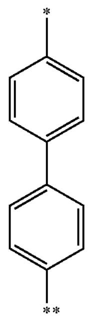

-continued
(7-5)
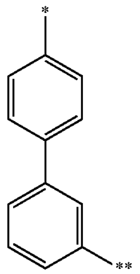
(7-6)
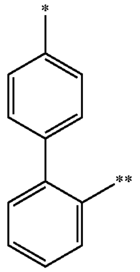
(7-7)
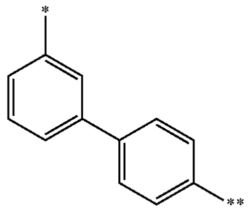
(7-8)
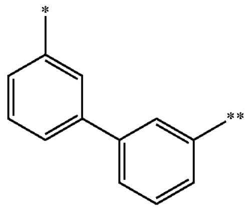
(7-9)
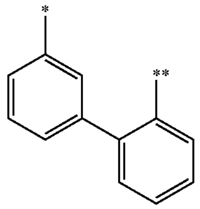
(7-10)
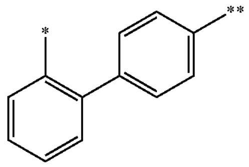
(7-11)
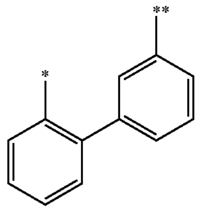
-continued
(7-12)
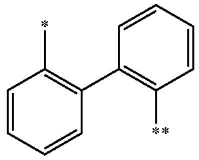
(7-13)
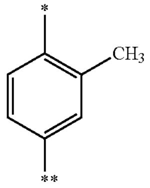
(7-14)
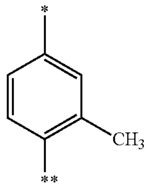
(7-15)
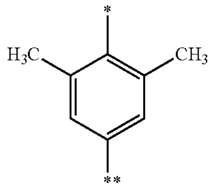
(7-16)
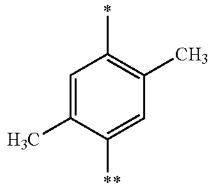
(7-17)
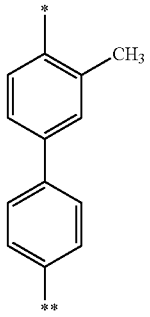
(7-18)
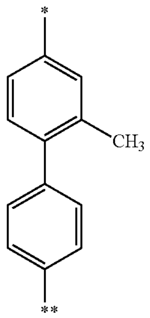

-continued
(7-19)
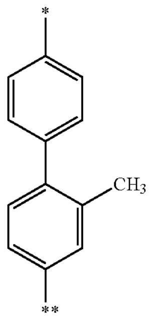
(7-20)
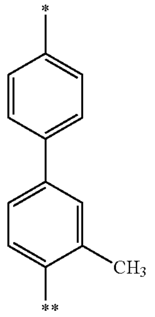
(7-21)
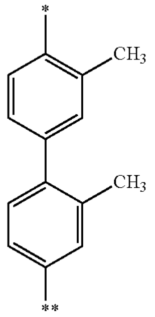
(7-22)
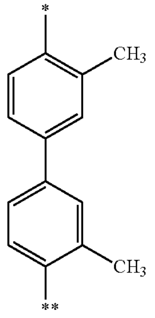
(7-23)
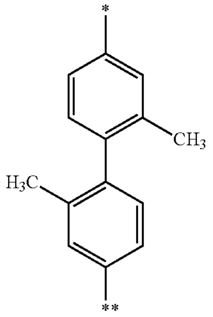
-continued
(7-24)
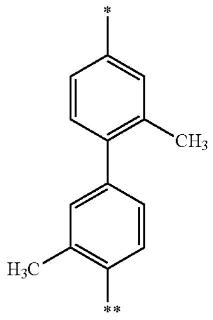
wherein, in Chemical Formulas (7-1) to (7-24),
* is bonded to a nitrogen atom, and ** is bonded to Ar[1].
11. The polymer compound of claim 1, wherein
$-L^1-Ar^1—N(Ar^2)(X^1)$ in Chemical Formula (1) is any one of the groups represented by Chemical Formulas (9-1) to (9-3):
Chemical Formulas (9-1) to (9-3)
(9-1)
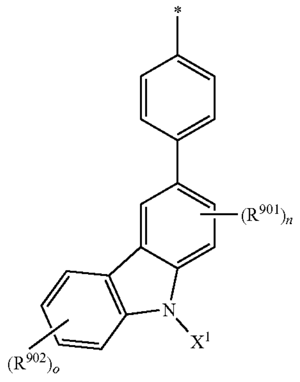
(9-2)
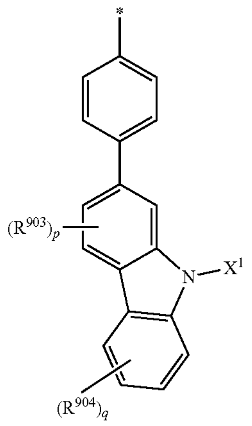

-continued (9-3)

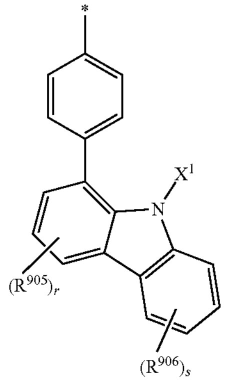

wherein, in Chemical Formulas (9-1) to (9-3), $R^{901}$ to $R^{906}$ are each independently a substituted or unsubstituted alkyl group, a substituted or unsubstituted cycloalkyl group, a substituted or unsubstituted alkoxy group, a substituted or unsubstituted cycloalkoxy group, a substituted or unsubstituted aryl group, or a halogen atom, n, p, and r are each independently 0, 1, 2, or 3, o, q, and s are each independently 0, 1, 2, 3, or 4, when any one of n, o, p, q, r, and s is 2 or more, each $R^{901}$, each $R^{902}$, each $R^{903}$, each $R^{904}$, each $R^{905}$, or each $R^{906}$ is the same or different, $X^1$ is the same as defined in Chemical Formula (1), and

* is bonded to the nitrogen atom.

12. An electroluminescent device material comprising the polymer compound of claim 1.

13. An electroluminescent device, comprising a first electrode and a second electrode, and one or more organic films between the first electrode and the second electrode, wherein at least one layer of the organic film comprises the polymer compound of claim 1.

14. The electroluminescent device of claim 13, wherein the layer including the polymer compound is a hole transport layer or a hole injection layer.

15. The electroluminescent device of claim 13, wherein wherein the organic film comprises a light emitting layer comprising a semiconductor nanoparticle or an organometallic complex.

* * * * *